(12) United States Patent
Nebashi et al.

(10) Patent No.: US 8,009,467 B2
(45) Date of Patent: Aug. 30, 2011

(54) MAGNETIC RANDOM ACCESS MEMORY

(75) Inventors: Ryusuke Nebashi, Tokyo (JP); Noboru Sakimura, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 93 days.

(21) Appl. No.: 12/602,230

(22) PCT Filed: Apr. 22, 2008

(86) PCT No.: PCT/JP2008/057747
§ 371 (c)(1),
(2), (4) Date: Nov. 30, 2009

(87) PCT Pub. No.: WO2008/146553
PCT Pub. Date: Dec. 4, 2008

(65) Prior Publication Data
US 2010/0182824 A1    Jul. 22, 2010

(30) Foreign Application Priority Data

May 29, 2007  (JP) .................................. 2007-141416
Nov. 9, 2007  (JP) .................................. 2007-291901

(51) Int. Cl.
G11C 11/00 (2006.01)
(52) U.S. Cl. .............. 365/158; 365/189.011; 365/230.03
(58) Field of Classification Search .................. 365/158, 365/189.011, 230.03
See application file for complete search history.

(56) References Cited

U.S. PATENT DOCUMENTS

| 7,403,413 B2 * | 7/2008 | Liaw ............................. 365/158 |
| 7,583,528 B2 * | 9/2009 | Aoki ............................. 365/158 |
| 2010/0238719 A1 * | 9/2010 | Nebashi et al. ............... 365/158 |

FOREIGN PATENT DOCUMENTS

| JP | 2002008369 A | 1/2002 |
| JP | 2004206796 A | 7/2004 |
| JP | 2004348934 A | 12/2004 |

OTHER PUBLICATIONS

International Search Report for PCT/JP2008/057747 mailed Jun. 17, 2008.

* cited by examiner

Primary Examiner — Connie C Yoha

(57) ABSTRACT

An MRAM according to the present invention has: a memory cell array; a first word line and a second word line each connected to a group of memory cells arranged in a first direction; a plurality of blocks arranged in a matrix form; a common word line connected to a group of blocks arranged in the first direction; and a bit line pair connected to a group of blocks arranged in a second direction. Each block has a plurality of memory cells, and each memory cell has a first transistor and a magnetoresistance element. Each block further has a second transistor to which the plurality of memory cells are connected in parallel. A gate of the second transistor is connected to the common word line. A gate of the first transistor is connected to the first word line. One of source/drain of the first transistor is connected to the first bit line, and the other thereof is connected to one end of the magnetoresistance element and connected to the second bit line through the second transistor. The other end of the magnetoresistance element is connected to the second word line.

28 Claims, 39 Drawing Sheets

MAGNETIC RANDOM ACCESS MEMORY

This application is the National Phase of PCT/JP2008/057747, filed Apr. 22, 2008, which is based upon and claims the benefit of priority from Japanese patent application No. 2007-141416, filed on May 29, 2007 and Japanese patent application No. 2007-291901, filed on Nov. 9, 2007, the disclosure of which is incorporated herein in its entirely by reference.

TECHNICAL FIELD

The present invention relates to a magnetic random access memory (MRAM).

BACKGROUND ART

An MRAM is a promising nonvolatile memory from a viewpoint of high integration and high-speed operation. In the MRAM, a "magnetoresistance element" that exhibits a magnetoresistance effect such as TMR (Tunnel MagnetoResistance) effect is used as a memory element. The magnetoresistance element includes a non-magnetic layer and two ferromagnetic layers on both sides of the non-magnetic layer. One of the two ferromagnetic layers is a magnetization fixed layer (pinned layer) whose magnetization direction is fixed and the other thereof is a magnetization free layer (free layer) whose magnetization direction is reversible.

A resistance value (R+ΔR) of the magnetoresistance element when the magnetization directions of the magnetization fixed layer and the magnetization free layer are "anti-parallel" to each other is higher than a resistance value (R) when the magnetization directions are "parallel" to each other due to the magnetoresistance effect. A memory cell of the MRAM nonvolatilely memorizes a data by utilizing the change in the resistance value. For example, the high-resistance state is related to data "1" and the low-resistance state is related to data "0". It is possible to determine the data stored in the memory cell by detecting the resistance value of the magnetoresistance element. On the other hand, it is possible to rewrite the data stored in the memory cell by switching the magnetization direction of the magnetization free layer.

FIG. 1 shows a part of a circuit configuration of an MRAM described in Japanese Laid-Open Patent Application JP-2004-348934. A plurality of write word lines 103W and a plurality of read word lines 103R extend in the X-direction and are connected to an X-selector 108. Moreover, a plurality of first bit lines 104 and a plurality of second bit lines 105 extend in the Y-direction and are connected to a Y-selector 111.

A memory cell array 110 has a plurality of memory cells 120 arranged in an array form. Each memory cell 120 has a transistor 106 and a magnetoresistance element 107. A gate of the transistor 106 is connected to the write word line 103W. One of source/drain of, the transistor 106 is connected to the first bit line 104, and the other thereof is connected to the second bit line 105. One end of the magnetoresistance element 107 is connected to the read word line 103R, and the other end thereof is connected to the second bit line 105.

Some memory cells 120 are reference memory cells 120r. The first bit line 104 and the second bit line 105 connected to the reference memory cell 120r are a first reference bit line 104r and a second reference bit line 105r, respectively. The current sense amplifier 115 is connected to the Y-selector 111 and the second reference bit line 105r.

Data reading from a certain memory cell 120 (selected memory cell 120s) is as follows. The X-selector 108 selects one read word line 103R connected to the selected memory cell 120s and applies a read voltage to the read word line 103R. The Y-selector 111 selects one second bit line 105 connected to the selected memory cell 120s. A sense current Is flows through the selected second bit line 105 due to a difference between a voltage of the current sense amplifier 115 and a voltage of the read word line 103R. Magnitude of the sense current Is depends on a resistance state of the magnetoresistance element 107 of the selected memory cell 120s. Moreover, a reference current Ir flows through the second reference bit line 105r connected to the reference cell 120r.

The current sense amplifier 115 determines a data stored in the selected memory cell 120s, based on the sense current Is and the reference current Ir. For example, let us consider a case where the data of the reference cell 120r is fixed to "0". In this case, if the sense current Is is substantially equal to the reference current Ir, the current sense amplifier 115 determines the data stored in the selected memory cell 120s as "0". On the other hand, if the sense current Is is smaller than the reference current Ir, the current sense amplifier 115 determines the data stored in the selected memory cell 120s as "1".

It should be noted here that there exists a current that flows without passing through the selected memory cell 120s. The MRAM shown in FIG. 1 has a cross-point array configuration in which the memory cells 120 are connected through a plenty of parallel paths. At the time of data reading from the selected memory cell 120s, the current that does not pass through the selected memory cell 120s flows on the parallel paths. The current is hereinafter referred to as a "parallel current". The parallel current affects the sense current Is flowing through the selected second bit line 105. That is, the parallel current causes deterioration in reliability of the data determination for the selected memory cell 120s. In order to enhance reliability of the read data, it is important to suppress the influence of the parallel current.

Japanese Laid-Open Patent Application JP-2002-8369 also describes a cross-point cell array. According to this technique, at the time of data reading, a voltage Vs applied to a selected bit line and a voltage Vns applied to non-selected bit lines are designed to be equal to each other in order to enhance the reliability of read data. However, it is difficult in practice to make the voltage Vs and the voltage Vns exactly the same.

DISCLOSURE OF INVENTION

An object of the present invention is to provide a new configuration of an MRAM.

Another object of the present invention is to provide a technique that can improve reliability of a read data at a time of data reading from an MRAM.

Another object of the present invention is to provide a technique that can improve selectivity of a memory cell at a time of data writing to an MRAM.

In one embodiment of the present invention, an MRAM is provided. The MRAM has: a memory cell array; a first word line and a second word line each connected in common to a group of memory cells arranged in a first direction in the memory cell array; a plurality of blocks arranged in a matrix form; a common word line connected in common to a group of blocks arranged in the first direction among the plurality of blocks; and a bit line pair connected in common to a group of blocks arranged in a second direction intersecting with the first direction among the plurality of blocks. The bit line pair includes a first bit line and a second bit line.

Each of the plurality of blocks has a plurality of memory cells in the memory cell array. Each memory cell has a first transistor and a magnetoresistance element. Moreover, each of the plurality of blocks has a second transistor to which the above-mentioned plurality of memory cells are connected in parallel. A gate of the second transistor is connected to the common word line. A gate of the first transistor is connected to the first word line. One of a source and a drain of the first transistor is connected to the first bit line. The other of the source and the drain of the first transistor is connected to one end of the magnetoresistance element and connected to the second bit line through the second transistor. The other end of the magnetoresistance element is connected to the second word line.

In one embodiment of the present invention, a data read method for the MRAM is provided. The plurality of blocks include: a plurality of memory blocks arranged in a matrix form; and a row of reference blocks arranged in the first direction. Data stored in the plurality of memory cells in each of the row of reference blocks are fixed. At the time of data reading, a memory block including a selected memory cell among the plurality of memory blocks is a selected memory block. The second bit line connected to the selected memory block is a selected bit line. A reference block connected to the selected bit line among the row of reference blocks is a selected reference block. In this case, the data read method includes: (A) a first reading step; (B) a second reading step; and (C) a data determining step.

The above-mentioned (A) step includes: (A1) a step of selecting the common word line connected to the selected reference block and the common word line connected to the selected memory block; (A2) a step of applying a first read voltage to the selected bit line; and (A3) a step of applying a read word voltage different from the first read voltage by a predetermined voltage difference to the second word line connected to the selected reference block and setting the other second word lines to a floating state.

The above-mentioned (B) step includes: (B1) a step of selecting the common word line connected to the selected memory block; (B2) a step of applying a second read voltage to the selected bit line; and (B3) a step of applying a read word voltage to the second word line connected to the selected memory cell and setting the other second word lines to a floating state.

The above-mentioned (C) step includes: a step of determining a data stored in the selected memory cell based on a first bit line current flowing through the selected bit line in the above-mentioned (A) step and a second bit line current flowing through the selected bit line in the (B) step.

In one embodiment of the present invention, a data write method for the MRAM is provided. At the time of data writing, a memory block including a selected memory cell among the plurality of blocks is a selected block. The first bit line and the second bit line connected to the selected block are a selected first bit line and a selected second bit line, respectively. In this case, the data write method includes: (a) a step of selecting the common word line connected to the selected block and selecting the word line connected to the selected memory cell; and (b) a step of applying a first write voltage and a second write voltage different from each other to the selected first bit line and the selected second bit line, respectively.

An effect of the present invention is that the new configuration of the MRAM is provided.

Another effect of the present invention is that the reliability of the read data at the time of data reading from the MRAM is improved.

Another effect of the present invention is that the selectivity of the memory cell at the time of data writing to the MRAM is improved.

BEST MODE FOR CARRYING OUT THE INVENTION

1. First Embodiment 1-1. Circuit Configuration

Figure 1:
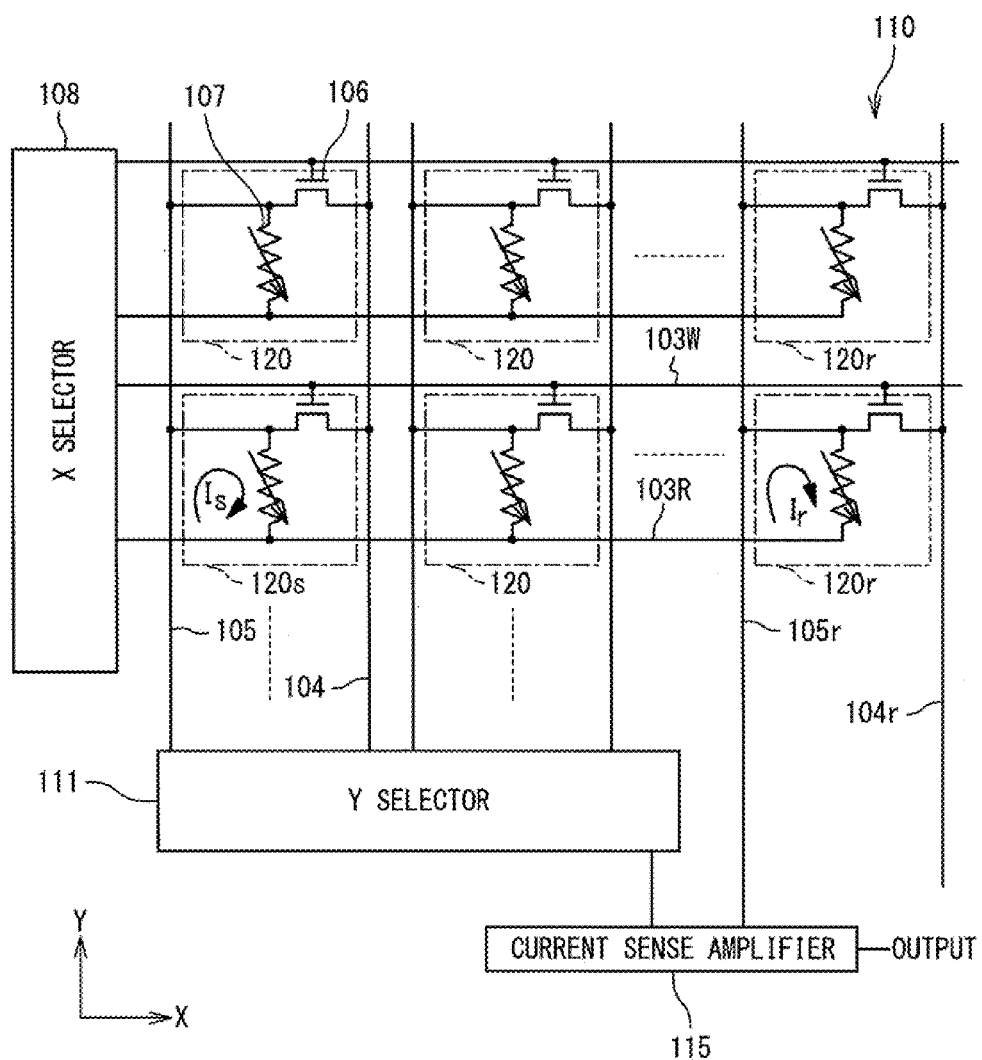
FIG. 1 is a circuit diagram showing a configuration of an MRAM according to a related technique.
Figure 2:
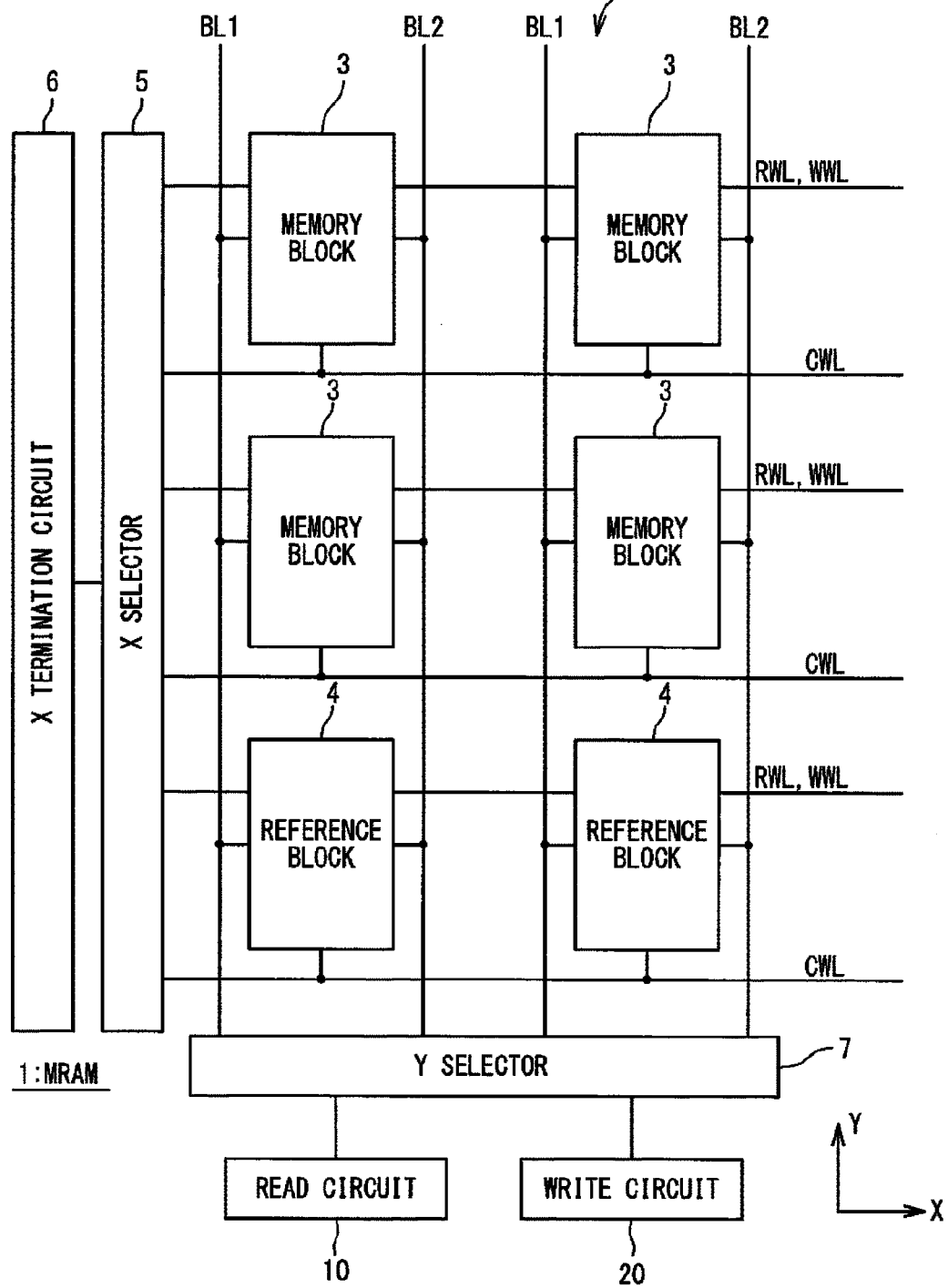
FIG. 2 is a block diagram schematically showing a configuration of an MRAM in a first embodiment of the present invention.

FIG. 2 is a block diagram schematically showing a configuration of an MRAM in a first embodiment of the present invention. The MRAM 1 is provided with a memory cell array 2 in which a plurality of memory cells are arranged in a matrix form. The memory cell array 2 is sectioned into a plurality of blocks (3, 4). The plurality of blocks are arranged in a matrix form. More specifically, the plurality of blocks include a plurality of memory blocks 3 arranged in a matrix form and a row of reference blocks 4 arranged in the X-direction. The memory block 3 is a block for storing data. On the other hand, the reference block 4 is a block that is referred to at a time of data reading.

The MRAM 1 is further provided with a plurality of write word lines (first word lines) WWL, a plurality of read word lines (second word lines) RWL and a plurality of common word lines CWL. The write word line WWL, the read word line RWL and the common word line CWL are so provided as to extend in the X-direction. The common word line CWL is connected in common to a row of blocks arranged in the X-direction. On the other hand, the write word line WWL and the read word line RWL are connected in common to a row of memory cells arranged in the X-direction (described later).

The MRAM 1 is further provided with a plurality of bit line pairs (BL1, BL2). Each bit line pair includes a first bit line BL1 and a second bit line BL2. The each bit line pair is so provided as to extend in the Y-direction and is connected in common to a column of blocks arranged in the Y-direction. Here, the Y-direction is orthogonal to the X-direction.

The MRAM 1 is further provided with an X-selector 5 and an X termination circuit 6. The X-selector 5 is connected to the plurality of write word lines WWL, the plurality of read word lines RWL and the plurality of common word lines CWL. At a time of data reading or data writing, the X-selector 5 can select necessary word lines. The X termination circuit 6 is connected to the X-selector 5.

The MRAM 1 is further provided with a Y-selector 7, a read circuit 10 and a write circuit 20. The Y-selector 7 is connected to the plurality of first bit lines BL1 and the plurality of second bit lines BL2. At a time of data reading or data writing, the Y-selector 7 can select necessary bit lines. The read circuit 10 is connected to the first bit line BL1 and the second bit line BL2 through the Y-selector 7. The read circuit 10 has functions of applying a read voltage to the bit lines and determining a read data. The write circuit 20 is connected to the first bit line BL1 and the second bit line BL2 through the Y-selector 7. The write circuit 20 has a function of applying a write voltage to the bit lines in response to a write data.

Figure 3:
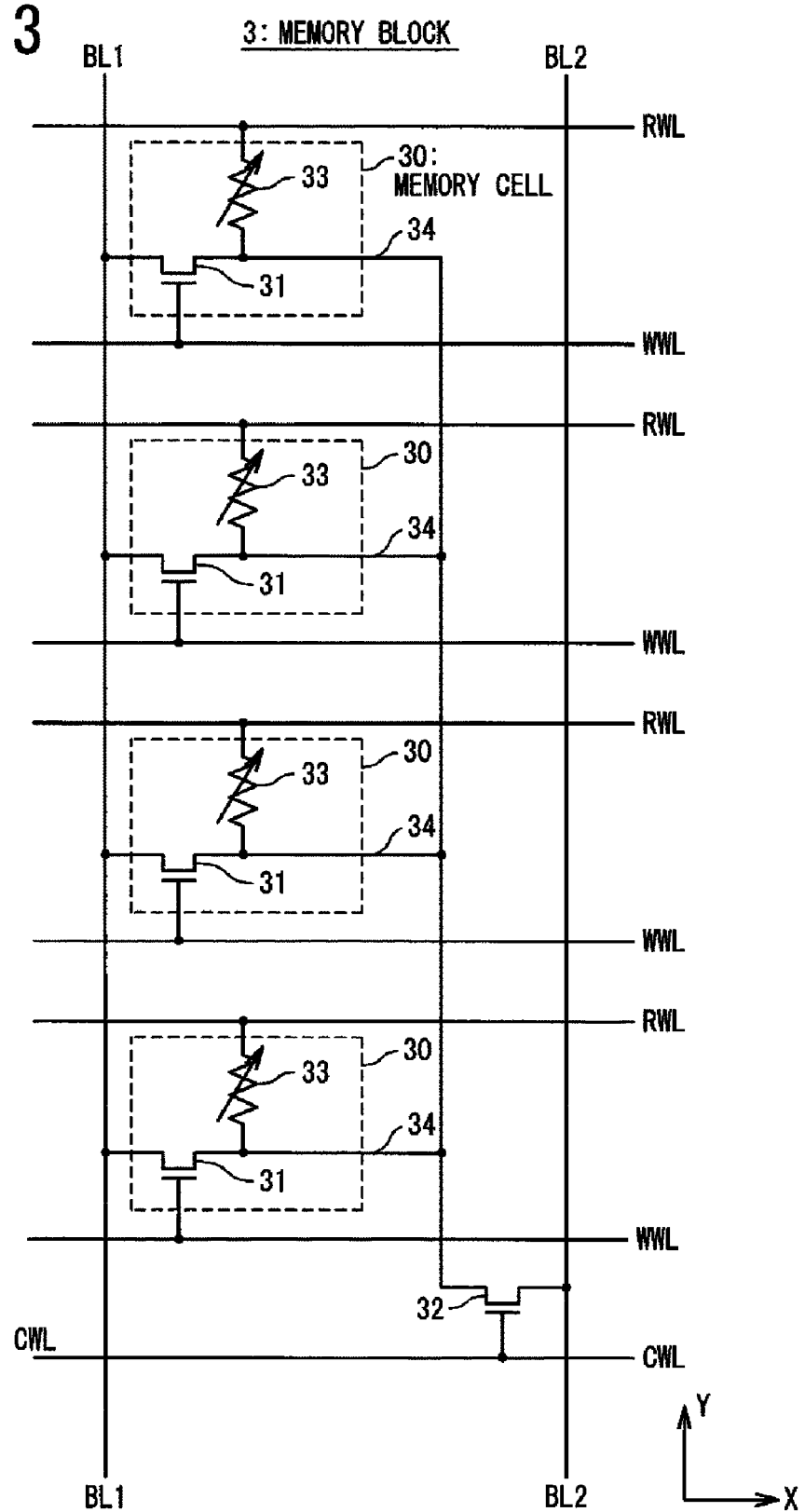
FIG. 3 is a circuit diagram showing a configuration of one memory block in the first embodiment.

FIG. 3 shows a configuration example of one memory block 3. One memory block 3 has a plurality of memory cells 30 in the memory cell array 2. The plurality of memory cells 30 are arranged in the Y-direction. Each memory cell 30 has a cell transistor (first transistor) 31 and a magnetoresistance element 33. It should be noted an arbitrary number of memory cells 30 can be included in one memory block 3.

The one memory block 3 further has a block transistor (second transistor) 32 to which the plurality of memory cells 30 are connected in parallel. That is, one block transistor 32 is provided in common for the plurality of memory cells 30. The plurality of memory cells 30 are connected to the second bit line BL2 through the block transistor 32.

A gate of the cell transistor 31 is connected to the write word line WWL. One of source/drain of the cell transistor 31 is connected to the first bit line BL1. The other of source/drain of the cell transistor 31 is connected to one end of the magnetoresistance element 33 and an interconnection 34. The other end of the magnetoresistance element 33 is connected to the read word line RWL. A gate of the block transistor 32 is connected to the common word line CWL. One of source/drain of the block transistor 32 is connected to the second bit line BL2. The other of source/drain of the block transistor 32 is connected to the interconnections 34 of the respective memory cells 30. In this manner, the second bit line BL2 is connected to the magnetoresistance elements 33 of the respective memory cells 30 through one block transistor 32. On the other hand, the first bit line BL1 is connected to the magnetoresistance elements 33 through the cell transistors 31 of the respective memory cells 30.

Figure 4:
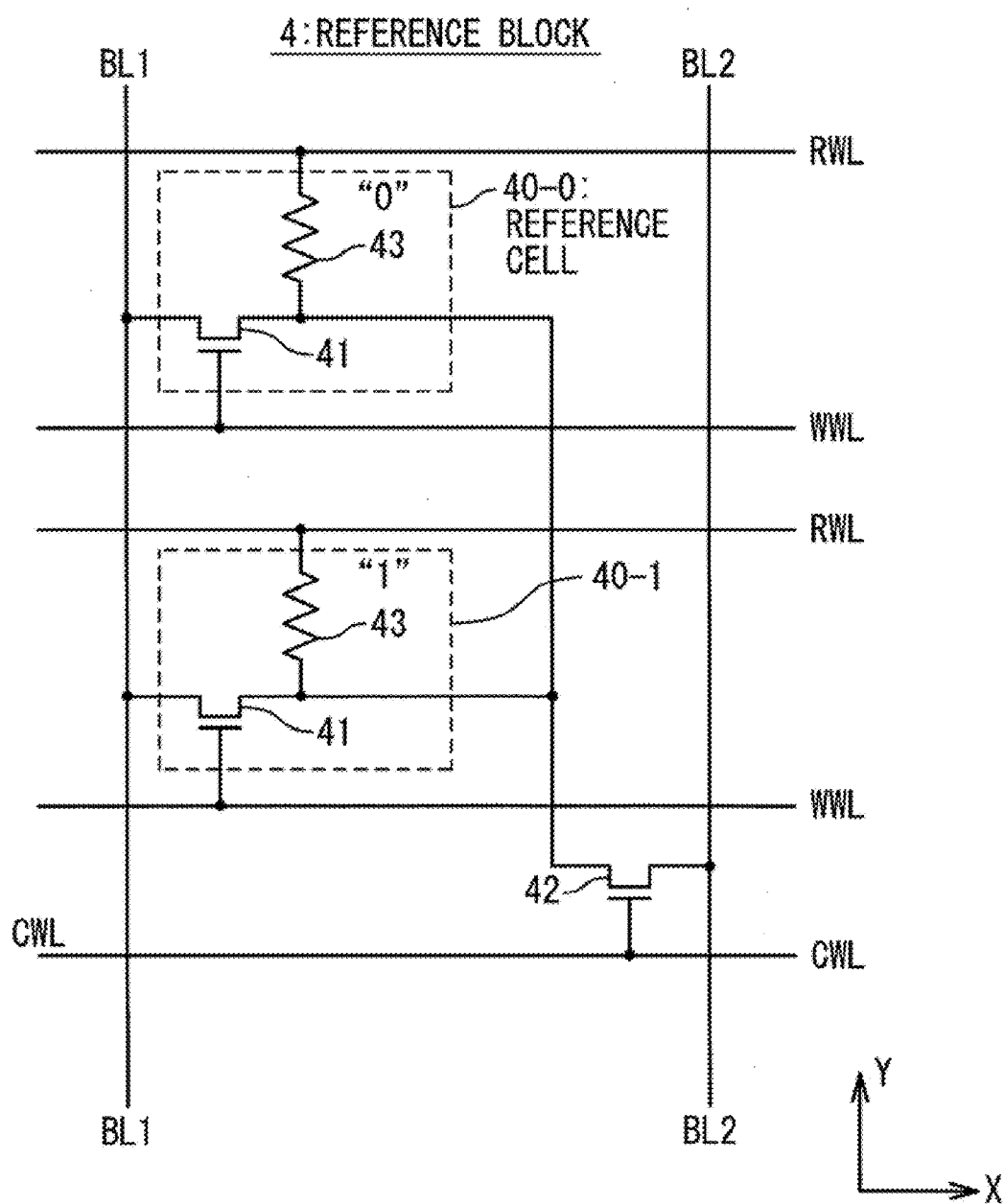
FIG. 4 is a circuit diagram showing a configuration of one reference block in the first embodiment.

FIG. 4 is a configuration example of one reference block 4. The reference block 4 has a configuration similar to that of the memory block 3. Specifically, the reference block 4 has a plurality of memory cells 40 in the Memory cell array 2 and one block transistor 42. Each memory cell 40 has a cell transistor 41 and a magnetoresistance element 43. A connection relationship between the elements and interconnections is the same as in the case of FIG. 3.

In the present embodiment, the memory cell 40 in the reference block 4 has the same physical structure as the memory cell 30 in the memory block 3. Meanwhile, data stored in the memory cell 40 in the reference block 4 is fixed. The fixed data is referred to when a data stored in the memory cell 30 in the memory block 3 is read out. In that sense, the memory cell 40 in the reference block 4 is hereinafter referred to as a "reference cell".

An arbitrary number of reference cells 40 can be included in one reference block 4. In the present embodiment, the one reference block 4 has two reference cells 90. One reference cell 40 is a reference cell 40-0 in which the fixed data "0" is stored, and the other reference cell 40 is a reference cell 40-1 in which the fixed data "1" is stored.

Figure 5:
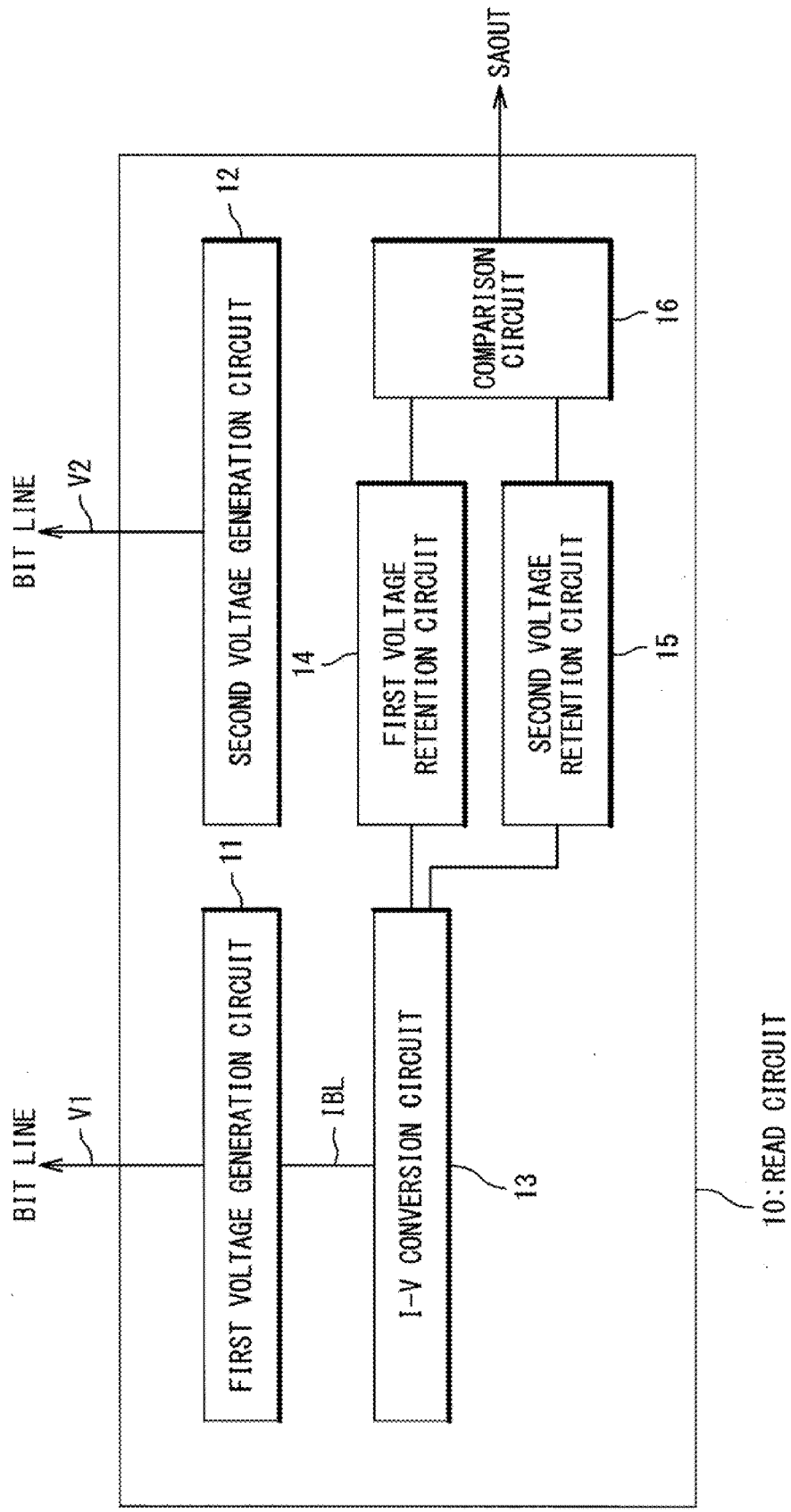
FIG. 5 is a block diagram showing a configuration of a read circuit in the first embodiment.

FIG. 5 is a block diagram showing a configuration of the read circuit 10 in the present embodiment. The read circuit 10 has a first voltage generation circuit 11, a second voltage generation circuit 12, an I-V conversion circuit 13, a first voltage retention circuit 14, a second voltage retention circuit 15 and a comparison circuit 16.

The first voltage generation circuit 11 has functions of generating a first voltage V1 and applying the generated first voltage V1 to a bit line. On the other hand, the second voltage generation circuit 12 has functions of generating a second voltage V2 and applying the generated second voltage V2 to a bit line. The first voltage V1 and the second voltage V2 are substantially equal to each other.

The I-V conversion circuit 13 is a current-voltage amplifier connected to the first voltage generation circuit 11. More specifically, the I-V conversion circuit 13 converts a bit line current IBL flowing through the bit line connected to the first voltage generation circuit 11 into a voltage depending on the bit line current IBL.

Each of the first voltage retention circuit 14 and the second voltage retention circuit 15 has functions of retaining the voltage generated by the I-V conversion circuit 13 and outputting the retention voltage. For example, each voltage retention circuit includes a sufficient capacitance element and retains the voltage by using the capacitance element. It should be noted that an electrical connection between each voltage retention circuit and the I-V conversion circuit 13 is ON/OFF controlled as appropriate.

The comparison circuit 16 makes a comparison between the voltages respectively output from the first voltage retention circuit 14 and the second voltage retention circuit 15. As will be described later, the comparison circuit 16 determines a cell data through the comparison. The comparison circuit 16 outputs a read data SAOUT corresponding to the cell data.

Figure 6:
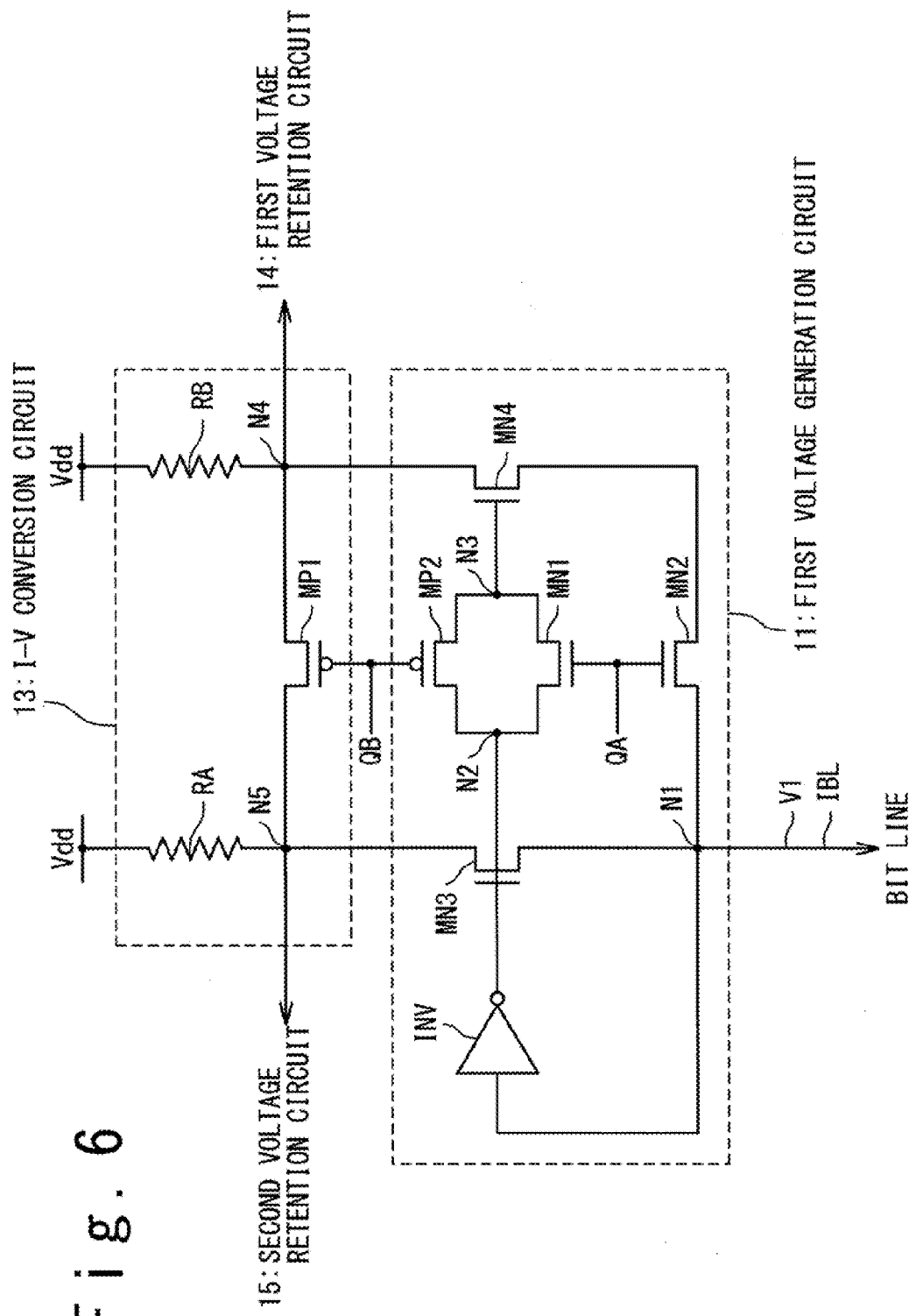
FIG. 6 is a circuit diagram showing a configuration of the read circuit in the first embodiment.

FIG. 6 shows one example of a circuit configuration of the first voltage generation circuit 11 and the I-V conversion circuit 13 in the present embodiment. The circuit configuration shown in FIG. 6 has PMOS transistors MP1 to MP2, NMOS transistors MN1 to MN4, load resistors RA, RB and an inverter INV.

Gates of the PMOS transistors MP1 and MP2 are connected to each other. The PMOS transistor MP2 is connected between a node N2 and a node N3. Gates of the NMOS transistors MN1 and MN2 are connected to each other. The NMOS transistor MN1 is connected between the node N2 and the node N3. The node N2 is connected to a gate of the NMOS transistor MN3. The node N3 is connected to a gate of the NMOS transistor MN4.

The node N1 is a node connected to the bit line. The node N1 is connected to a node N5 through the NMOS transistor MN3. Moreover, the node N1 is connected to a node N4 through the NMOS transistors MN2 and MN4. Furthermore, the node N1 is connected to an input of the inverter INV. An output of the inverter INV is connected to the gate of the NMOS transistor MN3 and the node N2.

The load resistor RA is connected between the node N5 and the power-supply. The load resistor RB is connected between the node N4 and the power-supply. Resistance values of the load resistor RA and the load resistor RB are substantially equal to each other. The PMOS transistor MP1 is connected between the node N4 and the node N5. The node N4 is connected to the first voltage retention circuit 14. The node N5 is connected to the second voltage retention circuit 15.

A disconnect signal QA is input to the gates of the NMOS transistors MN1 and MN2. A disconnect signal QB is input to the gates of the PMOS transistors MP1 and MP2. The disconnect signals QA and QB are a complementary signal.

In a "first mode", the disconnect signal QA is set to the H level, and the disconnect signal QB is set to the L level. As a result, the PMOS transistors MP1 and MP2 and the NMOS transistors MN1 and MN2 all are turned ON. In this case, the bit line is connected to the power-supply through the respective load resistors RA and RB.

Also, the output of the inverter INV is connected to the gate of the NMOS transistor MN3 and is connected to the gate of the NMOS transistor MN4 through the nodes N2 and N3.

Sources of the NMOS transistors MN3 and MN4 are connected to the input of the inverter INV. Therefore, source voltages of the NMOS transistors MN3 and MN4 are fixed to an inversion threshold voltage of the inverter INV due to negative feedback. The inversion threshold voltage is an input voltage with which the output of the inverter INV switches from "1" to "0". The inversion threshold voltage can be adjusted based on design of transistor size and the like. In this manner, the source voltages of the NMOS transistors MN3 and MN4, namely the voltage of the node N1 is fixed. The first voltage generation circuit 11 outputs this voltage of the node N1 as the above-mentioned first voltage V1 to the bit line.

The I-V conversion circuit 13 converts the bit line current IBL flowing through the bit line into a voltage VBL1. More specifically, the bit line current IBL is divided into a path on the side of the load resistor RA and a path on the sided of the load resistor RB. Therefore, when the load resistor RA and the load resistor RB are the same for example, the voltage VBL1 of the node N4 and the node N5 are given by the following Equation (1):

$$VBL1 = Vdd - G/2 \times IBL \qquad (1)$$

Here, the parameter "G/2" is a current-voltage conversion coefficient of the I-V conversion circuit 13 in the first mode.

In the first mode, the node N4 and the first voltage retention circuit 14 are electrically connected with each other, and the node N5 and the second voltage retention circuit 15 are electrically disconnected from each other. As a result, the voltage VBL1 expressed by the above Equation (1) is retained by the first voltage retention circuit 14. After that, the electrical connection between the node N4 and the first voltage retention circuit 14 also is cut off.

On the other hand, in a "second mode", the disconnect signal QA is set to the L level, and the disconnect signal QB is set to the H level. As a result, the PMOS transistor MP1 and MP2 and the NMOS transistors MN1 and MN2 all are turned OFF. In this case, the bit line is connected to the power-supply through only the load resistor RA. Also in this case, the source voltage of the NMOS transistor MN3, namely the voltage of the node N1 is fixed to the inversion threshold voltage of the inverter INV. Therefore, the first voltage generation circuit 11 outputs the same first voltage V1 to the bit line, as in the case of the first mode.

The I-V conversion circuit 13 converts the bit line current IBL flowing through the bit line into a voltage VBL2. More specifically, the bit line current IBL flows through only the path on the side of the load resistor RA. Therefore, the voltage VBL2 of the node N5 is given by the following Equation (2):

$$VBL2 = Vdd - G \times IBL \qquad (2)$$

Here, the parameter "G" is a current-voltage conversion coefficient of the I-V conversion circuit 13 in the second mode. In this manner, the current-voltage conversion Coefficient in the first mode is smaller than the current-voltage conversion coefficient in the second mode.

In the second mode, the node N5 and the second voltage retention circuit 15 are electrically connected with each other. As a result, the voltage VBL2 expressed by the above Equation (2) is retained by the second voltage retention circuit 15. After that, the electrical connection between the node N5 and the second voltage retention circuit 15 also is cut off.

As described above, the read circuit 10 in the present embodiment can change the current-voltage conversion coefficient depending on the mode.

1-2. Read operation

Figure 7:
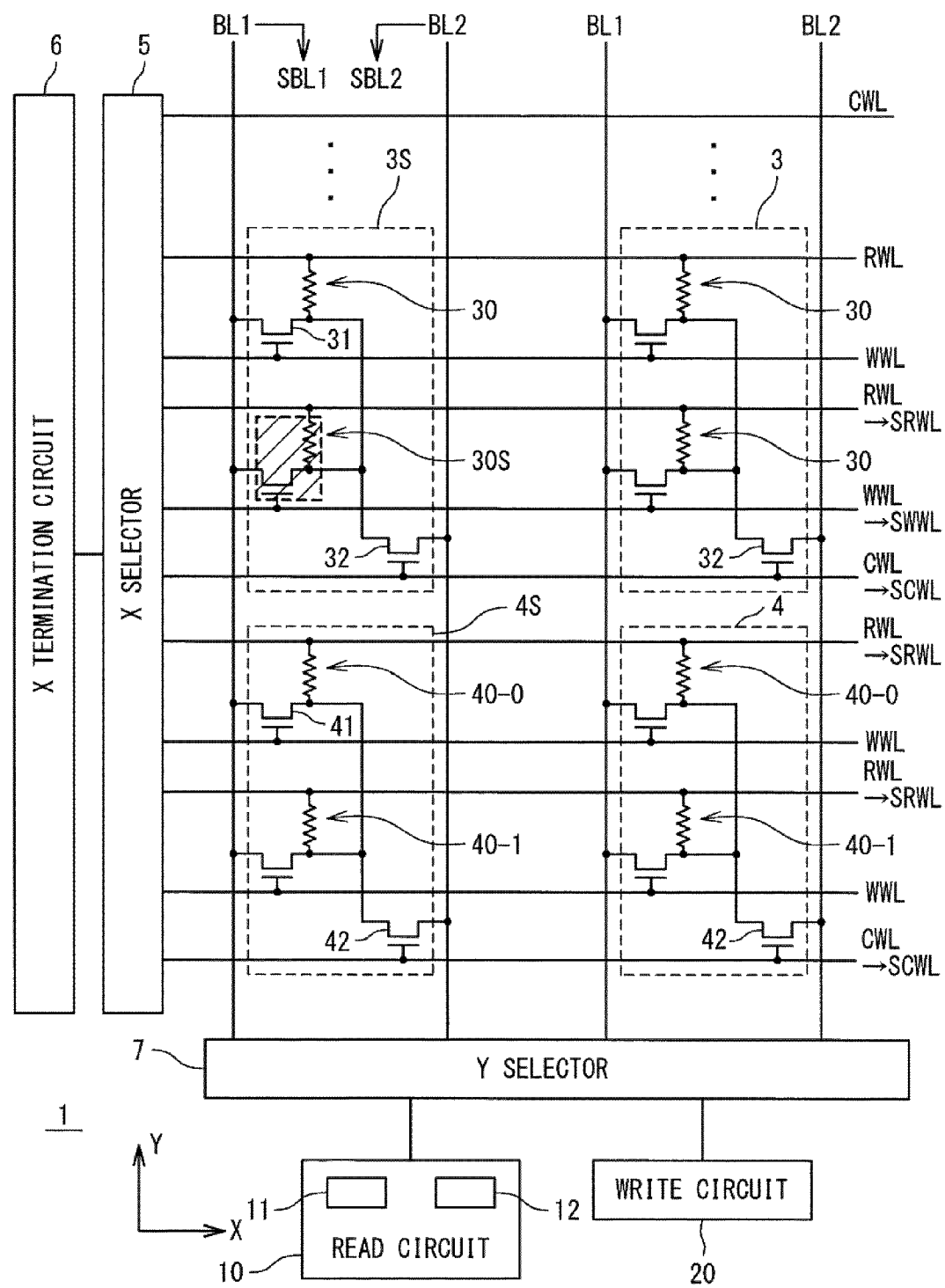
FIG. 7 is a circuit diagram schematically showing a configuration of the MRAM in the first embodiment.

Next, a data read operation in the present embodiment will be described. FIG. 7 schematically shows a circuit configuration of the MRAM 1 in the present embodiment.

The common word line CWL is connected in common to the row of memory blocks 3 (or reference blocks 4) arranged in the X-direction. A common word line CWL selected by the X-selector is hereinafter referred to as a "selected common word line SCWL". The block transistors 32 (or 42) connected to the selected common word line SCWL all are turned ON. That is, all the blocks connected to the selected common word line SCWL are selected.

The write word line WWL is connected in common to the row of memory cells 30 (or reference cells 40) arranged in the X-direction. A write word line WWL selected by the X-selector 5 is hereinafter referred to as a "selected write word line SWWL". The cell transistors 31 (or 41) connected to the selected write word line SWWL all are turned ON. Also, the read word line RWL is connected in common to the row of memory cells 30 (or reference cells 40) arranged in the X-direction. A read word line RWL selected by the X-selector 5 is hereinafter referred to as a "selected read word line SRWL".

A memory cell 30 as an access target is hereinafter referred to as a "selected memory cell 30S". A memory block 3 including the selected memory cell 30S among the plurality of memory blocks 3 is hereinafter referred to as a "selected memory block 3S". A first bit line BL1 and a second bit line BL2 connected to the selected memory block 3S are hereinafter referred to as a "selected first bit line SBL1" and a "selected second bit line SBL2", respectively. The selected first bit line SBL1 and the selected second bit line SBL2 may be referred to collectively as a "selected bit line pair". A reference block 4 connected to the selected first bit line SBL1 or the selected second bit line SBL2 is hereinafter referred to as a "selected reference block 4S". That is, the selected reference block 4S is a reference block 4 that is arranged in the same column as the selected memory block 3S.

Figure 8:
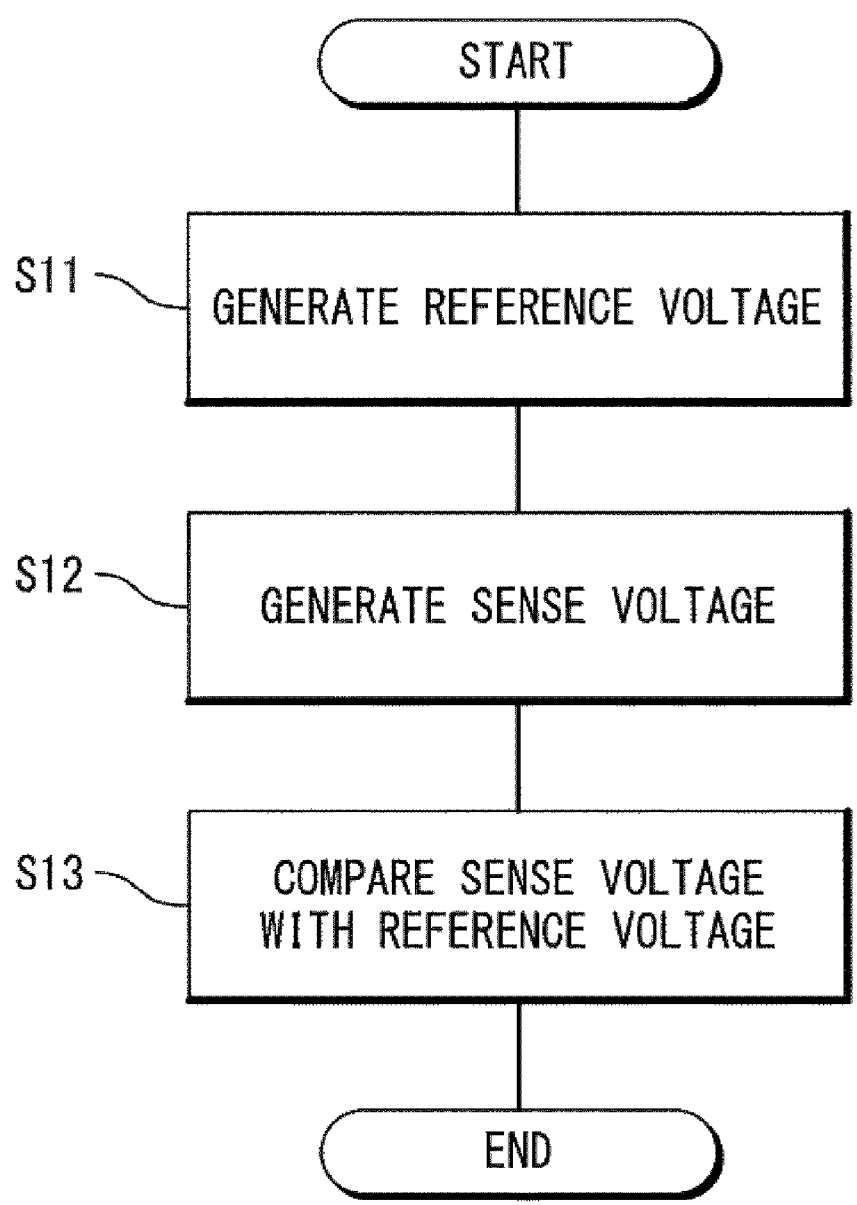
FIG. 8 is a flow chart showing a read method for the MRAM.

FIG. 8 is a flow chart showing the data read method. As shown in FIG. 8, the data read method includes Steps S11 to S13.

(Step S11)

Figure 9:
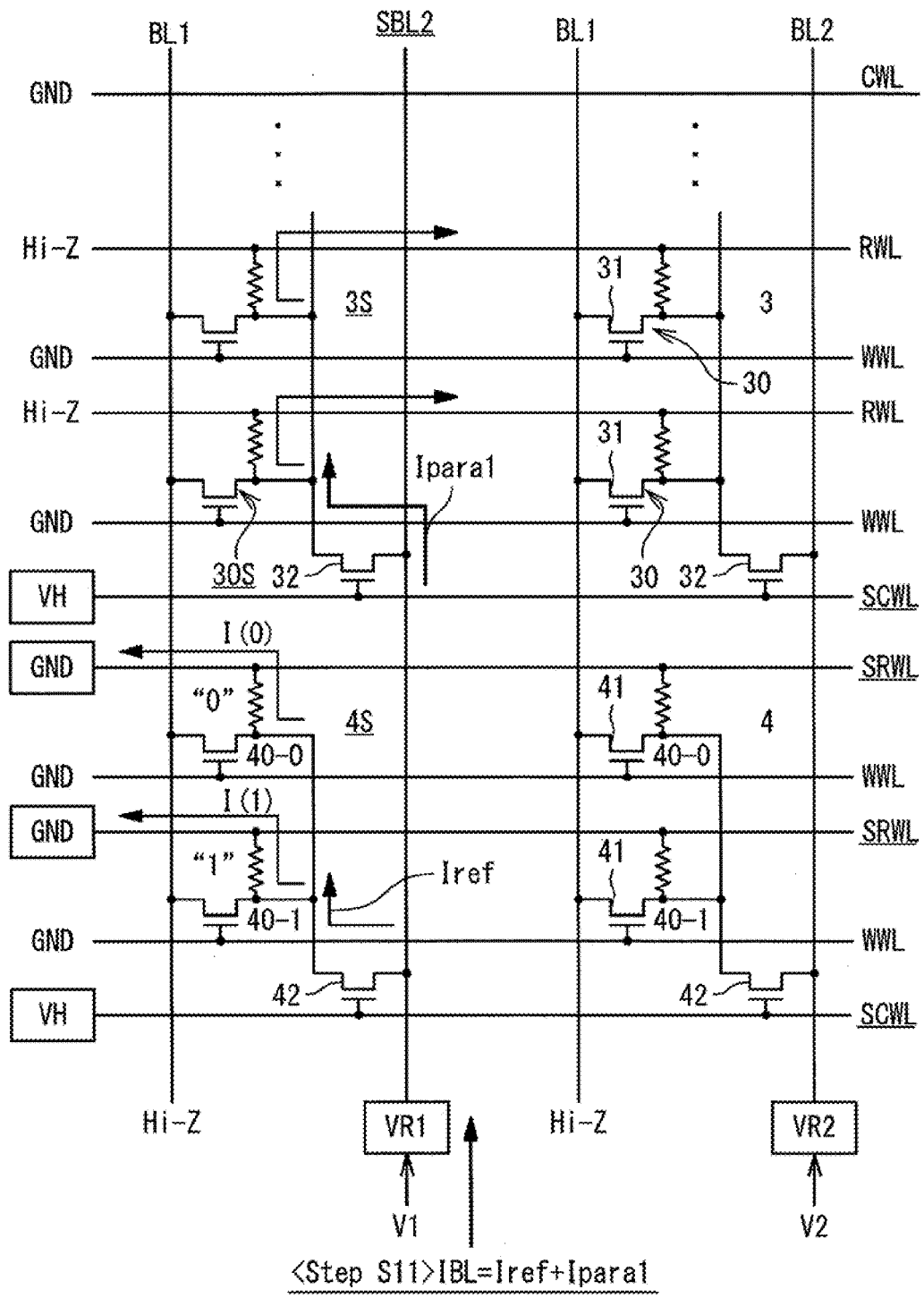
FIG. 9 is a circuit diagram for explaining a read operation in the first embodiment.

In the Step S11 (first read mode), the selected reference block 4S is used to generate a "reference voltage Vref". FIG. 9 is a diagram for explaining the Step S11 in the present embodiment.

The X-selector 5 selects the common word line CWL connected to the selected reference block 4S and applies a selection voltage VH to the selected common word line SCWL. At the same time, the X-selector 5 selects the common word line CWL connected to the selected memory block 3S and applies the selection voltage VH to the selected common word line SCWL. That is, the selected memory block 3S is selected together with the selected reference block 4S. The block transistors 32 and 42 connected to the selected common word lines SCWL are turned ON. Meanwhile, the X-selector 5 applies a ground voltage GND to the common word lines CWL (non-selected common word lines) other than the selected common word line SCWL and the write word lines WWL. As a result, all the cell transistors 31, 41 are turned OFF.

Moreover, the X-selector 5 selects the read word lines RWL connected to the reference cells 40-0 and 40-1 included in the selected reference block 4S and applies the ground voltage GND (read word voltage) to the selected read word lines SRWL. Meanwhile, the X-selector 5 sets the read word lines RWL (non-selected read word lines) other than the selected read word lines SRWL to the floating (Hi-impedance) state.

The Y-selector 7 connects between the selected second bit line SBL2 connected to the selected reference block 4S and the selected memory block 3S and the first voltage generation circuit 11 of the read circuit 10. The first voltage generation circuit 11 applies the above-mentioned first voltage V1 (see FIG. 6) as a "first read voltage VR1" to the selected second bit line SBL2. The first read voltage VR1 is different from the ground voltage GND of the selected read word line SRWL by a predetermined voltage difference.

Moreover, the Y-selector 7 connects between at least one second bit line BL2 different from the selected second bit line SBL2 and the second voltage generation circuit 12 of the read circuit 10. The second voltage generation circuit 12 applies the above-mentioned second voltage V2 as a "second read voltage VR2" to the second bit line BL2. Since the first voltage V1 and the second voltage V2 are substantially equal to each other, the first read voltage VR1 and the second read voltage VR2 also are substantially equal to each other. As will be described later, the reason why the second read voltage VR2 is applied to the second bit line BL2 different from the selected second bit line SBL2 is to suppress the parallel current.

The Y-selector 7 sets the other second bit lines BL2 and the first bit lines BL1 to the floating state.

When the voltages are thus applied, two kinds of currents flow through the selected second bit line SBL2 as shown in FIG. 9. One is a "reference current Iref" that flows into the selected reference block 4S. The other is a "first parallel current Ipara1" that flows into the selected memory block 3S.

The reference current Iref is a sum of a current I(0) that flows through the magnetoresistance element 43 of the reference cell 40-0 and a current I(1) that flows through the magnetoresistance element 43 of the reference cell 40-1. The data of the reference cell 40-0 is "0" and the resistance value of the magnetoresistance element 43 (low-resistance state) is R0. On the other hand, the data of the reference cell 40-1 is "1" and the resistance value of the magnetoresistance element 43 (high-resistance state) is R1 (>R0). In this case, the reference current Iref is given by the following Equation (3):

$$Iref=I(0)+I(1)=VR1/R0+VR1/R1 \quad (3)$$

On the other hand, the first parallel current Ipara1 flowing through the selected memory block 3S is approximately given by the following Equation (4):

$$Ipara1 \sim (VR1-VR2) \times (\Sigma(1/Ri)) \quad (4)$$

The parameter Ri is the resistance value of the magnetoresistance element 33 of each memory cell 30 in the selected memory block 3S. The second term in the Equation (4) represents a sum of parameters (1/Ri) regarding all the memory cells 30 in the selected memory block 3S. As shown in FIG. 9, a range in which the first parallel current Ipara1 flows is restricted to the same row as the selected memory block 3S.

When the first read voltage VR1 and the second read voltage VR2 are equal to each other, the first parallel current Ipara1 is substantially 0. That is, the first parallel current Ipara1 is suppressed due to the application of the second read voltage VR2. It can also be said that the second read voltage VR2 is applied so as to actively charge the parallel current path.

In the Step S11, the bit line current IBL (first bit line current) flowing through the selected second bit line SBL2 is a sum of the reference current Iref and the first parallel current Ipara1 (IBL=Iref+Ipara1). The I-V conversion circuit 13 of the read circuit 10 converts the bit line current IBL to generate the reference voltage Vref. In the Step S11, the read circuit 10 is set to the above-described first mode. In other words, the current-voltage conversion coefficient of the I-V conversion circuit 13 is G/2. Therefore, the following Equation (5) representing the reference voltage Vref can be obtained by combining the above Equations (1), (3) and (4).

$$Vref = Vdd - G/2 \times (Iref + Ipara1) \qquad \text{Equation (5)}$$
$$= Vdd - G \times \{(I(0) + I(1))/2 + Ipara1/2\}$$

The first voltage retention circuit 14 retains the generated reference voltage Vref. After that, the first voltage retention circuit 14 is disconnected from the I-V conversion circuit 13. What should be noted in the Equation (5) is that the reference voltage Vref has the first parallel current Ipara1 as a parameter. This is due to a fact that not only the selected reference block 4S but also the selected memory block 3S including the selected memory cell 30S is selected on generating the reference voltage Vref. The resultant effects will be described later.

(Step S12)

Figure 10:
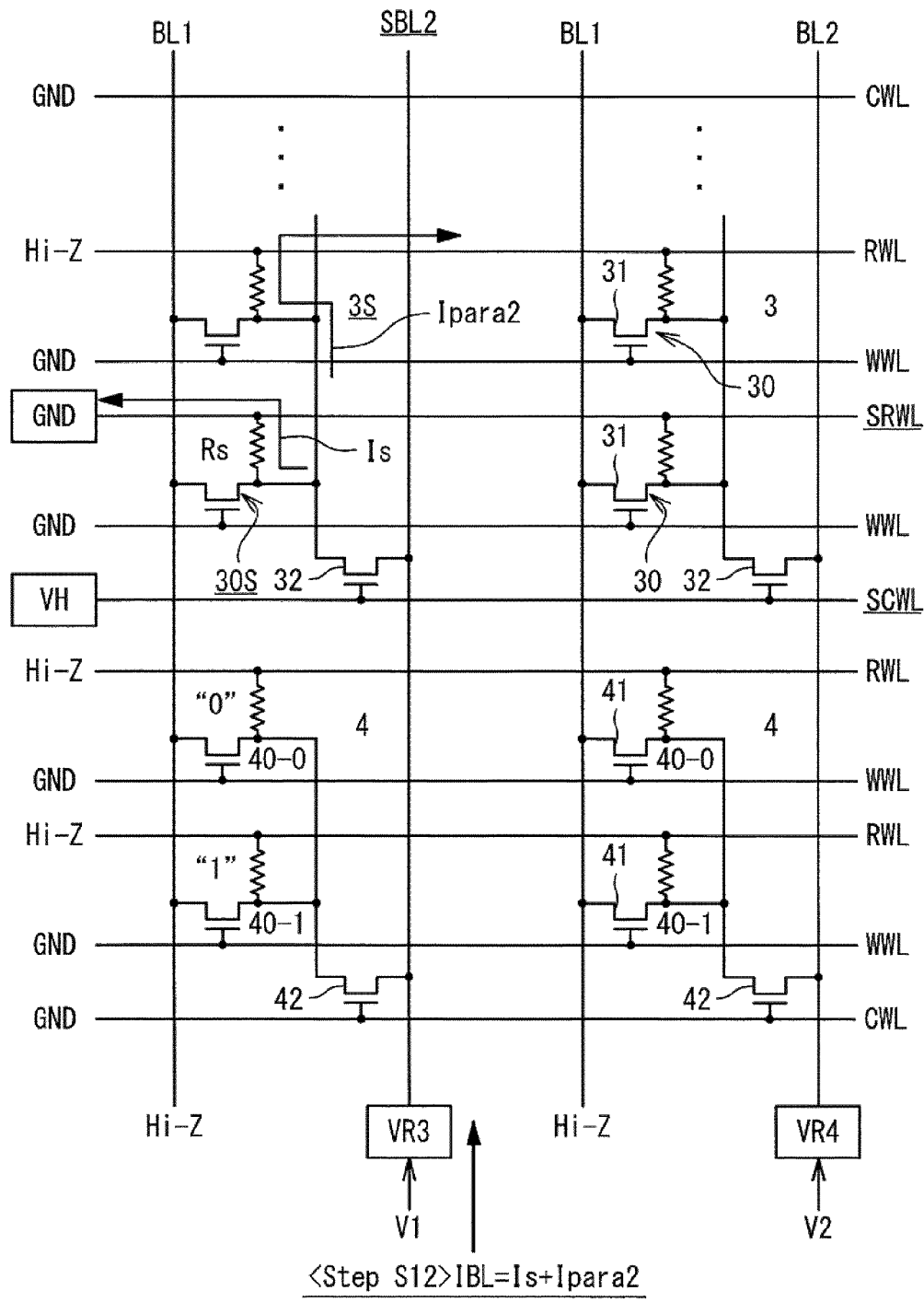
FIG. 10 is a circuit diagram for explaining a read operation in the first embodiment.

In the Step S12 (second read mode), a "sense voltage Vs" depending on the data stored in the selected memory cell 30S is generated. FIG. 10 is a diagram for explaining the Step S12 in the present embodiment.

The X-selector 5 selects the common word line CWL connected to the selected memory block 3S including the selected memory cell 30S and applies the selection voltage VH to the selected common word line SCWL. As a result, the block transistors 32 connected to the selected common word line SCWL are turned ON. Meanwhile, the X-selector 5 applies the ground voltage GND to the common word lines CWL other than the selected common word line SCWL and the write word lines WWL.

Moreover, the X-selector 5 selects the read word line RWL connected to the selected memory cell 30S and applies the ground voltage GND (read word voltage) to the selected read word line SRWL. Meanwhile, the X-selector 5 sets the read word lines RWL other than the selected read word line SRWL to the floating state.

The Y-selector 7 connects between the selected second bit line SBL2 connected to the selected memory block 3S and the first voltage generation circuit 11 of the read circuit 10. The first voltage generation circuit 11 applies the above-mentioned first voltage V1 (see FIG. 6) as a "third read voltage VR3" to the selected second bit line SBL2. That is, the third read voltage VR3 is substantially equal to the first read voltage VR1 in the Step S11.

Moreover, the Y-selector 7 connects between at least one second bit line BL2 different from the selected second bit line SBL2 and the second voltage generation circuit 12 of the read circuit 10. The second voltage generation circuit 12 applies the above-mentioned second voltage V2 as a "fourth read voltage VR4" to the second bit line BL2. That is, the fourth read voltage VR4 is substantially equal to the second read voltage VR2 in the Step S11. Furthermore, since the first voltage V1 and the second voltage V2 are substantially equal to each other, the third read voltage VR3 and the fourth read voltage VR4 also are substantially equal to each other. As will be described later, the reason why the fourth read voltage VR4 is applied to the second bit line BL2 different from the selected second bit line SBL2 is to suppress the parallel current.

The Y-selector 7 sets the other second bit lines BL2 and the first bit lines BL1 to the floating state.

When the voltages are thus applied, two kinds of currents flow through the selected second bit line SBL2 as shown in FIG. 10. One is a "sense current Is" that flows through the selected memory cell 30S. The other is a "second parallel current Ipara2" that flows through the memory cells 30 (non-selected memory cells) other than the selected memory cell 30S in the selected memory block 3S.

The sense current Is is a current that flows through the magnetoresistance element 33 of the selected memory cell 30S. The magnitude of the sense current Is varies depending on the resistance value of magnetoresistance element 33, namely the data of the selected memory cell 30S. When the resistance value of the magnetoresistance element 33 of the selected memory cell 30S is Rs, the sense current Is is given by the following Equation (6):

$$Is = VR3/Rs \qquad (6)$$

On the other hand, the second parallel current Ipara2 flowing through the non-selected memory cells 30 in the selected memory block 3S is approximately given by the following Equation (7):

$$Ipara2 \sim (VR3-VR4) \times (\Sigma(1/Ri)) \qquad (7)$$

The parameter Ri is the resistance value of the magnetoresistance element 33 of each non-selected memory cell 30 in the selected memory block 3S. The second term in the Equation (7) represents a sum of parameters (1/Ri) regarding the non-selected memory cells 30. As shown in FIG. 10, a range in which the second parallel current Ipara2 flows is restricted to the same row as the selected memory block 3S.

When the third read voltage VR3 and the fourth read voltage VR4 are equal to each other, the second parallel current Ipara2 is substantially 0. That is, the second parallel current Ipara2 is suppressed due to the application of the fourth read voltage VR4. It can also be said that the fourth read voltage VR4 is applied so as to actively charge the parallel current path.

In the Step S12, the bit line current IBL (second bit line current) flowing through the selected second bit line SBL2 is a sum of the sense current Is and the second parallel current Ipara2 (IBL=Is+Ipara2). The I-V conversion circuit 13 of the read circuit 10 converts the bit line current IBL to generate the sense voltage Vs. In the Step S12, the read circuit 10 is set to the above-described second mode. In other words, the current-voltage conversion coefficient of the I-V conversion circuit 13 is G. Therefore, the following Equation (8) representing the sense voltage Vs can be obtained by combining the above Equations (2), (6) and (7):

$$Vs = Vdd - G \times (Is + Ipara2) \qquad (8)$$

The magnitude of the sense voltage Vs depends on the data of the selected memory cell 30S. In the present embodiment, the magnetoresistance element 33 of the memory cell 30 and the magnetoresistance element 93 of the reference cell 90 have the same physical structure. Also, the first read voltage VR1 and the third read voltage VR3 are equal to each other. Therefore, sense voltages Vs(0) and Vs(1) in the cases where the data of the selected memory cell 30S is "0" and "1" are respectively given by the following Equations (8-0) and (8-1).

$$Vs(0) = Vdd - G \times (I(0) + Ipara2) \qquad (8-0)$$

$$Vs(1) = Vdd - G \times (I(1) + Ipara2) \qquad (8-1)$$

The current I(1) corresponding to the data "1" (high-resistance state) is smaller than the current I(0) corresponding to the data "0" (low-resistance state). Therefore, the sense voltage Vs(1) is larger than the sense voltage Vs(0). The second voltage retention circuit 15 retains the generated sense voltage Vs. After that, the second voltage retention circuit 15 is disconnected from the I-V conversion circuit 13.

(Step S13)

In the Step S13, the read circuit 10 determines the data stored in the selected memory cell 30S. More specifically, the comparison circuit 16 of the read circuit 10 makes a comparison between the reference voltage Vref (refer to the Equation (5)) retained by the first voltage retention circuit 19 and the sense voltage Vs (refer to the Equations (8-0) and (8-1)) retained by the second voltage retention circuit 15.

First, let us ignore influences of the parallel currents Ipara1 and Ipara2. In a case where the data of the selected memory cell 30S is "0", a voltage difference ΔV(0) between the reference voltage Vref and the sense voltage Vs(0) is defined as ΔV(0)=Vref−Vs(0). Referring to the foregoing Equation (5) and Equation (8-0), the voltage difference ΔV(0) is given by the following Equation (9-0):

$$\Delta V(0) = G \times \{(I(0) - I(1))/2\} \quad (9\text{-}0)$$

Since the current I(0) corresponding to the data "0" is larger than the current I(1) corresponding to the data "1", the voltage difference ΔV(0) is a positive value. In other words, the sense voltage Vs(0) in the case of data "0" is lower than the reference voltage Vref.

On the other hand, in a case where the data of the selected memory cell 30S is "1", a voltage difference ΔV(1) between the sense voltage Vs(1) and the reference voltage Vref is defined as ΔV(1)=Vs(1)−Vref. Referring to the foregoing Equation (5) and Equation (8-1), the voltage difference ΔV(1) is given by the following Equation (9-1):

$$\Delta V(1) = G \times \{(I(0) - I(1))/2\} \quad (9\text{-}1)$$

Similarly, the voltage difference ΔV(1) is a positive value. In other words, the sense voltage Vs(1) in the case of data "1" is higher than the reference voltage Vref.

In this manner, the sense voltage Vs becomes lower or higher than the reference voltage Vref, depending on the data of the selected memory cell 30S. In other words, the reference voltage Vref is so generated in the Step S11 as to be between the sense voltage Vs(0) and the sense voltage Vs(1). This is due to a fact that, in the Step S11, the reference cells 40-0 and 40-1 are used and the current-voltage conversion coefficient (G/2) is smaller than the current-voltage conversion coefficient (G) in the Step S12. Thus, the comparison circuit 16 can determine the data of the selected memory cell 30S by comparing the sense voltage Vs with the reference voltage Vref. The read circuit 10 outputs a read data SAOUT depending on the determined data.

Next, let us take the influences of the parallel currents Ipara1 and Ipara2 into consideration. Since the parallel current is caused, actual voltage difference £V(0) and voltage difference ΔV(1) are expressed by the following Equation (10-0) and Equation (10-1), respectively.

$$\Delta V(0) = G \times \left\{ \begin{array}{l} (I(0) - I(1))/2 + \\ (Ipara2 - Ipara1/2) \end{array} \right\} \quad \text{Equation (10-0)}$$
$$= G \times \{(I(0) - I(1))/2\} + G \times \Delta Ipara$$

$$\Delta V(1) = G \times \left\{ \begin{array}{l} (I(0) - I(1))/2 - \\ (Ipara2 - Ipara1/2) \end{array} \right\} \quad \text{Equation (10-1)}$$
$$= G \times \{(I(0) - I(1))/2\} - G \times \Delta Ipara$$

In the Equations (10-0) and (10-1), the first term represents the ideal voltage difference where there is no influence of the parallel current. On the other hand, the second term represents the influence of the parallel current. The voltage difference ΔV(1) or the voltage difference ΔV(0) becomes smaller depending on positive or negative of the parameter ΔIpara. This means that the voltage comparison by the comparison circuit 16 becomes more difficult. In the worst case, the voltage difference ΔV(0) or the voltage difference ΔV(1) becomes not positive but negative. In that case, erroneous data decision occurs and thus an incorrect read data SAOUT is output. It is therefore desirable that an absolute value of the parameter ΔIpara is small.

In the present embodiment, the parameter ΔIpara is given by "Ipara2−Ipara1/2". The reason is that the reference voltage Vref has the first parallel current Ipara1 as a parameter (refer to Equation (5)). In other words, the reason is that not only the selected reference block 4S but also the selected memory block 3S is selected on generating the reference voltage Vref. Thus, the influence of the second parallel current Ipara2 is partially canceled by the influence of the first parallel current Ipara1. Consequently, the absolute value of the parameter ΔIpara becomes small.

As a comparative example, let us consider a case where only the selected reference block 4S is selected on generating the reference voltage Vref (Step S11). Since the selected memory block 3S is not selected, the generated reference voltage Vref does not include the first parallel current Ipara1 as a parameter. In this case, the parameter ΔIpara is equal to the second parallel current Ipara2. The cancellation of the parallel current does not occur, and thus the absolute value of the parameter ΔIpara becomes large.

Figure 11:
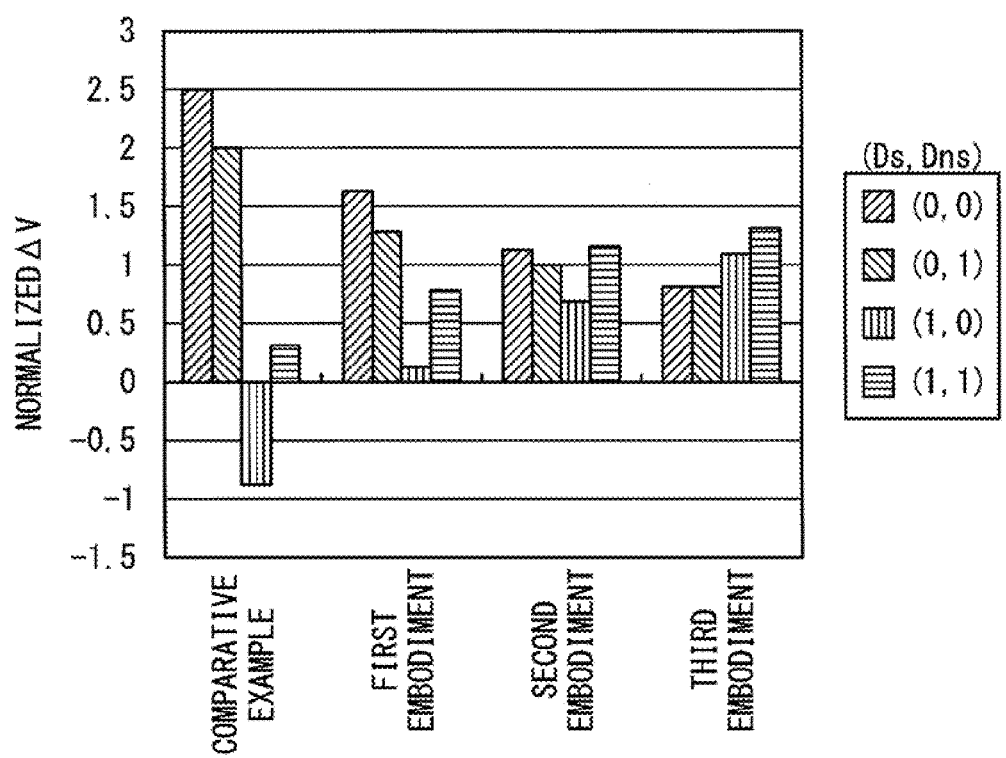
FIG. 11 is a graph showing magnitudes of read signals.

FIG. 11 shows a result of comparison of the voltage difference ΔV (read signal amount) between the present embodiment and the comparative example. The voltage difference ΔV depends on the data of the selected memory cell 30S and data of the non-selected memory cells 30. The voltage difference ΔV is calculated for four patterns based on combination of the data Ds (0 or 1) of the selected memory cell 30S and the data Dns (0 or 1) of the non-selected memory cells 30. Here, the voltage difference ΔV is normalized by the ideal voltage difference under the condition where the parallel current is 0.

In the calculation, a 8×8 memory cell array is used. The first voltage V1 (the first read voltage VR1 and the third read voltage VR3) is set to 400 mV. On the other hand, the second voltage V2 (the second read voltage VR2 and the fourth read voltage VR4) is set to 370 mV. Here, actual manufacturing variability and the like is taken into consideration and a difference between the first voltage V1 and the second voltage V2 is set to 30 mV, although the difference between the first voltage V1 and the second voltage V2 being 0 is ideal in terms of the suppression of the parallel current.

As shown in FIG. 11, in the case of the comparative example, the voltage difference ΔV becomes extremely small when the data Ds of the selected memory cell 30S is "1". In particular, the voltage difference ΔV becomes a negative value in the case of (Ds, Dns)=(1, 0). This means that erroneous data decision occurs and an incorrect read data SAOUT is output. On the other hand, in the case of the first embodiment, the voltage difference ΔV is positive in all the patterns. Even in the case of the worst condition (Ds, Dns)=(1, 0), the voltage difference ΔV is positive. Therefore, a correct read data SAOUT is output. It is required for a normal memory that the read data SAOUT is correct in every pattern. In that sense, reliability of the read data SAOUT is higher in the first embodiment than in the comparative example.

The cause of the erroneous data decision in the case of the comparative example is the second parallel current Ipara2 at the time of generating the sense voltage Vs. Since the second parallel current Ipara2 affects the comparison between the sense voltage Vs and the reference voltage Vref, the erroneous data decision is caused. According to the first embodiment, on the other hand, the reference voltage Vref includes the influence of the first parallel current Ipara1. Then, at the time of the comparison between the sense voltage Vs and the reference voltage Vref, the influence of the second parallel current Ipara2 is partially canceled by the influence of the first parallel current Ipara1. That is, the influence of the parallel current becomes smaller as a whole. Consequently, the reliability of the read data SAOUT is improved.

Primary features of the above-described read operation in the first embodiment are summarized as follows.

A first feature is that not only the selected reference block 4S but also the selected memory block 3S is selected at the time of generating the reference voltage Vref (Step S11). Thus, the influence of the first parallel current Ipara1 flowing in the selected memory block 3S is incorporated in the reference voltage Vref. Then, in the Step S13, the influence of the second parallel current Ipara2 is canceled by the influence of the first parallel current Ipara1. Therefore, the absolute value of the parameter ΔIpara becomes small. As a result, the reliability of the read data SAOUT is improved.

A second feature is that, in the Step S11, the second read voltage VR2 substantially equal to the first read voltage VR1 is applied to the second bit line BL2 other than the selected second bit line SBL2. Thus, an absolute value of the first parallel current Ipara1 becomes small (refer to the Equation (4)). Moreover, in the Step S12, the fourth read voltage VR4 substantially equal to the third read voltage VR3 is applied to the second bit line BL2 other than the selected second bit line SBL2. Thus, an absolute value of the second parallel current Ipara2 becomes small (refer to the Equation (7)). The fact that the first parallel current Ipara1 and the second parallel current Ipara2 are small also contributes to the improvement in the reliability of the read data SAOUT.

A third feature is that the same inverter INV (refer to FIG. 6) is used for generating the first read voltage VR1 in the Step S11 and for generating the third read voltage VR3 in the Step S12. The first read voltage VR1 and the third read voltage VR3 are fixed to the inversion threshold voltage (first voltage V1) of the same inverter INV. There is no influence of variation in the inversion threshold voltage between different inverters. Therefore, a difference between the first read voltage VR1 and the third read voltage VR3 can be reduced without being affected by manufacturing variability. Since the difference between the first read voltage VR1 and the third read voltage VR3 is small, the first parallel current Ipara1 and the second parallel current Ipara2 are comparable to each other (refer to the Equations (4) and (7)). As a result, the influence of the parallel current is likely to be canceled. This also contributes to the improvement in the reliability of the read data SAOUT.

A fourth feature is that in the memory cell array 2, a region in which the parallel current (Ipara1, Ipara2) flows is restricted.

This results from that the memory cell array 2 is sectioned into the plurality of memory blocks 3 by using the block transistors 32. As shown in FIG. 9 and FIG. 10, the range in which the parallel current flows is restricted to the same row as the selected memory block 3S. Therefore, parallel paths connected to the selected memory cell 30S are limited and hence the parallel current becomes small. As is obvious from the foregoing Equations (4) and (7), the parallel current can be made smaller by reducing the number of the memory cells 30 in the memory block 3. Even if the voltage of the selected second bit line SBL2 and the voltage of the other second bit lines BL2 are different from each other, the parallel current is suppressed to some extent. In this manner, the parallel current can be suppressed by the MRAM configuration according to the present embodiment. This also contributes to the improvement in the reliability of the read data SAOUT.

According to the present embodiment, as described above, a useful MRAM configuration is provided. Moreover, the reliability of the read data SAOUT at the time of data reading can be improved.

1-3. Write Operation

Figure 12:
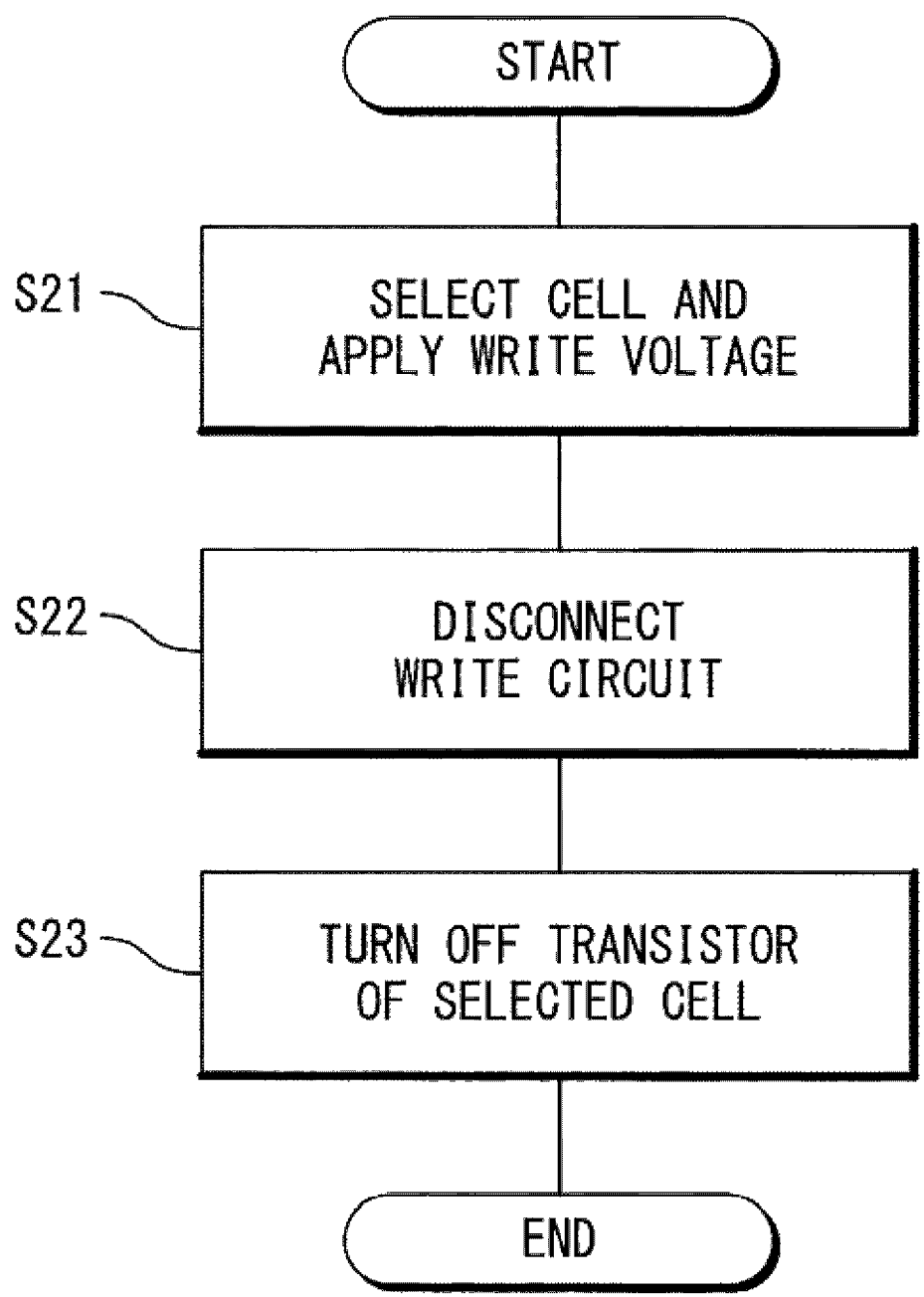
FIG. 12 is a flow chart showing a write method for the MRAM.

Next, a data write operation in the present embodiment will be described. FIG. 12 is a flow chart showing the data write method. As shown in FIG. 12, the data write method includes Steps S21 to S23.

(Step S21)

Figure 13:
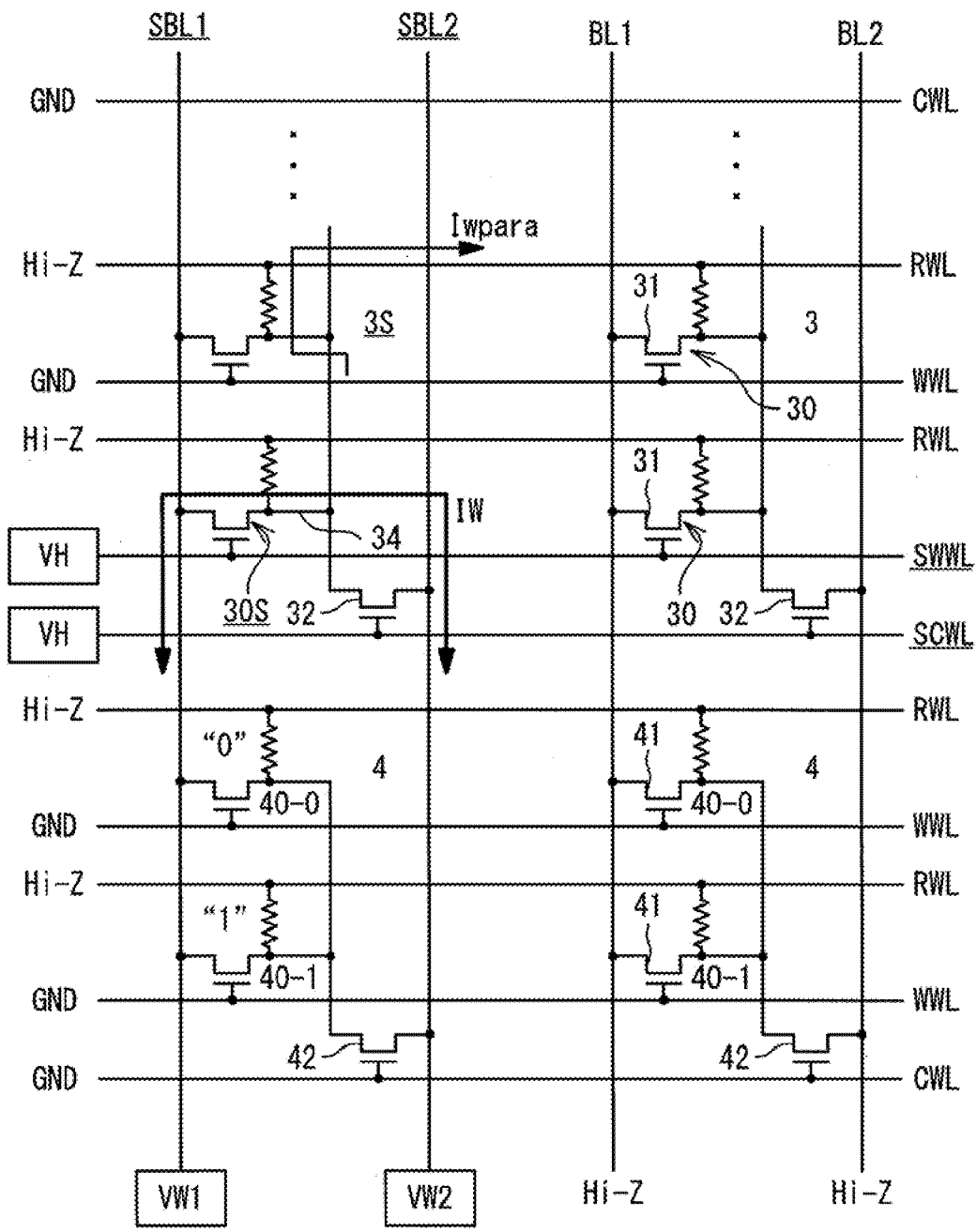
FIG. 13 is a circuit diagram for explaining a write operation in the first embodiment.

FIG. 13 is a diagram for explaining the Step S21 in the present embodiment. The X-selector 5 selects the common word line CWL connected to the selected memory block 3S including the selected memory cell 30S and applies the selection voltage VH to the selected common word line SCWL. The block transistors 32 connected to the selected common word line SCWL are turned ON. Also, the X-selector 5 selects the write word line WWL connected to the selected memory cell 30S and applies the selection voltage VH to the selected write word line SWWL. The cell transistors 31 connected to the selected write word line SWWL are turned ON.

Moreover, the X-selector 5 applies the ground voltage GND to the common word lines CWL other than the selected common word line SCWL and the write word lines WWL other than the selected write word line SWWL. Furthermore, the X-selector 5 sets all the read word lines RWL to the floating state.

The Y-selector 7 connects between the write circuit 20 and the selected bit line pair (the selected first bit line SBL1 and the selected second bit line SBL2) connected to the selected memory block 3S. Moreover, the Y-selector 7 sets the bit line pairs other than the selected bit line pair to the floating state.

The write circuit 20 applies a first write voltage VW1 to the selected first bit line SBL1 and applies a second write voltage VW2 to the selected second bit line SBL2. The first write voltage VW1 and the second write voltage VW2 are different from each other. The write circuit 20 sets the first write voltage VW1 and the second write voltage VW2 depending on the write data. For example, when the write data is "0", the first write voltage VW1 is set to the power-supply voltage and the second write voltage VW2 is set to the ground voltage. On the other hand, when the write data is "1", the first write voltage VW1 is set to the ground voltage and the second write voltage VW2 is set to the power-supply voltage.

As a result, as shown in FIG. 13, a write current IW flows through the selected memory cell 30S. More specifically, the write current IW flows between the selected first bit line SBL1 and the selected second bit line SBL2 through the in-cell interconnection 34 (write interconnection) near the magnetoresistance element 33 in the selected memory cell 30S. A write magnetic field generated by the write current IW flowing through the write interconnection 34 is applied to the magnetoresistance element 33 of the selected memory cell 30S. When the magnitude of the applied write magnetic field exceeds a predetermined threshold value, a magnetization direction of a magnetization free layer of the magnetoresistance element 33 is changed to a direction of the write magnetic field. That is, the data of the selected memory cell 30S is rewritten. The direction of the write magnetic field, namely the direction of the write current IW can be reversed by setting the first write voltage VW1 and the second write voltage VW2 applied to the selected bit line pair.

It should be noted that a parallel current Iwpara flows through the non-selected memory cells 30 in the selected memory block 3S as in the case of the read operation. However, since the resistance of the magnetoresistance element 33 is sufficiently higher than the resistance of the write interconnection 34, the parallel current Iwpara is much smaller than the write current IW. Therefore, a magnetic field generated by the parallel current Iwpara does not rewrite the data of the non-selected memory cells 30.

(Step S22)

Figure 14:
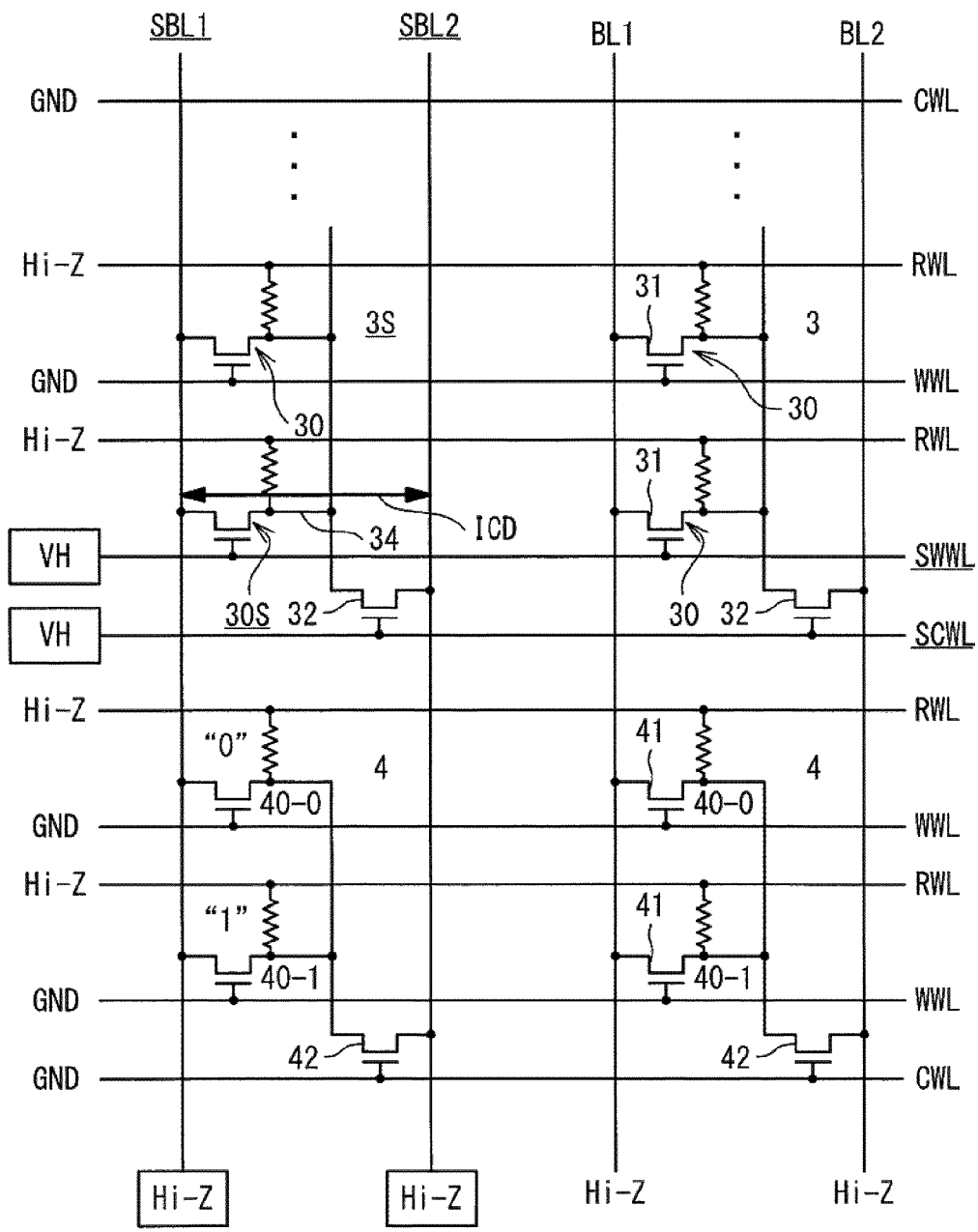
FIG. 14 is a circuit diagram for explaining a write operation in the first embodiment.

After the Step S21, the Y-selector 7 electrically disconnects the selected bit line pair (the selected first bit line SBL1 and the selected second bit line SBL2) connected to the selected memory block 3S from the write circuit 20. That is, as shown in FIG. 14, the selected bit line pair is set to the floating state. Therefore, a "charge-discharge current ICD" flows between the selected first bit line SBL1 and the selected second bit line SBL2 through the cell transistor 31 of the selected memory cell 30S and the block transistor 32. As a result, the voltages of the selected first bit line SBL1 and the selected second bit line SBL2 become equal to each other. The charge-discharge current ICD flows in the same direction as the write current IW does in the Step S21. Therefore, the charge-discharge current ICD does not destroy the memory data of the selected memory cell 30S.

(Step S23)

After the Step S22, the X-selector 5 cancels the selection of the selected common word line SCWL and the selected write word line SWWL. That is, the ground voltage is applied to all of the common word lines SCWL and the write word lines WWL. As a result, the block transistor 32 of the selected memory block 35 is turned OFF and the cell transistor 31 of the selected memory cell 30S is turned OFF. Thus, the data writing to the selected memory cell 30S is completed.

According to the present embodiment, as described above, it is possible to selectively supply the write current IW only to the write interconnection 34 in the selected memory cell 30S by using the bit line pair BL1, BL2, the cell transistor 31 and the block transistor 32. The write current IW does not flow through the write interconnection 34 of the memory cell 30 other than the selected memory cell 30. Therefore, the selectivity of the memory cell is improved and the write margin is enlarged, as compared with the typical cross-point cell array configuration. The selectivity of the memory cell at the time of data writing is improved due to the MRAM configuration according to the present embodiment.

It is not necessary to provide the block transistor 32 for each memory cell 30 in order to selectively supply the write current IW only to the selected memory cell 30S. It is enough to provide one block transistor 32 for one block as in the MRAM configuration according to the present embodiment. Consequently, a circuit area is reduced.

Moreover, according to the present embodiment, the Step S22 and the Step S23 are not performed simultaneously, and the timing of the Step S23 is after the Step S22. In other words, the selection of the selected common word line SCWL and the selected write word line SWWL is canceled after the charge-discharge current ICD flows and the voltages of the selected bit line pair (SBL1, SBL2) are equalized. A resultant effect will be described with reference to FIG. 15.

Figure 15:
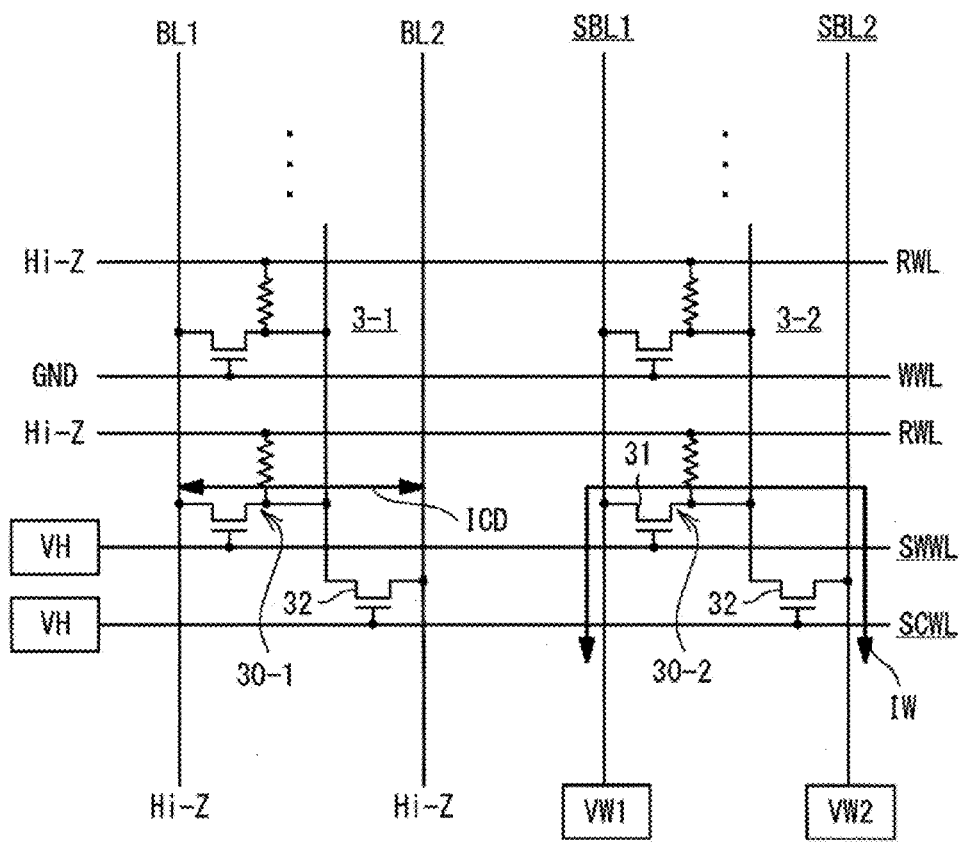
FIG. 15 is a circuit diagram for explaining an effect of the write method in the first embodiment.

In FIG. 15, a memory cell 30-1 is included in a memory block 3-1. A memory cell 30-2 is included in a memory block 3-2 adjacent to the memory block 3-1. The memory blocks 3-1 and 3-2 are connected to the same common word line CWL, and the memory cells 30-1 and 30-2 are connected to the same write word line WWL. For comparison with the present embodiment, let us consider a case where the Step S22 and the Step S23 are simultaneously performed.

First, the data writing is performed with respect to a memory cell 30 that is arranged in the same column as the memory cell 30-1. After the Step S21, the Step S22 and the Step S23 are simultaneously performed. In this case, the cell transistor 31 and the block transistor 32 are turned OFF while a voltage difference (VW1−VW2) exists between the first bit line BL1 and the second bit line BL2.

Next, the data writing is performed with respect to the memory cell 30-2 (selected memory cell). In the Step S21, the first write voltage VW1 is applied to the selected first bit line SBL1 and the second write voltage VW2 is applied to the selected second bit line SBL2 as shown in FIG. 15. The bit line pair BL1, BL2 connected to the memory block 3-1 are set to the floating state. Also, the common word line CWL connected to the memory block 3-2 is selected and the write word line WWL connected to the memory cell 30-2 is selected. As a result, the block transistor 32 of the memory block 3-2 and the cell transistor 31 of the memory cell 30-2 are turned ON and the write current IW flows through the memory cell 30-2.

However, the block transistor 32 of the memory block 3-1 and the cell transistor 31 of the memory cell 30-1 also are turned ON concurrently. Since there exists the voltage difference between the first bit line BL1 and the second bit line BL2 connected to the memory block 3-1, a charge-discharge current ICD flows through the memory cell 30-1 (non-selected memory cell) as shown in FIG. 15. A magnetic field generated by this charge-discharge current ICD may destroy the data stored in the memory cell 30-1 (non-selected memory cell).

It is therefore preferable that the Step S23 is performed after the Step S22 as in the present embodiment. In other words, it is preferable to end the write operation for the selected memory cell 30S after equalizing the voltages of the selected first bit line SBL1 and the selected second bit line SBL2. It is important to complete the charge-discharge during the write operation for the selected memory cell 30S. It is thus possible to prevent the charge-discharge current ICD from flowing through the non-selected memory cell 30 and to avoid data destruction of the non-selected memory cell 30.

A method to equalize the voltages of the selected first bit line SBL1 and the selected second bit line SBL2 in the Step S22 is not limited to the above one. For example, after the Step S21, the write circuit 20 sets the voltages of the selected first bit line SBL1 and the selected second bit line SBL2 to the ground voltage GND. After that, the Y-selector 7 electrically disconnects the selected first bit line SBL1 and the selected second bit line SBL2 from the write circuit 20. This method can also achieve the same effect.

According to the present embodiment, as described above, the selectivity of the selected memory cell is improved and the write margin is enlarged at the time of data writing. Moreover, the data destruction of the non-selected memory cell at the time of data writing can be prevented.

1-4. Structure and Layout

Figure 16:
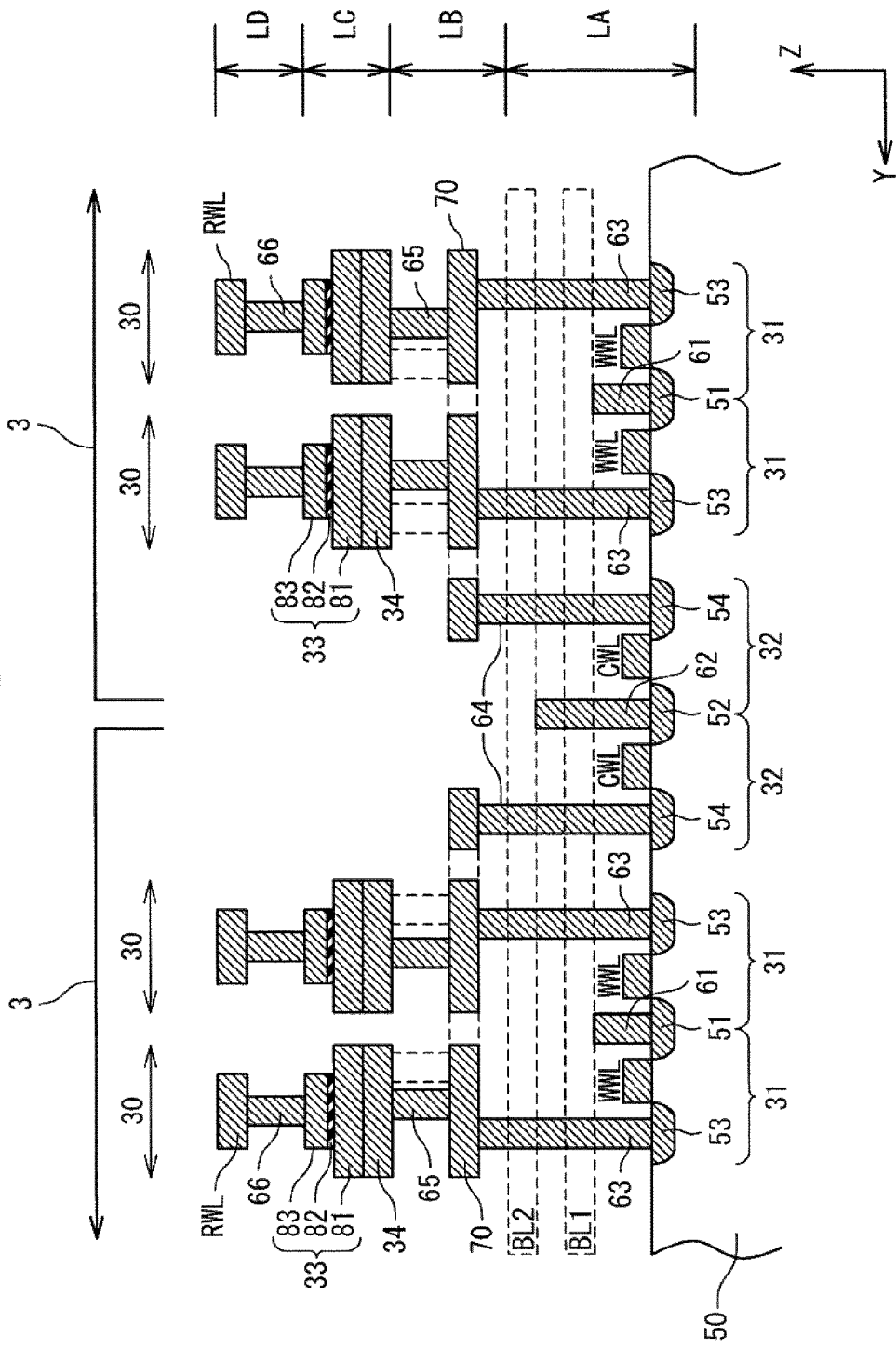
FIG. 16 is a cross-sectional view showing a structure of the MRAM in the first embodiment.
Figure 17:
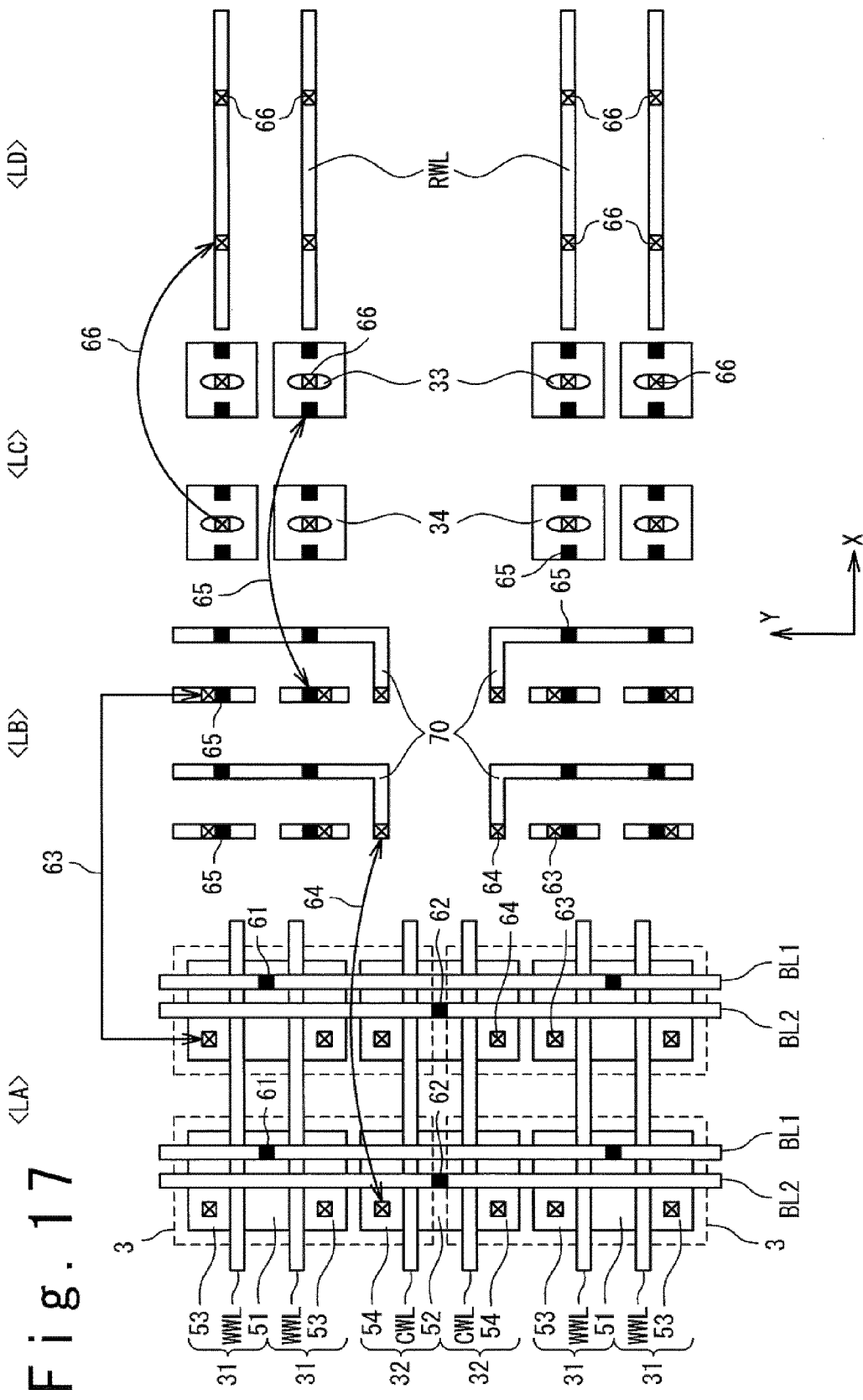
FIG. 17 is a plan view showing a structure of the MRAM in the first embodiment.

FIG. 16 shows one example of a cross-sectional structure of the MRAM 1 in the present embodiment. FIG. 17 shows one example of a plan view of layers LA to LD indicted in FIG. 16.

The cell transistor 31 and the block transistor 32 are formed on a semiconductor substrate 50. Also, diffusion regions 51, 53 of the cell transistor 31 and diffusion regions 52, 59 of the block transistor 32 are formed at surfaces of the semiconductor substrate 50. The gate of the cell transistor 31 is the write word line WWL. The gate of the block transistor 32 is the common word line CWL. The write word line WWL and the common word line CWL are formed along the X-direction.

The diffusion region 51 of the cell transistor 31 is connected to the first bit line BL1 through a first contact 61. The diffusion region 51 is shared by adjacent cell transistors 31. The diffusion region 52 of the block transistor 32 is connected to the second bit line BL2 through a second contact 62. The diffusion region 52 is shared by the block transistors 32 of adjacent memory blocks 3. The first bit line BL1 and the second bit line BL2 are formed along the Y-direction.

The diffusion region 53 of the cell transistor 31 is connected through a third contact 63 to a in-block interconnection 70 formed in the layer LB. The diffusion regions 54 of the block transistor 32 is connected through a fourth contact 64 to a in-block interconnection 70. The in-block interconnection 70 is connected through a fifth contact 65 to the in-cell interconnection 34 (write interconnection) formed in the layer LC.

The magnetoresistance element 33 is formed on the write interconnection 34. The magnetoresistance element 33 includes a magnetization fixed layer 81, a non-magnetic layer 82 and a magnetization free layer 83. The non-magnetic layer 82 is formed on the magnetization fixed layer 81, and the magnetization free layer 83 is formed on the non-magnetic layer 82. The non-magnetic layer 82 is, for example, a thin tunnel insulating film of such as AlO. The magnetization fixed layer 81 and the magnetization free layer 83 each is a ferromagnetic body and has spontaneous magnetization. A magnetization direction of the magnetization fixed layer 81 is fixed to the −Y-direction, for example. On the other hand, a magnetization direction of the magnetization free layer 83 is reversible and can be either the +Y-direction of the −Y-direction. Since the write current flowing through the write interconnection 34 is along the X-direction, the write magnetic field generated by the write current can switch the magnetization direction of the magnetization free layer 83. The cell data corresponds to the magnetization direction of the magnetization free layer 83.

The magnetization free layer 83 of the magnetoresistance element 33 is connected through a sixth contact 66 to the read word line RWL formed in the layer LD. The read word line RWL is formed along the X-direction.

1-5. Effects

According to the first embodiment of the present invention, as described above, a useful MRAM configuration is provided. Also, the reliability of the read data SAOUT at the time of data reading is improved. Moreover, the selectivity of the memory cell is improved at the time of data writing. Furthermore, the data destruction of the non-selected memory cell at the time of data writing can be prevented.

2. Second Embodiment

Next, a second embodiment of the present invention will be described below. In the second embodiment, the number of reference cells 40 included in one reference block 4 is different from that in the first embodiment. The same reference numerals are given to the same components as those described in the first embodiment, and an overlapping description will be omitted as appropriate.

Figure 18:
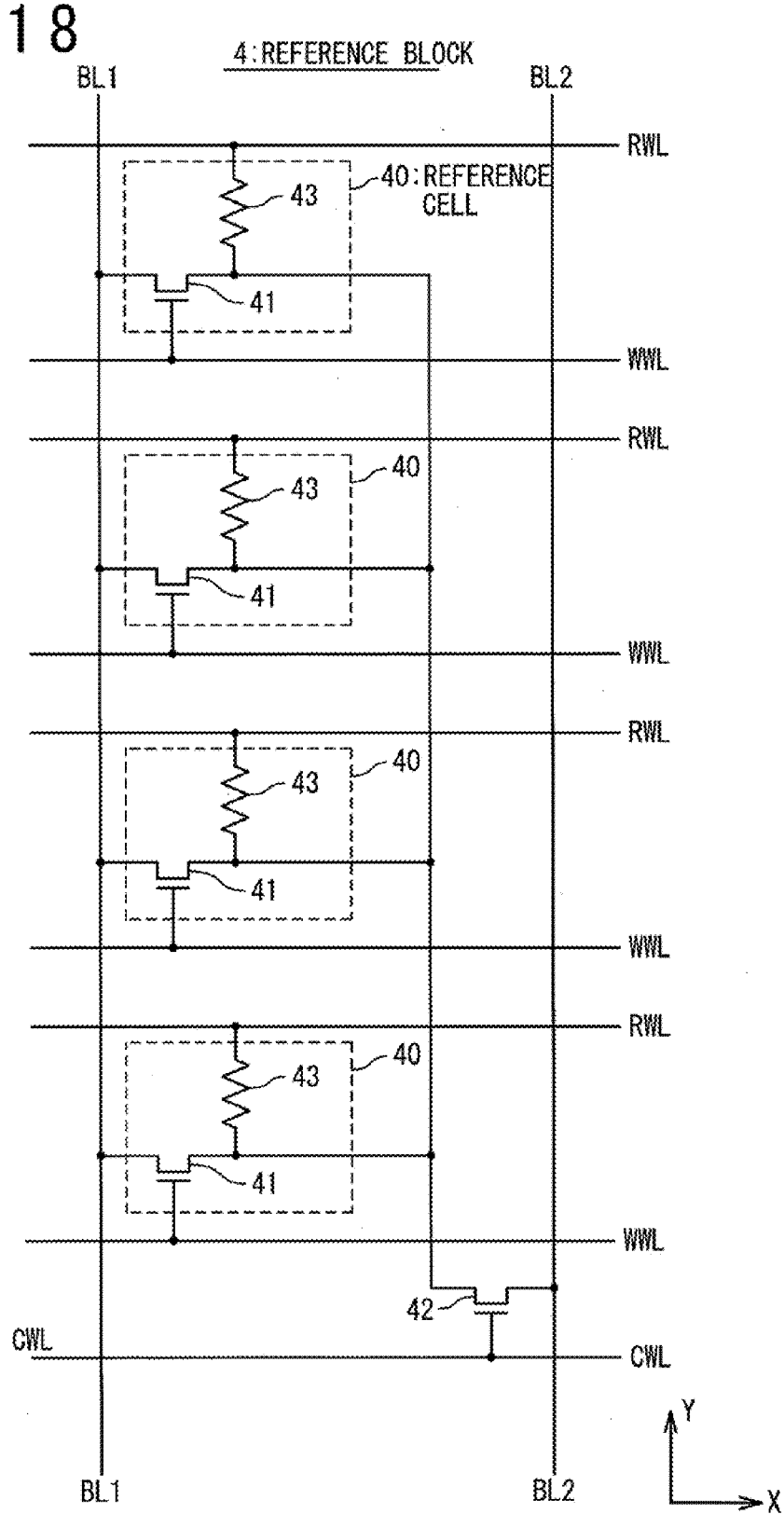
FIG. 18 is a circuit diagram showing a configuration of one reference block in a second embodiment of the present invention.

FIG. 18 shows a configuration of one reference block 4 in the second embodiment. The one reference block 4 has m reference cells 40 (m is not less than 3) and the block transistor 42. Data of each reference cell 40 is fixed. Specifically, in a case where m is an even number, m/2 reference cells 40 each is the reference cell 40-0 in which the fixed data "0" is stored, and the other m/2 reference cells 40 each is the reference cell 40-1 in which the fixed data "1" is stored. In a case where m is an odd number, (m−1)/2 reference cells 40 each is the reference cell 40-0 in which the fixed data "0" is stored, and the other (m+1)/2 reference cells 40 each is the reference cell 40-1 in which the fixed data "1" is stored.

The data write operation in the second embodiment is the same as in the first embodiment, and its explanation is omitted.

The data read operation includes the Steps S11 to S13 as in the case of the first embodiment. An overlapping description with the first embodiment will be omitted as appropriate. In the Step S11 (generating the reference voltage Vref), a method of selecting the reference cell 40 in the selected reference block 4S is different from that in the first embodiment. According to the present embodiment, only a predetermined number of reference cells 40 among the m reference cells 40 included in the selected reference block 4S are used.

Figure 19:
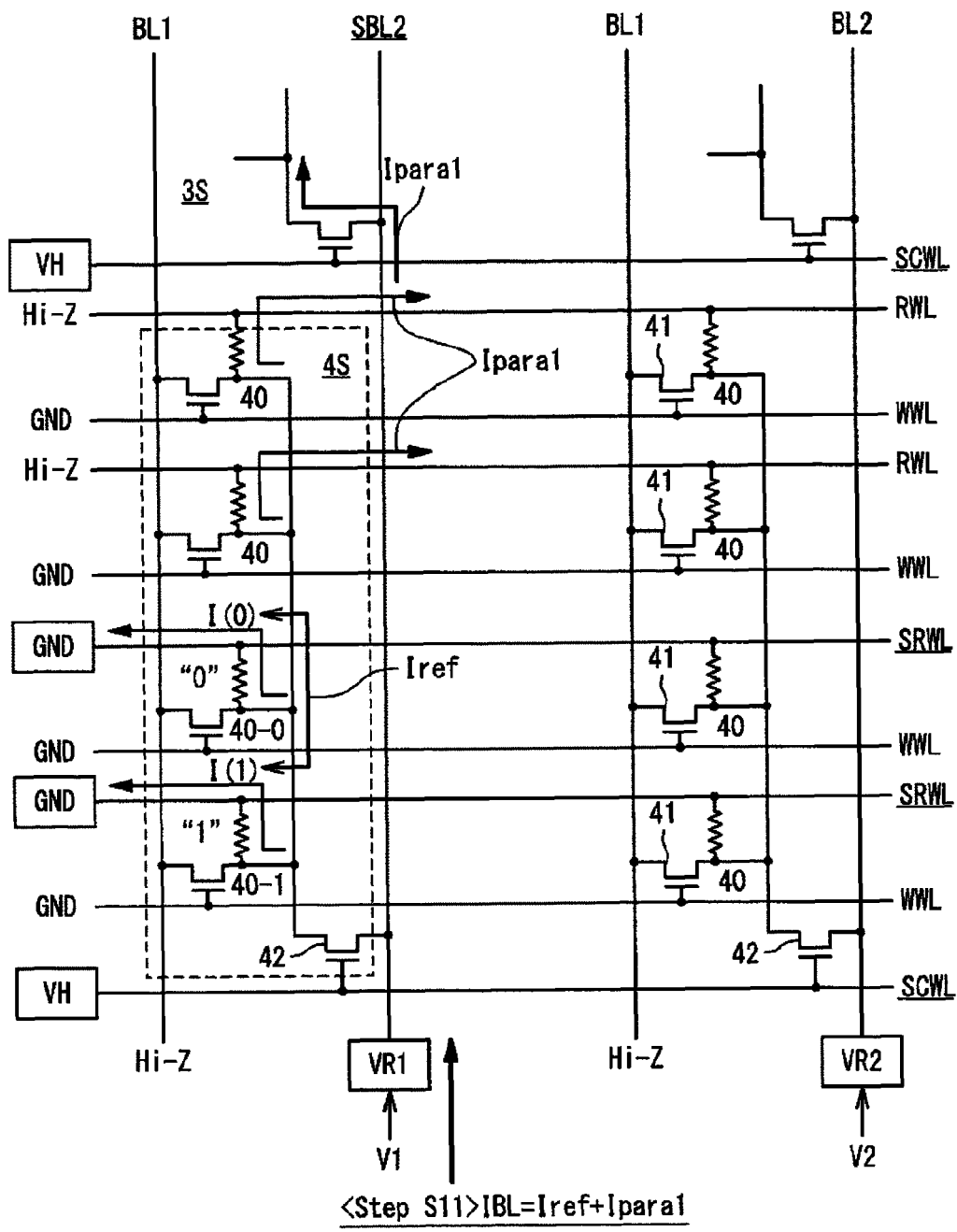
FIG. 19 is a circuit diagram for explaining a read operation in the second embodiment.

FIG. 19 is a diagram for explaining the Step S11 in the present embodiment. The X-selector 5 selects the common word line CWL connected to the selected reference block 9S and applies the selection voltage VH to the selected common word line SCWL. At the same time, the X-selector 5 selects the common word line CWL connected to the selected memory block 3S and applies the selection voltage VH to the selected common word line SCWL.

Moreover, the X-selector 5 applies the ground voltage (read word voltage) only to two reference cells 40 among the m reference cells 40 included in the selected reference block 4S. More specifically, the X-selector 5 selects only the read word lines RWL respectively connected to one reference cell 40-0 and one reference cell 40-1 and applies the ground voltage GND to the selected read word lines SRWL. The read word lines RWL other than the selected read word line SRWL are set to the floating state.

As a result, the reference current Iref and the first parallel current Ipara1 flow as shown in FIG. 19. The magnitude of the reference current Iref is the same as that in the first embodiment. What is different from the first embodiment is that a current contributing to the first parallel current Ipara1 flows not only in the selected memory block 3S but also in the selected reference block 4S. The first parallel current Ipara1 flowing into the selected memory block 3S is the same as in the first embodiment (refer to the Equation (4)). Therefore, the first parallel current Ipara1 as a whole becomes greater than that in the first embodiment.

In the Step S11, the bit line current IBL (first bit line current) flowing through the selected second bit line SBL2 is a sum of the reference current Iref and the first parallel current Ipara1 (IBL=Iref+Ipara1). The read circuit 10 generates the reference voltage Vref from the bit line current IBL. The Step S12 is the same as in the first embodiment, and the read circuit 10 generates the sense voltage Vs. In the Step S13, the sense voltage Vs is compared with the reference voltage Vref.

As described in the first embodiment, the absolute value of the parameter ΔIpara being small is desirable for improving the reliability of the read data SAOUT (refer to Equations (10-0) and (10-1)). The parameter ΔIpara is given by "Ipara2−Ipara1/2". According to the present embodiment, the first parallel current Ipara1 is larger than that in the first embodiment. That is, the effect of canceling the influence of the second parallel current Ipara2 becomes greater. As a result, the absolute value of the parameter ΔIpara becomes smaller as compared with the first embodiment.

The foregoing FIG. 11 also shows the voltage difference ΔV (read signal amount) in the second embodiment. As shown in FIG. 11, the voltage difference ΔV in the case of the worst condition (Ds, Dns)=(1, 0) is further increased as compared with the first embodiment. It can be understood that the reliability of the read data SAOUT is further improved.

According to the second embodiment of the present invention, the same effects as in the first embodiment can be obtained. Moreover, the reliability of the read data SAOUT at the time of data reading is further improved.

3. Third Embodiment

Next, a third embodiment of the present invention will be described below. In the third embodiment, the configuration of the read circuit 10 and the resistance value of the reference cell 40 are different from those in the first embodiment. The same reference numerals are given to the same components as those described in the first embodiment, and an overlapping description will be omitted as appropriate.

Figure 20:
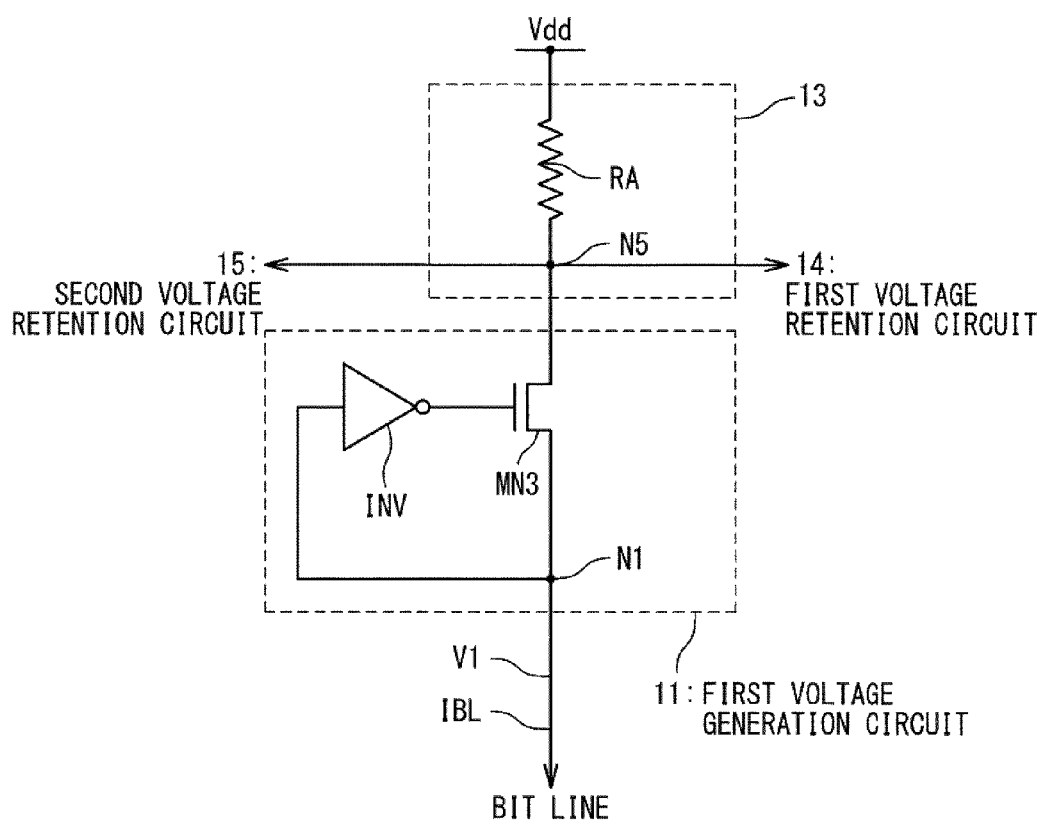
FIG. 20 is a circuit diagram showing a configuration of the read circuit in a third embodiment of the present invention.

FIG. 20 shows one example of the circuit configuration of the first voltage generation circuit 11 and the I-V conversion circuit 13 in the third embodiment. The circuit configuration shown in FIG. 20 has the NMOS transistor MN3, the load resistor RA and the inverter INV. As compared with the configuration shown in FIG. 6, the PMOS transistors MP1 to MP2, the NMOS transistors MN1, MN2 and MN4 and the load resistor RB are omitted. Therefore, the bit line current IBL is not divided and the current-voltage conversion coefficient of the I-V conversion circuit 13 is the same (G) regardless of mode.

Moreover, the resistance value of the magnetoresistance element 43 in the reference cell 40 is higher than the resistance value of the magnetoresistance element 33 in the memory cell 30, when compared under the same resistance state (stored data). For example, the resistance value of the magnetoresistance element 43 in the reference cell 40 is twice as high as the resistance value of the magnetoresistance element 33 in the memory cell 30, when the resistance state is the same. To that end, a contact area between the magnetization free layer and the non-magnetic layer of the magnetoresistance element 43 is designed to be half a contact area between the magnetization free layer 33 and the non-magnetic layer of the magnetoresistance element 33.

The data write operation in the third embodiment is the same as in the first embodiment, and its explanation is omitted. The data read operation includes the Steps S11 to S13 as in the case of the first embodiment. An overlapping description with the first embodiment will be omitted as appropriate.

The voltage states of each word line and each bit line in the Step S11 are the same as those in the first embodiment shown in FIG. 9. Therefore, the two kinds of currents: a reference current Iref' and the first parallel current Ipara1 flow through the selected second bit line SBL2 as in the case of the first embodiment. The first parallel current Ipara1 is the same as in the first embodiment (refer to the Equation (4)). Whereas, since the resistance value of the magnetoresistance element 43 in the reference cell 40 is designed to be twice, the reference current Iref' becomes half the reference current Iref in the first embodiment (refer to the Equation (3)). That is, the reference current Iref' in the present embodiment is given by the following Equation (11):

$$Iref'=(I(0)+I(1))/2 \quad (11)$$

In the Step S11, the bit line current IBL (first bit line current) flowing through the selected second bit line SBL2 is a sum of the reference current Iref' and the first parallel current Ipara1 (IBL=Iref'+Ipara1). The I-V conversion circuit 13 of the read circuit 10 converts the bit line current IBL to generate the reference voltage Vref'. It should be noted here that the current-voltage conversion coefficient in the present embodiment is "G" regardless of mode. Therefore, the reference voltage Vref' is expressed by the following Equation (12) instead of the foregoing Equation (5).

$$Vref' = Vdd - G \times (Iref' + Ipara1) \quad \text{Equation (12)}$$
$$= Vdd - G \times \{(I(0) + I(1))/2 + Ipara1\}$$

The Step S12 is the same as in the first embodiment, and the read circuit 10 generates the sense voltage Vs. In the Step S13, the read circuit 10 makes a comparison between the sense voltage Vs (refer to the Equations (8-0) and (8-1)) and the reference voltage Vref' (refer to the Equation (12)). The voltage difference $\Delta V(0)$ in the case where the data of the selected memory cell 30S is "0" is given by the following Equation (13-0) instead of the foregoing Equation (10-0). On the other hand, the voltage difference $\Delta V(1)$ in the case where the data of the selected memory cell 30S is "1" is given by the following Equation (13-1) instead of the foregoing Equation (10-1).

$$\Delta V(0) = G \times \{(I(0) - I(1))/2 + (Ipara2 - Ipara1)\} \quad \text{Equation (13-0)}$$
$$= G \times \{(I(0) - I(1))/2\} + G \times \Delta Ipara'$$

$$\Delta V(1) = G \times \{(I(0) - I(1))/2 - (Ipara2 - Ipara1)\} \quad \text{Equation (13-1)}$$
$$= G \times \{(I(0) - I(1))/2\} - G \times \Delta Ipara'$$

According to the present embodiment, the parameter $\Delta Ipara'$ indicating the influence of the parallel current is given by "Ipara2−Ipara1". Since the first parallel current Ipara1 is comparable to the second parallel current Ipara2, the parameter $\Delta Ipara'$ in the present embodiment is smaller than the parameter $\Delta Ipara$ (=Ipara2−Ipara1/2) in the first embodiment. That is, the effect of canceling the influence of the second parallel current Ipara2 becomes greater than in the first embodiment.

The foregoing FIG. 11 also shows the voltage difference $\Delta V$ (read signal amount) in the third embodiment. As shown in FIG. 11, the worst condition in the third embodiment is the pattern (Ds, Dns)=(0, 0) or (0, 1). The voltage difference $\Delta V$ under the worst condition is larger than the voltage difference $\Delta V$ under the worst condition ((Ds, Dns)=(1, 0)) in the first embodiment. In other words, the reliability of the read data SAOUT is further improved. In the third embodiment, substantially ideal voltage difference $\Delta V$ can be obtained with respect to any pattern (Ds, Dns).

According to the third embodiment of the present invention, the same effects as in the first embodiment can be obtained. Moreover, the reliability of the read data SAOUT at the time of data reading is further improved.

4. Fourth Embodiment

Figure 21:
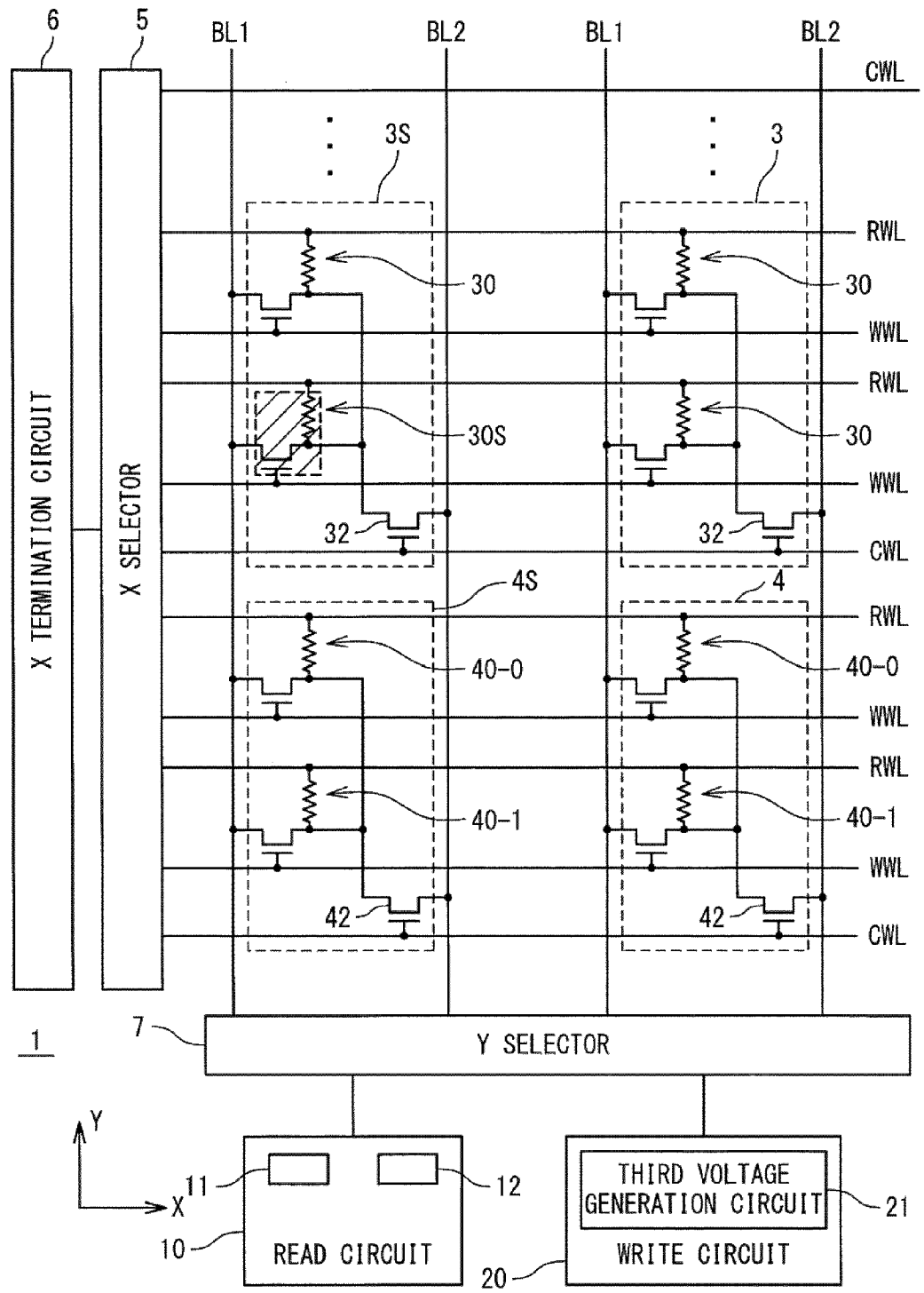
FIG. 21 is a circuit diagram showing a configuration of the MRAM in a fourth embodiment of the present invention.

FIG. 21 shows a configuration of the MRAM 1 in a fourth embodiment of the present invention. The same reference numerals are given to the same components as those described in the first embodiment, and an overlapping description will be omitted as appropriate. According to the fourth embodiment, the write circuit 20 further has a third voltage generation circuit 21. The third voltage generation circuit 21 has functions of generating a third write voltage VW3 and applying the third write voltage VW3 to the bit line.

The data read operation in the fourth embodiment is the same as in the first embodiment, and its explanation is omitted. The data write operation includes the Steps S21 to S23 as in the case of the first embodiment. An overlapping description with the first embodiment will be omitted as appropriate.

Figure 22:
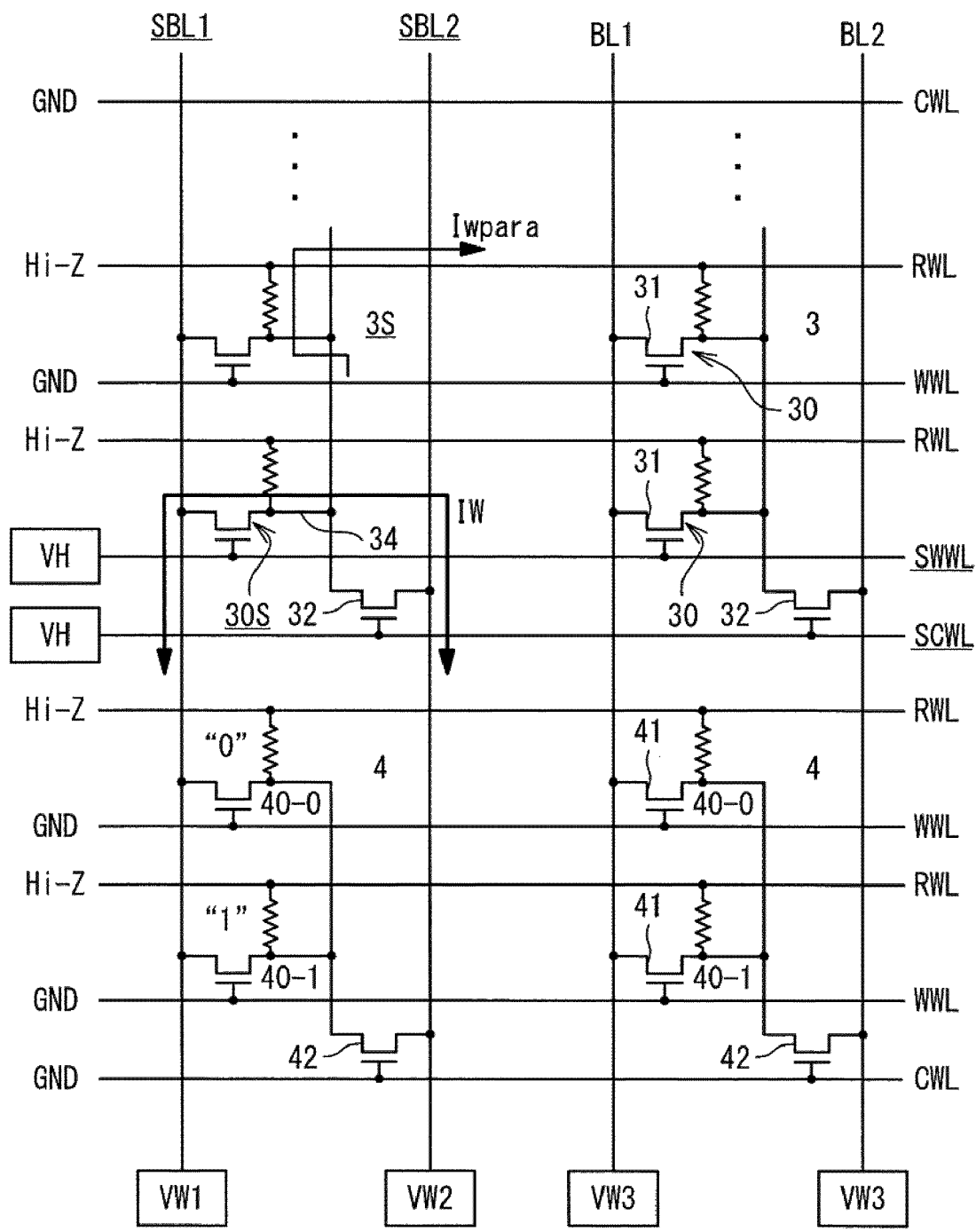
FIG. 22 is a circuit diagram showing a write operation in the fourth embodiment.

FIG. 22 is a diagram for explaining the Step S21 in the present embodiment. The Y-selector 7 connects between the write circuit 20 and the selected bit line pair (the selected first bit line SBL1 and the selected second bit line SBL2) connected to the selected memory block 3S. The write circuit 20 applies the first write voltage VW1 to the selected first bit line SBL1 and applies the second write voltage VW2 to the selected second bit line SBL2. As a result, the write current IW flows through the selected memory cell 30S.

At the same time, the Y-selector 7 connects between the write circuit 20 and the bit line pairs (non-selected bit line pairs BL1, BL2) other than the selected bit line pair. As shown in FIG. 22, the third voltage generation circuit 21 of the write circuit 20 applies the third write voltage VW3 to the non-selected bit line pair BL1 and BL2. Thereby, variation of the write current IW can be suppressed. The reason is explained below.

In the foregoing first embodiment, the non-selected memory blocks 3 arranged in the same row as the selected memory block 3S are charged through the magnetoresistance element 33 of the selected memory cell 30S, the read word line RWL and the magnetoresistance element 33 of the non-selected memory cell 30. Therefore, a long time is required for charging the non-selected memory blocks 3. During the non-selected memory blocks 3 are charged, a large parallel current Iwpara flows and thus the write current IW is decreased. Since the magnitude of the parallel current Iwpara during the charging varies depending on the charged state of the non-selected memory cells 30 at the beginning of the writing, the write current IW varies widely.

On the other hand, according to the present embodiment, the non-selected memory blocks 3 arranged in the same row as the selected memory block 3S are charged to the third write voltage VW3 mainly through the non-selected bit line pairs BL1 and BL2. Thus, the time required for charging the non-selected memory blocks 3 is shortened. In particular, when the third write voltage VW3 is set to a balanced voltage of the non-selected memory cells 30, the time required for charging the non-selected memory cells 30 becomes short and the parallel current Iwpara becomes small. Therefore, the variation of the write current IW is suppressed as compared with the first embodiment.

It is also possible to use the second voltage generation circuit 12 of the read circuit 10 instead of the third voltage generation circuit 21. In other words, the "second voltage, V2" generated by the second voltage generation circuit 12 may be used as the third write voltage VW3. At the time of write operation, the second voltage generation circuit 12 of the read circuit 10 applies the second voltage V2 to the non-selected bit line pairs. In this case, an area of the third voltage generation circuit 21 can be eliminated. Moreover, the voltage for charging the non-selected blocks becomes the same between in the write operation and in the read operation. Therefore, power consumption required for the charging when switching between the write operation and the read operation is reduced, and the time required for the charging is reduced.

According to the fourth embodiment of the present invention, the same effects as in the first embodiment can be obtained. Moreover, the variation of the write current IW at the time of data writing can be suppressed. It should be noted that the present embodiment can be combined with the foregoing second embodiment or third embodiment.

5. Fifth Embodiment 5-1. Circuit Configuration

Figure 23:
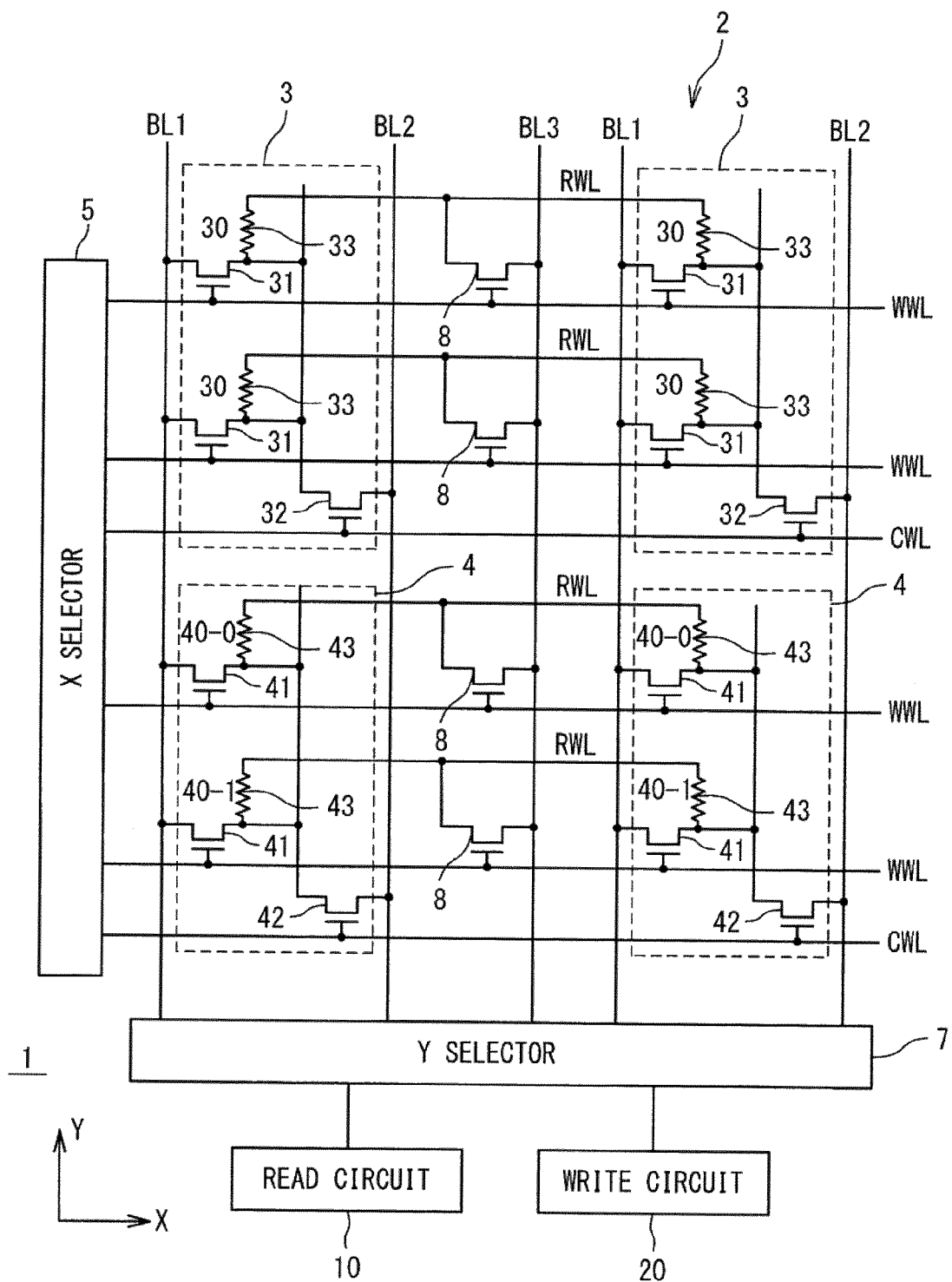
FIG. 23 is a circuit diagram showing a configuration of the MRAM in a fifth embodiment of the present invention.

FIG. 23 shows a configuration of the MRAM 1 in a fifth embodiment of the present invention. The same reference numerals are given to the same components as those described in the first embodiment, and an overlapping description will be omitted as appropriate.

As shown in FIG. 23, the MRAM 1 according to the present embodiment has a third bit line BL3 and a plurality of termination transistors 8 in addition to the configuration in the first embodiment. The third bit line BL3 is so provided as to extend in the Y-direction and is connected to the Y-selector 7. The plurality of termination transistors 8 are arranged in the Y-direction, and one termination transistor 8 is provided for each row. A gate of the termination transistor 8 is connected to the write word line WWL. One of source/drain of the termination transistor 8 is connected to the third bit line BL3, and the other thereof is connected to the read word line RWL. Note that the termination transistor 8 is provided in common between two blocks that are adjacent in the X-direction.

In the present embodiment, the read word line RWL is not connected to the X-selector 5. The X-selector 5 is connected to the common word lines CWL and the write word lines WWL. On the other hand, the Y-selector 7 is connected to the bit line pair BL1, BL2 and the third bit line BL3. The read word line RWL is connected to the Y-selector 7 through the termination transistor 8 and the third bit line BL3.

5-2. Read Operation

Next, the data read operation in the present embodiment will be described below. The data read operation includes the Steps S11 to S13 as in the case of the first embodiment. An overlapping description with the first embodiment will be omitted as appropriate. In the fifth embodiment, the voltage application state is different from that in the first embodiment.

(Step S11)

Figure 24:
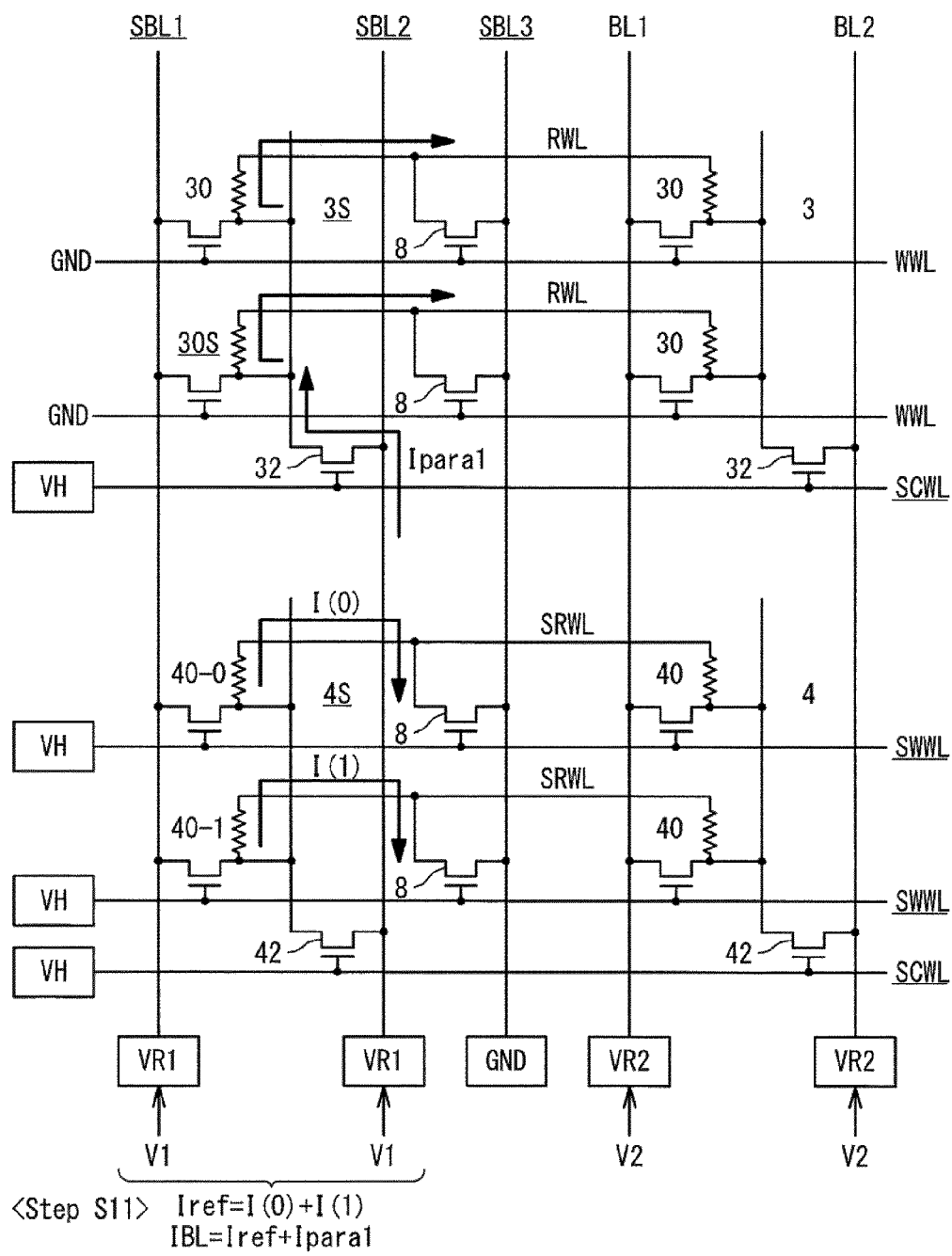
FIG. 24 is a circuit diagram for explaining a read operation in the fifth embodiment.

FIG. 24 is a diagram for explaining the Step S11 (first read mode) in the present embodiment. The X-selector 5 selects the common word line CWL connected to the selected reference block 4S and applies the selection voltage VH to the selected common word line SCWL. At the same time, the X-selector 5 selects the common word line CWL connected to the selected memory block 3S and applies the selection voltage VH to the selected common word line SCWL. The X-selector 5 applies the ground voltage GND to the common word lines CWL other than the selected common word line SCWL.

Moreover, the X-selector 5 selects the write word lines WWL respectively connected to the reference cell 90-0 and the reference cell 40-1 in the selected reference block 4S and applies the selection voltage VH to the selected write word lines SWWL. As a result, the cell transistors 41 of the reference cell 40-0 and the reference cell 40-1 are turned ON. Furthermore, the termination transistors 8 arranged in the same rows as the reference cell 40-0 and the reference cell 40-1 also are turned ON. The X-selector 5 applies the ground voltage GND to the write word lines WWL other than the selected write word lines SWWL. Therefore, the termination transistors 8 connected to the write word lines WWL other than the selected write word lines SWWL all are turned OFF.

The Y-selector 7 connects between the first voltage generation circuit 11 of the read circuit 10 and the selected bit line pair SBL1, SBL2 that are connected to the selected reference block 4S and the selected memory block 3S. The first voltage generation circuit 11 applies the above-mentioned first voltage V1 (see FIG. 6) as a "first read voltage VR1" to the selected bit line pair SBL1 and SBL2. Also, the Y-selector 7 connects between the second voltage generation circuit 12 of the read circuit 10 and the bit line pairs BL1, BL2 other than the selected bit line pair SBL1, SBL2. The second voltage generation circuit 12 applies the above-mentioned second voltage V2 as a "second read voltage VR2" to the bit line pairs BL1, BL2.

Moreover, the Y-selector 7 selects a desired third bit line BL3 as a selected third bit line SBL3 and connects the selected third bit line SBL3 to the read circuit 10. The read circuit 10 applies the ground voltage. GND (read bit voltage) to the selected third bit line SBL3. As a result, the ground voltage GND is applied to the selected read word lines SRWL respectively connected to the reference cell 40-0 and the reference cell 40-1. The first read voltage VR1 is different from the ground voltage GND of the selected read word line SRWL by a predetermined voltage difference. The other read word lines RWL are set to the floating state.

The Y-selector 7 sets the other first bit lines BL1, second bit lines BL2 and third bit lines BL3 to the floating state.

When the voltages are thus applied, the reference current Iref and the first parallel current Ipara1 flow as shown in FIG. 24. The magnitudes of the reference current Iref and the first parallel current Ipara1 are the same as in the first embodiment. The bit line current IBL (first bit line current) flowing through the selected bit line pair is a sum of the reference current Iref and the first parallel current Ipara1 (IBL=Iref+Ipara1). The read circuit 10 converts the bit line current IBL to generate the reference voltage Vref (refer to the Equation (5)).

(Step S12)

Figure 25:
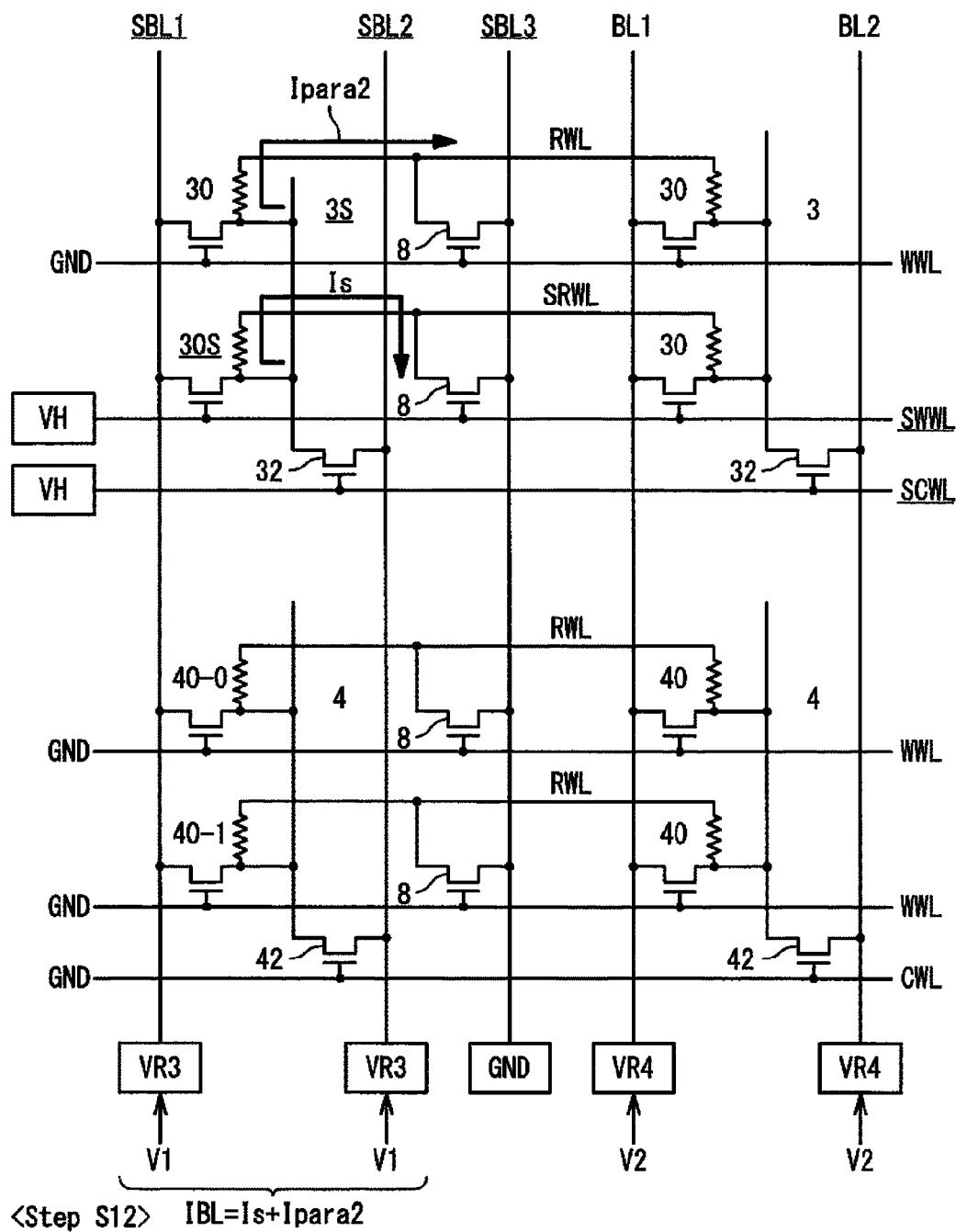
FIG. 25 is a circuit diagram for explaining a read operation in the fifth embodiment.

FIG. 25 is a diagram for explaining the Step S12 (second read mode) in the present embodiment. The X-selector 5 selects the common word line CWL connected to the selected memory block 3S and applies the selection voltage VH to the selected common word line SCWL. The X-selector 5 applies the ground voltage GND to the common word lines CWL other than the selected common word line SCWL.

Moreover, the X-selector 5 selects the write word line WWL connected to the selected memory cell 30S and applies the selection voltage VH to the selected write word line SWWL. As a result, the cell transistor 31 of the selected memory cell 30S is turned ON. Furthermore, the termination transistors 8 arranged in the same row as the selected memory cell 30S also are turned ON. The X-selector 5 applies the ground voltage GND to the write word lines WWL other than the selected write word line SWWL. Therefore, the termination transistors 8 connected to the write word lines WWL other than the selected write word line SWWL all are turned OFF.

The Y-selector 7 connects between the first voltage generation circuit 11 of the read circuit 10 and the selected bit line pair SBL1, SBL2 connected to the selected memory block 3S. The first voltage generation circuit 11 applies the above-mentioned first voltage V1 (see FIG. 6) as a "third read voltage VR3" to the selected bit line pair SBL1 and SBL2. Also, the Y-selector 7 connects between the second voltage generation circuit 12 of the read circuit 10 and the bit line pairs BL1, BL2 other than the selected bit line pair SBL1, SBL2. The second voltage generation circuit 12 applies the above-mentioned second voltage V2 as a "fourth read voltage VR4" to the bit line pairs BL1, BL2.

Moreover, the Y-selector 7 selects a desired third bit line BL3 as a selected third bit line SBL3 and connects the selected third bit line SBL3 to the read circuit 10. The read circuit 10 applies the ground voltage GND (read bit voltage) to the selected third bit line SBL3. As a result, the ground voltage GND is applied to the selected read word line SRWL connected to the selected memory cell 30S. The other read word lines RWL are set to the floating state.

The Y-selector 7 sets the other first bit lines BL1, second bit lines BL2 and third bit lines BL3 to the floating state.

When the voltages are thus applied, the sense current Is and the second parallel current Ipara2 flow as shown in FIG. 25. The magnitudes of the sense current Is and the second parallel current Ipara2 are the same as in the first embodiment. The bit line current IBL (second bit line current) flowing through the selected bit line pair is a sum of the sense current Is and the second parallel current Ipara2 (IBL=Is+Ipara2). The read circuit 10 converts the bit line current IBL to generate the sense voltage Vs (refer to the Equations (8), (8-0) and (8-1)).

(Step S13)

The Step S13 is the same as in the first embodiment. The read circuit 10 compares the sense voltage Vs with the reference voltage Vref to determine the data stored in the selected memory cell 30S. According to the present embodiment, the reliability of the read data SAOUT is improved as in the case of the first embodiment. Moreover, the reliability of the read data SAOUT can be further improved by combining with the second embodiment or the third embodiment.

In the present embodiment, the termination circuit (termination transistor 8) is arranged in the memory cell array 2. Thus, the read word line RWL serves as a local interconnection connected to only a predetermined number of blocks (3, 4). Therefore, the number of memory cells connected to the read word line RWL is limited.

In the Step S12, the fourth read voltage VR4 is applied to the non-selected bit line pairs (BL1, BL2) in order to reduce the influence of the parallel current. At this time, a current Ipara3 flows into the selected read word line SRWL through the non-selected memory cell 30 arranged in the same row as the selected memory cell 30S. In the fifth embodiment, since the number of memory cells connected to the read word line RWL, the above-mentioned current Ipara3 is suppressed as compared with the first embodiment. This lowers risk that a magnetic field generated by the current Ipara3 flowing through the read word line RWL destroys the memory data. In addition, the power consumption is reduced.

Furthermore, in the present embodiment, the termination transistor 8 is arranged at a center portion of the local read word line RWL. Thus, a half of the above-mentioned current Ipara3 flows through the read word line RWL on the left and right sides of the termination transistor 8. Therefore, the risk that the magnetic field generated by the current Ipara3 destroys the memory data is lowered as compared with a case where the termination transistor 8 is arranged at an end of the read interconnection RWL.

5-3. Write Operation

Next, the data write operation in the present embodiment will be described below. The data write operation includes the Steps S21 to S23 as in the case of the first embodiment. An overlapping description with the first embodiment will be omitted as appropriate. In the fifth embodiment, the voltage application state in the Step S21 is different from that in the first embodiment.

Figure 26:
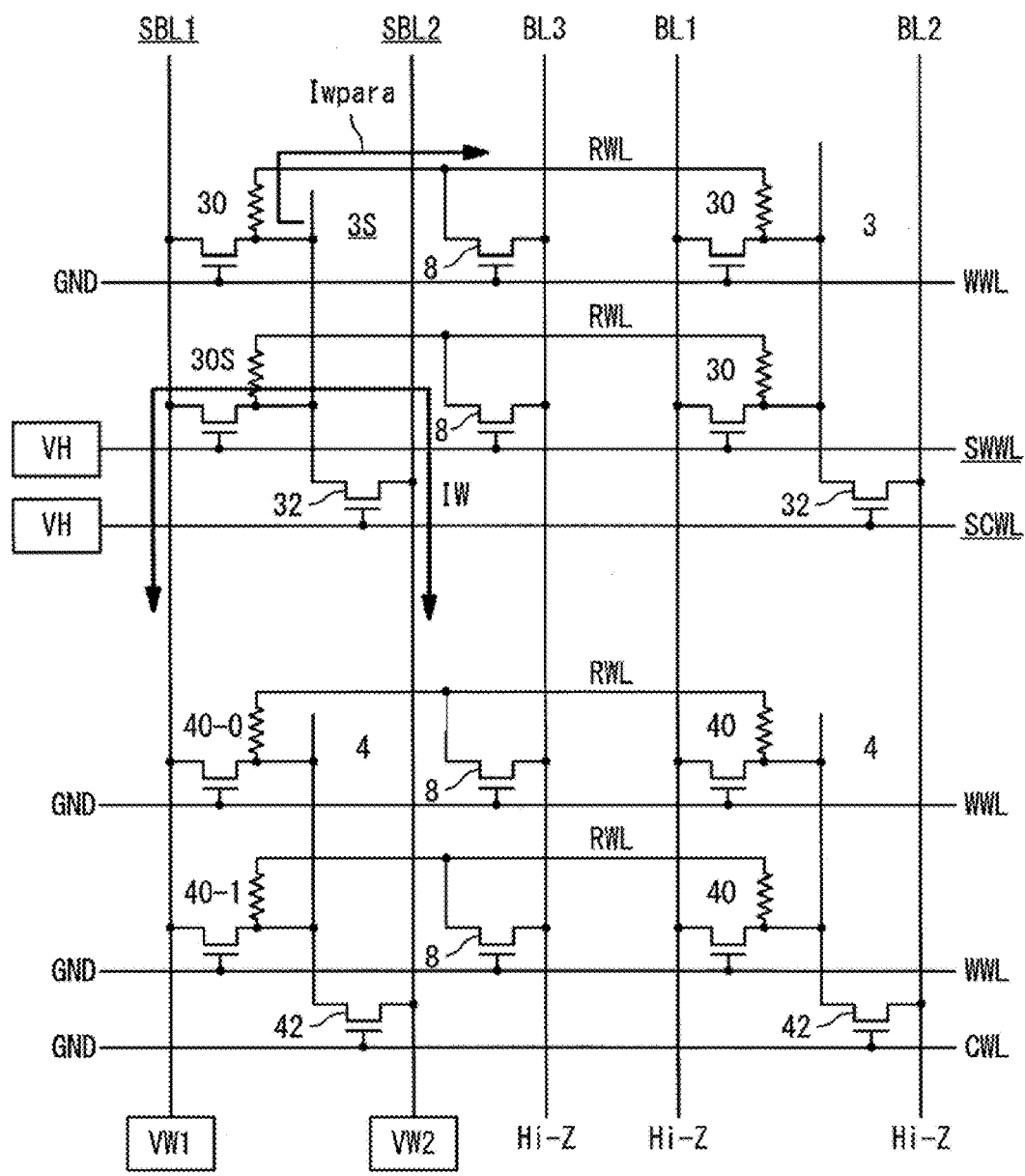
FIG. 26 is a circuit diagram for explaining a write operation in the fifth embodiment.

FIG. 26 is a diagram for explaining the Step S21 in the present embodiment. The X-selector 5 selects the common word line CWL connected to the selected memory block 3S including the selected memory cell 30S and applies the selection voltage VH to the selected common word line SCWL. Also, the X-selector 5 selects the write word line WWL connected to the selected memory cell 30S and applies the selection voltage VH to the selected write word line SWWL. Thus, the cell transistors 31 and the termination transistors 8 connected to the selected write word line SWWL are turned ON. The X-selector 5 applies the ground voltage GND to the common word lines CWL other than the selected common word line SCWL and the write word lines WWL other than the selected write word line SWWL.

The Y-selector 7 connects between the write circuit 20 between the selected bit line pair SBL1, SBL2 connected to the selected memory block 3S. The write circuit 20 applies the first write voltage VW1 to the selected first bit line SBL1 and applies the second write voltage VW2 to the selected second bit line SBL2. Moreover, the Y-selector 7 sets the bit line pairs other than the selected bit line pair SBL1, SBL2 to the floating state. Also, the Y-selector 7 sets the third bit line BL3 to the floating state.

As a result, as shown in FIG. 26, the write current IW flows through the selected memory cell 30S. The selectivity of the memory cell at the time of data writing is improved as in the case of the first embodiment.

The Step S22 and the Step S23 are the same as in the first embodiment. It is thus possible to prevent the data destruction of the non-selected memory cells at the time of data writing.

As described above, the selectivity of the selected memory cell is improved and the write margin is enlarged even by the present embodiment. Moreover, the data destruction of the non-selected memory cells can be prevented. It is also possible to apply the foregoing fourth embodiment to the present embodiment. In this case, the variation of the write current IW can be suppressed.

5-4. Layout

Figure 27:
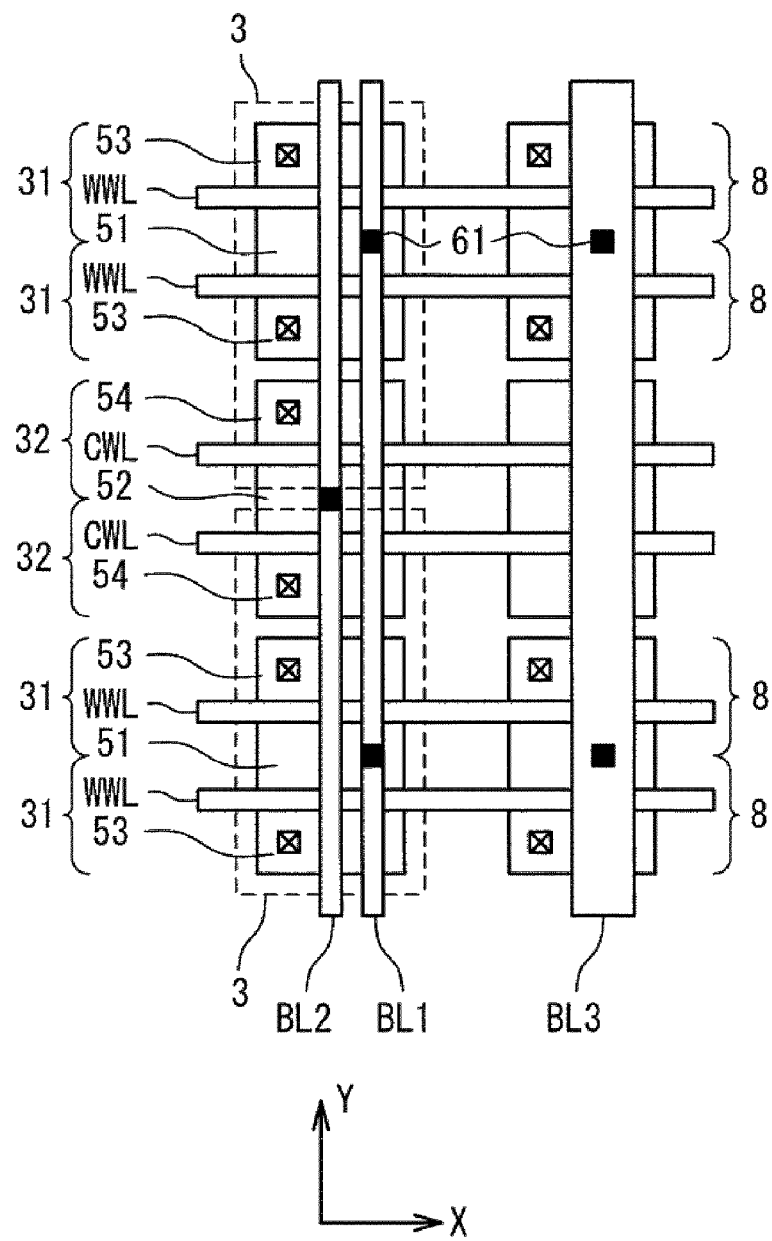
FIG. 27 is a plan view showing a structure of the MRAM in the fifth embodiment.

FIG. 27 shows one example of a plan structure in the layer LA of the MRAM 1 according to the present embodiment. The gate of the termination transistor 8 is the write word line WWL which is the same as the gate of the cell transistor 31. Thus, a circuit area is reduced. The diffusion region 51 of the termination transistor 8 is connected to the third bit line BL3 through the first contact 61. The third bit line BL3 is formed along the Y-direction. The diffusion region 53 of the termination transistor 8 is connected to the read word line RWL through a contact.

6. Sixth Embodiment

Figure 28:
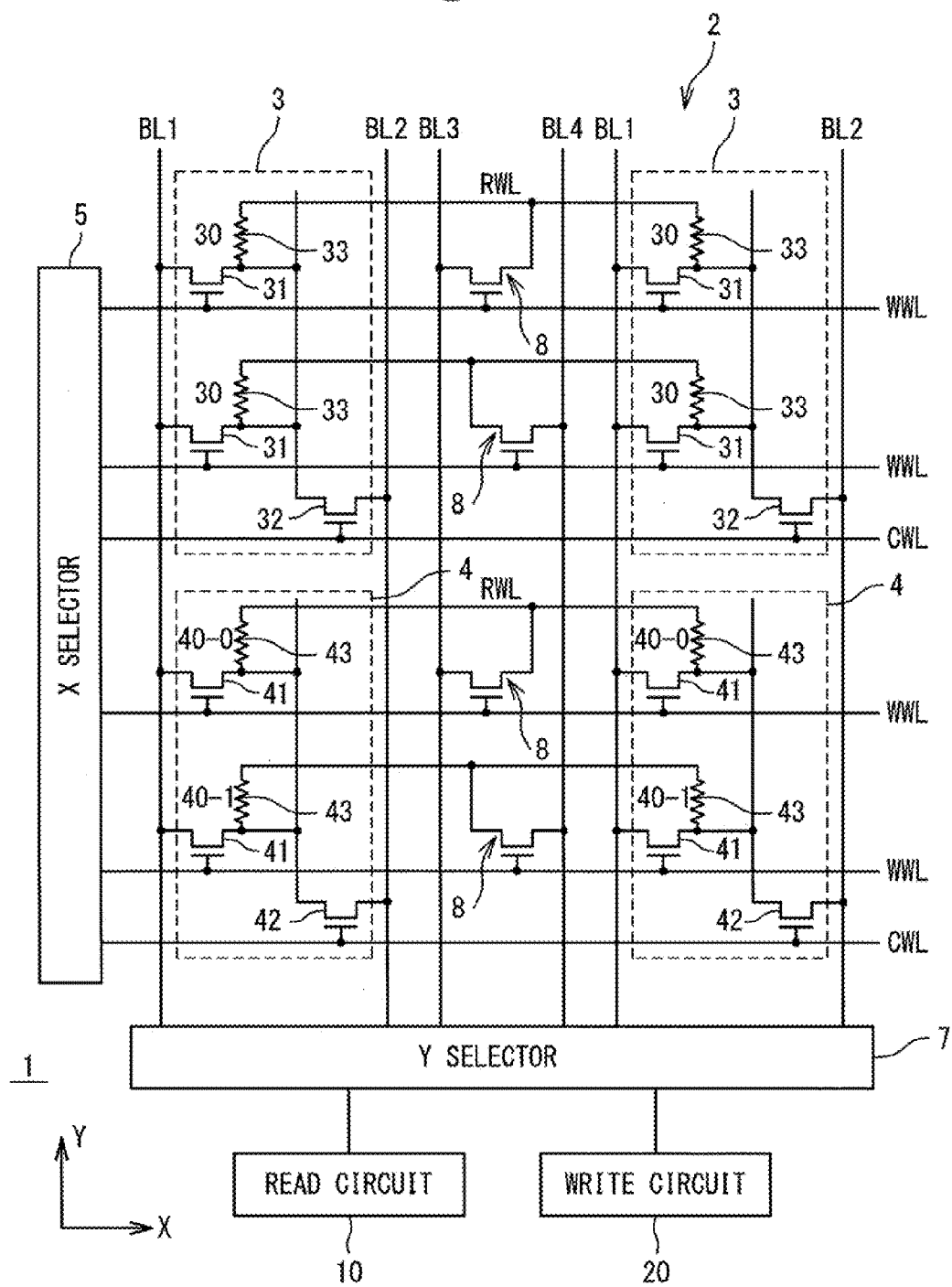
FIG. 28 is a circuit diagram showing a configuration of the MRAM in a sixth embodiment of the present invention.

FIG. 28 shows a configuration of the MRAM 1 in a sixth embodiment of the present invention. The same reference numerals are given to the same components as those described in the fifth embodiment, and an overlapping description will be omitted as appropriate.

As shown in FIG. 23, the MRAM 1 according to the present embodiment further has a fourth bit line BL4 in addition to the configuration of the fifth embodiment. The fourth bit line BL4 is so provided as to extend in the Y-direction and is connected to the Y-selector 7. The gate of the termination transistor 8 is connected to the write word line WWL. One of source/drain of the termination transistor 8 is connected to the read word line, and the other (hereinafter referred to as a "bit terminal") is connected to either the third bit line BL3 or the fourth bit line BL4.

A voltage of the bit terminal of the termination transistor 8 is raised from the ground voltage GND by a product of the bit line current IBL and an interconnection resistance. In the first embodiment, the magnitude of the bit line current IBL in the Step S11 is about twice that of the bit line current IBL in the Step S12. Therefore, in order to reduce a difference in the voltage of the bit terminal between the Step S11 and the Step S12, the interconnection resistance in the Step S11 is designed to be half the interconnection resistance in the Step S12.

For that purpose, both of the third bit line BL3 and the fourth bit line BL4 are used. The bit line current IBL is distributed to the third bit line BL3 and the fourth bit line BL4 through the termination transistors 8. Therefore, the difference in the voltage of the bit terminal between the Step S11 and the Step S12 is reduced. Consequently, a difference in the voltage applied to the magnetoresistance element between the Step S11 and the Step S12 is reduced and thus the reliability of the data reading is improved.

Alternatively, it is also possible in the foregoing fifth embodiment that both of the selected first bit line SBL1 and the selected second bit line SBL2 are selected in the Step S11 while only the selected first bit line BL1 is selected in the Step S12. In this case also, the same effect can be expected.

7. Seventh Embodiment

In the above embodiments, the reference block 4 used for generating the reference current Iref is provided. However, a means for generating the reference current Iref is not limited to the reference block 4. In a seventh embodiment of the present invention, a means for generating the reference current Iref is incorporated into the memory block. An overlapping description with the above-described embodiments will be omitted as appropriate.

7-1. Circuit Configuration

Figure 29:
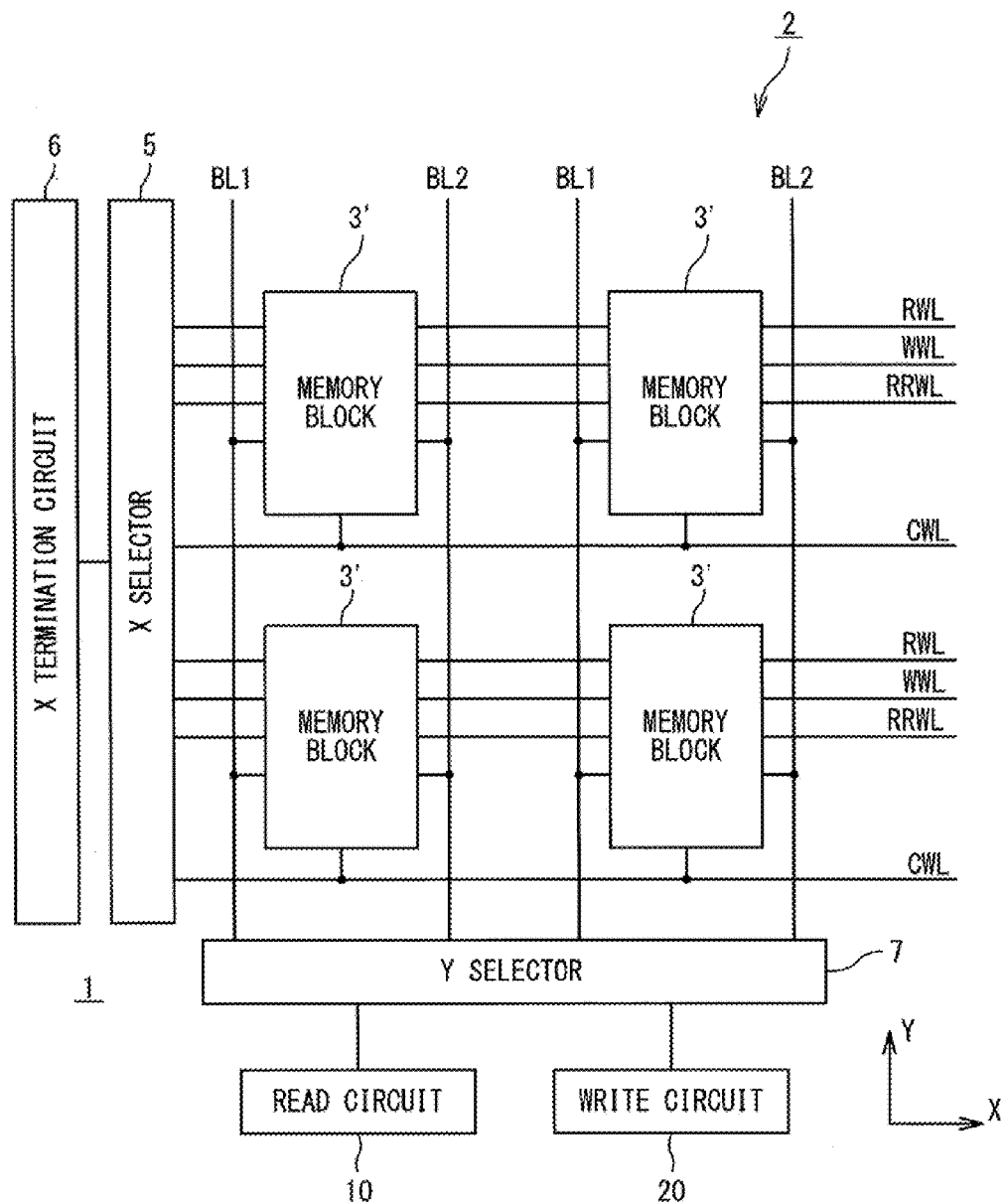
FIG. 29 is a block diagram schematically showing a configuration of the MRAM in a seventh embodiment of the present invention.

FIG. 29 is a block diagram schematically shows a configuration of the MRAM 1 in the seventh embodiment. According to the seventh embodiment, the above-described reference blocks 4 are not provided. Meanwhile, a memory block 3' is provided instead of the above-described memory block 3. That is to say, the memory cell array 2 is sectioned into a plurality of memory blocks 3'. The plurality of memory blocks 3' are arranged in a matrix form.

Figure 30:
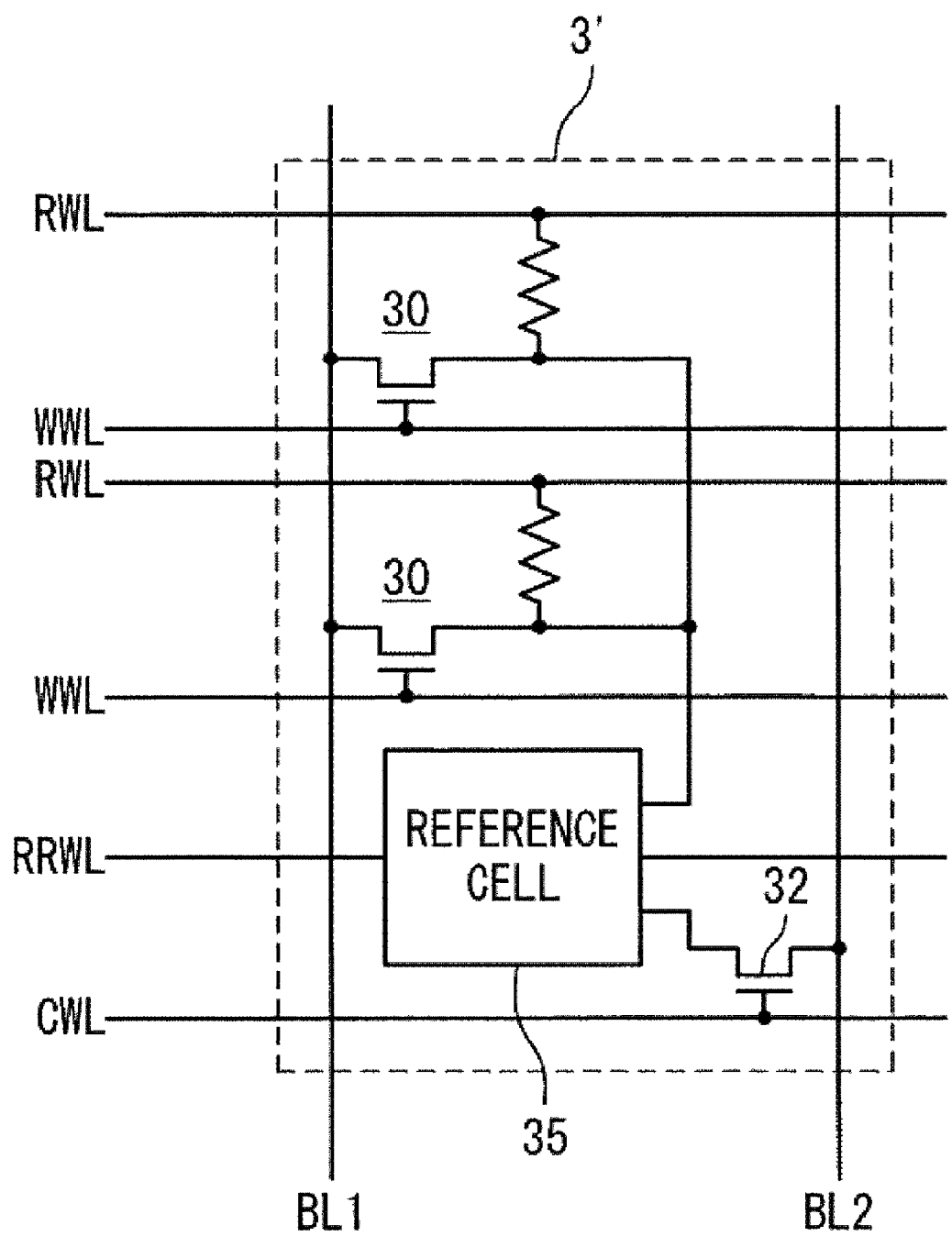
FIG. 30 is a circuit block diagram schematically showing a configuration of one memory block in the seventh embodiment.

FIG. 30 schematically shows a configuration of one memory block 3' in the present embodiment. A reference cell 35 is added to the memory block 3', as compared with the memory block 3 shown in the foregoing FIG. 3. The reference cell 35 is a cell used for generating the reference current Iref and is different from the memory cell 30. Similarly of the memory cell 30, the reference cell 35 is connected to the second bit line BL2 through the block transistor 32. In other words, the block transistor 32 is provided in common for the plurality of memory cells 30 and the reference cell 35. The reference cell 35 is connected to a reference read word line RRWL. The reference read word line. RRWL is connected to the X-selector 5. The other configuration is the same as that in the first embodiment.

Figure 31:
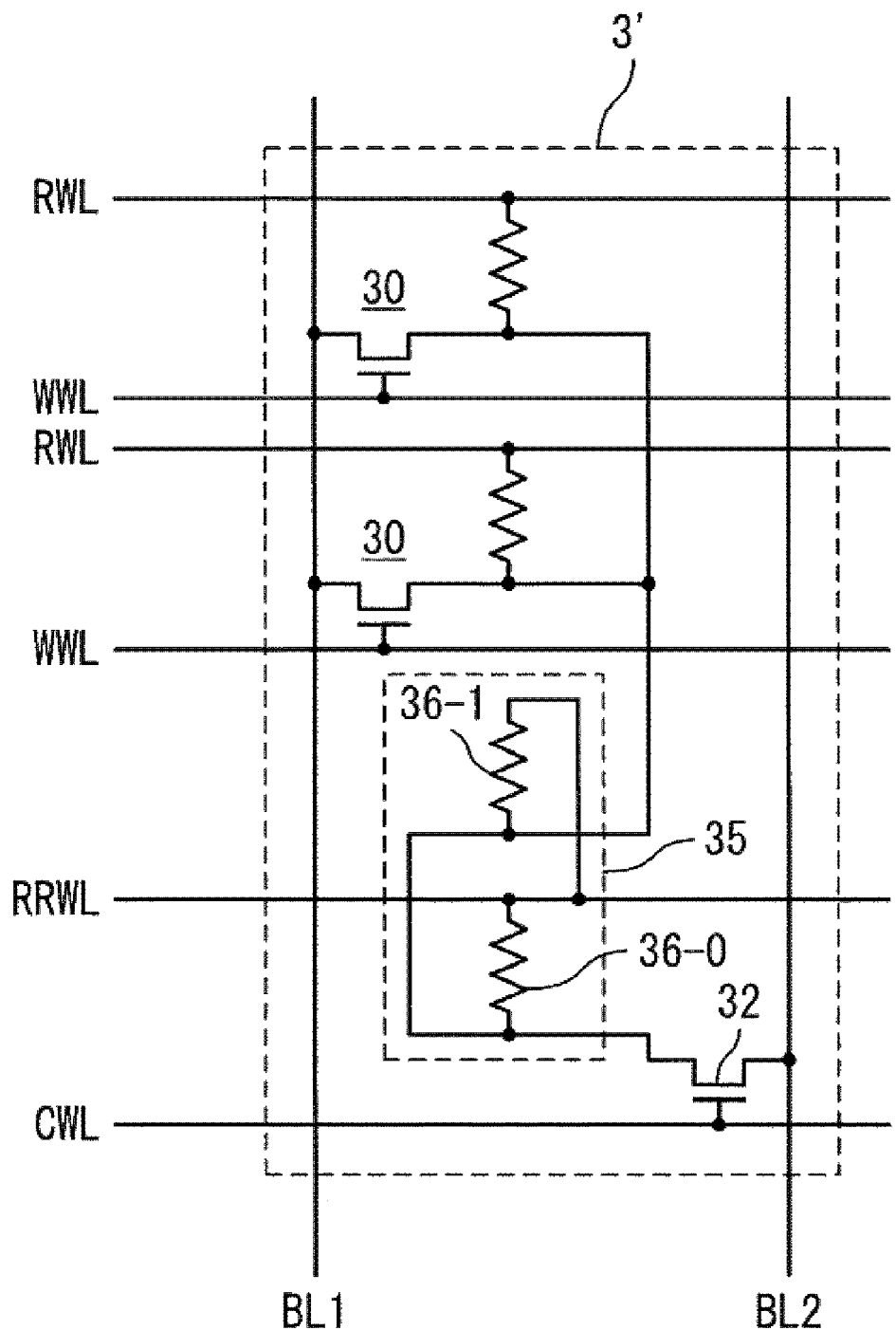
FIG. 31 is a circuit diagram showing a circuit configuration example of one memory block in the seventh embodiment.

FIG. 31 shows one example of a circuit configuration of one memory block 3'. As shown in FIG. 31, the reference cell 35 includes two reference magnetoresistance elements 36-0 and 36-1, for example. The reference magnetoresistance elements 36-0 and 36-1 are provided in parallel between the block transistor 32 and the reference read word line RRWL. More specifically, one end of the reference magnetoresistance element 36-0 is connected to the reference read word line RRWL and the other end thereof is connected to the second bit, line BL2 through the block transistor 32. Similarly, one end of the reference magnetoresistance element 36-1 is connected to the reference read word line RRWL and the other end thereof is connected to the second bit line BL2 through the block transistor 32.

Moreover, complementary data are respectively stored in the reference magnetoresistance elements 36-0 and 36-1. That is, the data "0" is stored in one of the reference magnetoresistance elements 36-0 and 36-1, and the data "1" is stored in the other. As mentioned above, the reference magnetoresistance elements 36-0 and 36-1 are provided in parallel between the block transistor 32 and the reference read word line RRWL. In the read operation, a parallel resistance value of the reference magnetoresistance elements 36-0 and 36-1 is used.

It should be noted in FIG. 31 that an interconnection from the block transistor 32 to the reference magnetoresistance elements 36-0 and 36-1 is the same as an interconnection from the block transistor 32 to the memory cell 30. Therefore, at the time of the write operation, the memory data of the reference magnetoresistance elements 36-0 and 36-1 included in the same memory block 3' as the selected memory cell 30S is may be changed by a magnetic field generated by the write current IW flowing vicinally. Thus, as shown in FIG. 31, the interconnection structure is formed such that directions of the write current IW near the respective reference magnetoresistance elements 36-0 and 36-1 are opposite to each other. As a result, if the memory data stored in one of the reference magnetoresistance elements 36-0 and 36-1 is inverted at the time of the write operation, the memory data stored in the other is also inverted. That is, a condition that the complementary data are respectively stored in the reference magnetoresistance elements 36-0 and 36-1 is always maintained. The memory data of the magnetoresistance elements 36-0 and 36-1 are not necessarily fixed, as long as the complementary data are stored.

7-2. Read Operation

Next, the data read operation in the present embodiment will be described below. The data read operation includes the Steps S11 to S13 as in the case of the first embodiment (refer to FIG. 8). An overlapping description with the first embodiment will be omitted as appropriate.

(Step S11)

Figure 32:
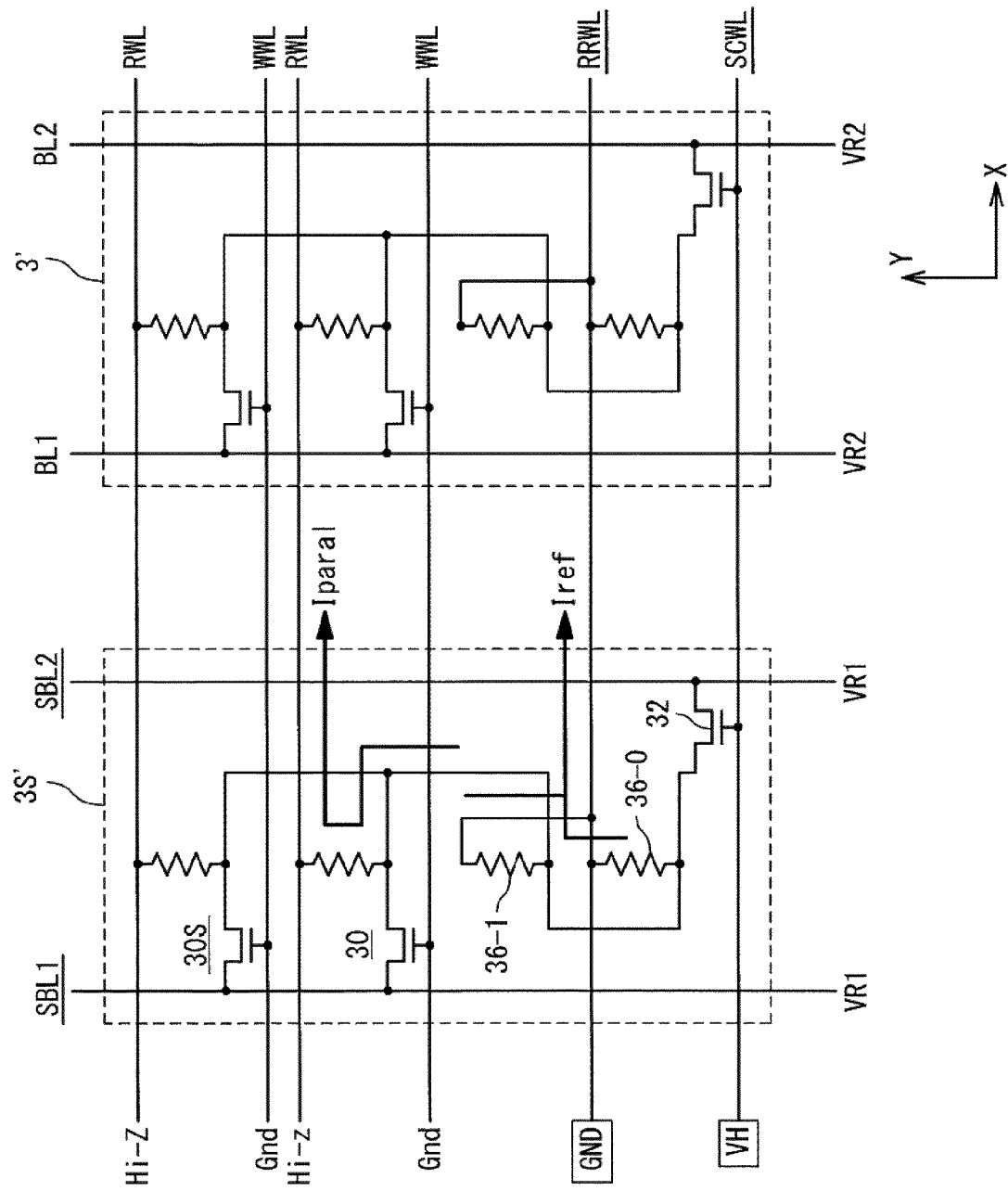
FIG. 32 is a circuit diagram for explaining a read operation in the seventh embodiment.

FIG. 32 is a diagram for explaining the Step S11 in the present embodiment. The selected memory cell 30S as a read target is included in the selected memory block 3S'. In the Step S11 (first read mode), the reference cell 35 included in the selected memory block 3S' is used to generate the reference voltage Vref.

The X-selector 5 selects the common word line CWL connected to the selected memory block 3S' and applies the selection voltage VH to the selected common word line SCWL. As a result, the block transistor 32 connected to the selected common word line SCWL is turned ON. Meanwhile, the X-selector 5 applies the ground voltage GND to the other common word lines CWL and the write word lines WWL. As a result, all the cell transistors 31 are turned OFF.

Moreover, the X-selector 5 selects the reference read word line RRWL connected to the selected memory block 3S' and applies the ground voltage GND (read word voltage) to the reference read word line RRWL. Meanwhile, the X-selector 5 sets the other reference read word lines RRWL and the read word lines RWL to the floating (Hi-impedance) state.

The Y-selector 7 connects between the first voltage generation circuit 11 of the read circuit 10 and the selected bit line pair SBL1, SBL2 connected to the selected memory block 3S'. The first voltage generation circuit 11 applies the above-mentioned first voltage V1 as a first read voltage VR1 to the selected bit line pair SBL1 and SBL2. Moreover, the Y-selector 7 connects between the second voltage generation circuit 12 of the read circuit 10 and at least one bit line pair BL1, BL2 different from the selected bit line pair SBL1, SBL2. The second voltage generation circuit 12 applies the above-mentioned second voltage V2 as a second read voltage VR2 to the bit line pair BL1, BL2. The first read voltage VR1 and the second read voltage VR2 are substantially equal to each other.

When the voltages are thus applied, two kinds of currents flow as shown in FIG. 32. One is a reference current Iref that flows through the reference cell 35 (reference magnetoresistance elements 36-0 and 36-1), and the other is the first parallel current Ipara1. The reference current Iref is a sum of currents respectively flowing through the reference magnetoresistance elements 36-0 and 36-1 in which the complementary data are stored, which is given by the same Equation (3) as in the case of the first embodiment. Also, the first parallel current Ipara1 is given by the same Equation (4) as in the case of the first embodiment. The read circuit 10 generates the reference voltage Vref based on the bit line current IBL (=Iref+Ipara1). The reference voltage Vref also is given by the same Equation (5) as in the case of the first embodiment.

(Step S12)

Figure 33:
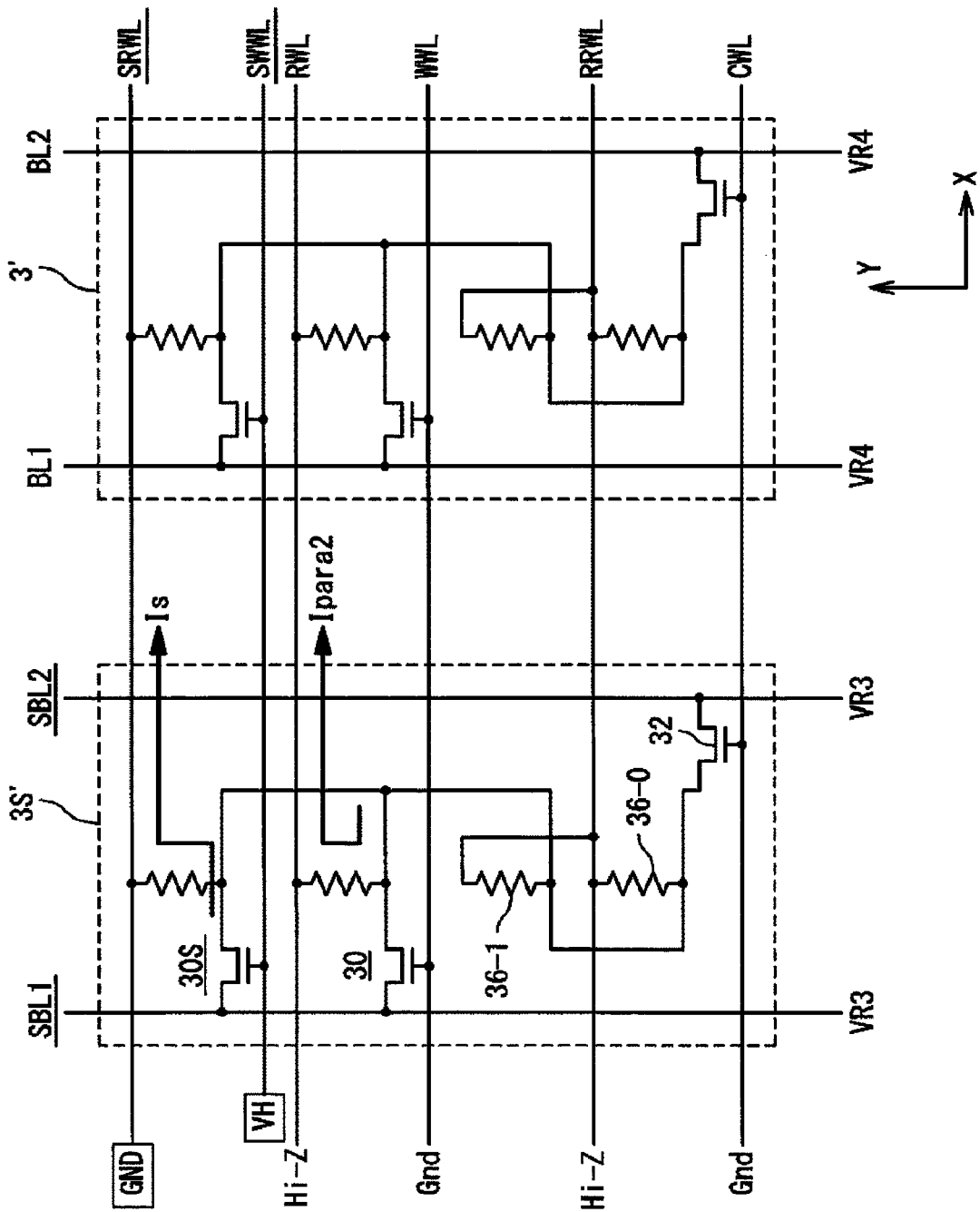
FIG. 33 is a circuit diagram for explaining a read operation in the seventh embodiment.

FIG. 33 is a diagram for explaining the Step S12 in the present embodiment. In the Step S12 (second read mode), the sense voltage Vs depending on the data of the selected memory cell 30S is generated.

The X-selector 5 selects the read word line RWL connected to the selected memory cell 30S and applies the ground voltage GND (read word voltage) to the selected read word line SRWL. Meanwhile, the X-selector 5 sets the other read word lines RWL and the reference read word lines RRWL to the floating state.

Also, the X-selector 5 selects the write word line WWL connected to the selected memory cell 30S and applies the selection voltage VH to the selected write word line SWWL. As a result, the cell transistor 31 connected to the selected memory cell 30S is turned ON. Meanwhile, the X-selector 5 applies the ground voltage GND to the other write word lines WWL and the common word lines CWL.

The Y-selector 7 connects between the first voltage generation circuit 11 of the read circuit 10 and the selected bit line pair SBL1, SBL2 connected to the selected memory block 3S'. The first voltage generation circuit 11 applies the above-mentioned first voltage V1 as a third read voltage VR3 to the selected bit line pair SBL1 and SBL2. Moreover, the Y-selector 7 connects between the second voltage generation circuit 12 of the read circuit 10 and at least one bit line pair BL1, BL2 different from the selected bit line pair SBL1, SBL2. The second voltage generation circuit 12 applies the above-mentioned second voltage V2 as a fourth read voltage VR4 to the bit line pair BL1, BL2. The third read voltage VR3 and the fourth read voltage VR4 are substantially equal to each other.

When the voltages are thus applied, two kinds of currents flow as shown in FIG. 33. One is the sense current Is that flows through the selected memory cell 30S, and the other is the second parallel current Ipara2. The sense current Is is given by the same Equation (6) as in the case of the first embodiment. Also, the second parallel current Ipara2 is given by the same Equation (7) as in the case of the first embodiment. The read circuit 10 generates the sense voltage Vs based on the bit line current IBL (=Is+Ipara2). The sense voltage Vs also is given by the same Equation (8) as in the case of the first embodiment.

(Step S13)

The read circuit 10 compares the sense voltage Vs with the reference voltage Vref to determine the data stored in the selected memory cell 30S, as in the case of the first embodiment. The read circuit 10 outputs the read data SAOUT depending on the determined data.

According to the present embodiment, the reliability of the read data SAOUT can be further improved as compared with the first embodiment. In the case of the first embodiment, when the first read voltage VR1 is given in the Step S11 (refer to FIG. 9), the voltage applied to the magnetoresistance element 33 in the selected memory block 3S and the voltage applied to the magnetoresistance element 43 in the selected reference block 4S are not necessarily the same. If those two voltages are not controlled sufficiently, the reliability of the read data SAOUT is decreased. One reason why the two voltages become different from each other is variation of voltage drop due to interconnection resistance, the cell transistors (31, 41) and the block transistors (32, 42) (refer to FIG. 9). According to the present embodiment, since the reference cell 35 is provided within the memory block 3S, the voltages respectively applied to the magnetoresistance element 33 and the reference magnetoresistance element 36 in the selected memory block 3S' are almost equal to each other. That is, influence of the voltage drop is reduced as much as possible. Therefore, the reliability of the read data SAOUT is further improved.

In the present embodiment, a cell area is slightly increased due to the addition of the reference cell 35. However, the magnetoresistance element and the transistor are separated in the vertical direction, and in many cases, an area of N+1 transistors and an area of N+2 magnetoresistance element sections can be designed to be comparable. Here, N is the number of data which can be stored in the memory block 3'. Therefore, the increase in area due to the addition of the reference cell 35 can be suppressed.

7-3. Write Operation

The data write operation in the present embodiment is similar to that in the first embodiment. At the time of the write operation, the reference read word line RRWL connected to the reference cell 35 is set to the floating state. As described above, the condition that the complementary data are respectively stored in the reference magnetoresistance elements 36-0 and 36-1 is maintained when the write current IW flows. The reason is that the interconnection structure is formed such that directions of the write current IW near the respective reference magnetoresistance elements 36-0 and 36-1 are opposite to each other.

7-4. Modification Example (1)

Figure 34:
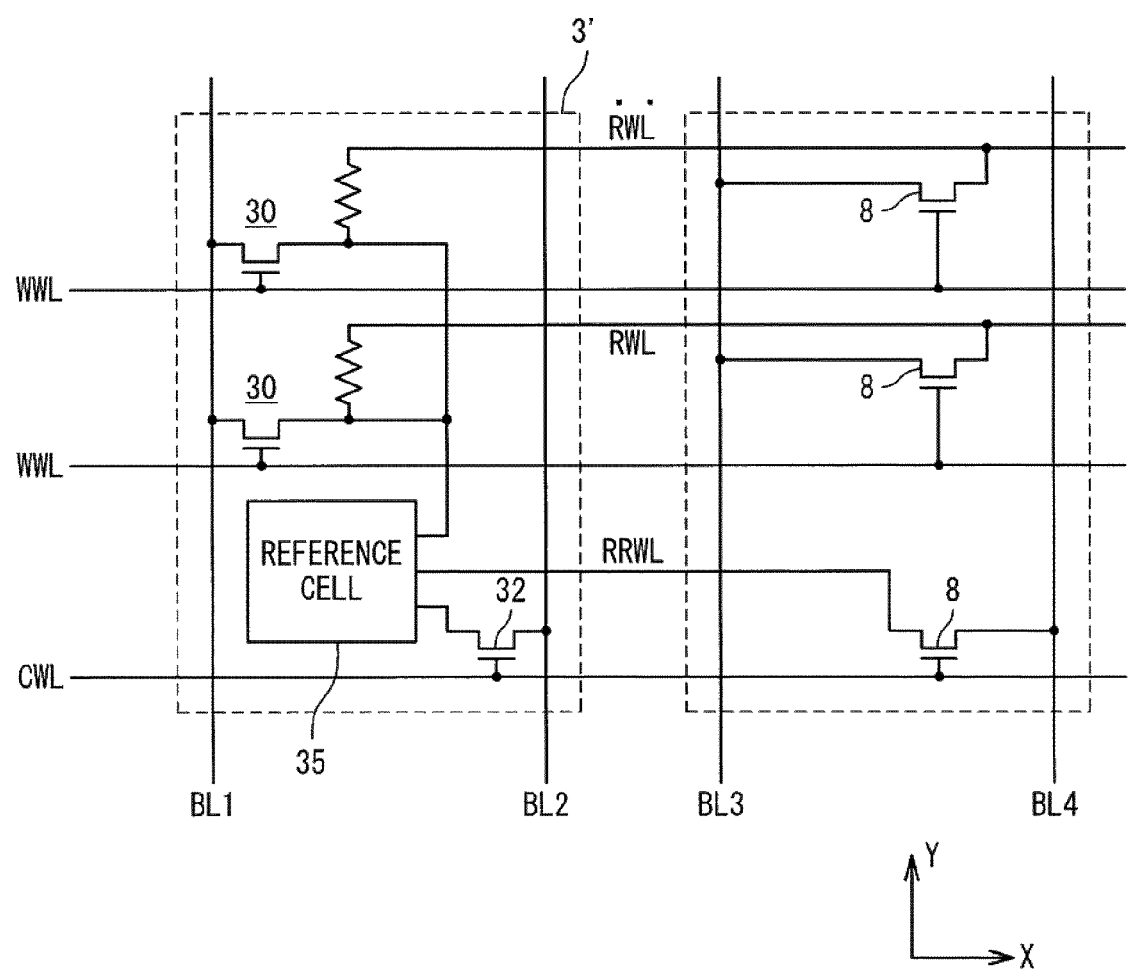
FIG. 34 is a circuit block diagram schematically showing a configuration of the MRAM in a modification example of the seventh embodiment.

FIG. 34 shows a modification example of the seventh embodiment. The MRAM 1 according to the present embodiment can further has the termination transistor 8, as in the cases of the foregoing fifth and sixth embodiments. An overlapping description will be omitted as appropriate.

For example, as shown in FIG. 34, the MRAM 1 in the present modification example further has a plurality of termination transistors 8, a third bit line BL3 and a fourth bit line BL4. Regarding the termination transistor 8 connected to the memory cell 30, its gate is connected to the write word line WWL, one of source/drain is connected to the third bit line BL3 and the other thereof is connected to the read word line RWL. Meanwhile, regarding the termination transistor 8 connected to the reference cell 35, its gate is connected to the common word line CWL, one of source/drain is connected to the fourth bit line BL4 and the other thereof is connected to the reference read word line RRWL. The fourth bit line BL4 and the third bit line BL3 may be the same. The same effects can be obtained even by this configuration.

7-5. Modification Example (2)

Figure 35:
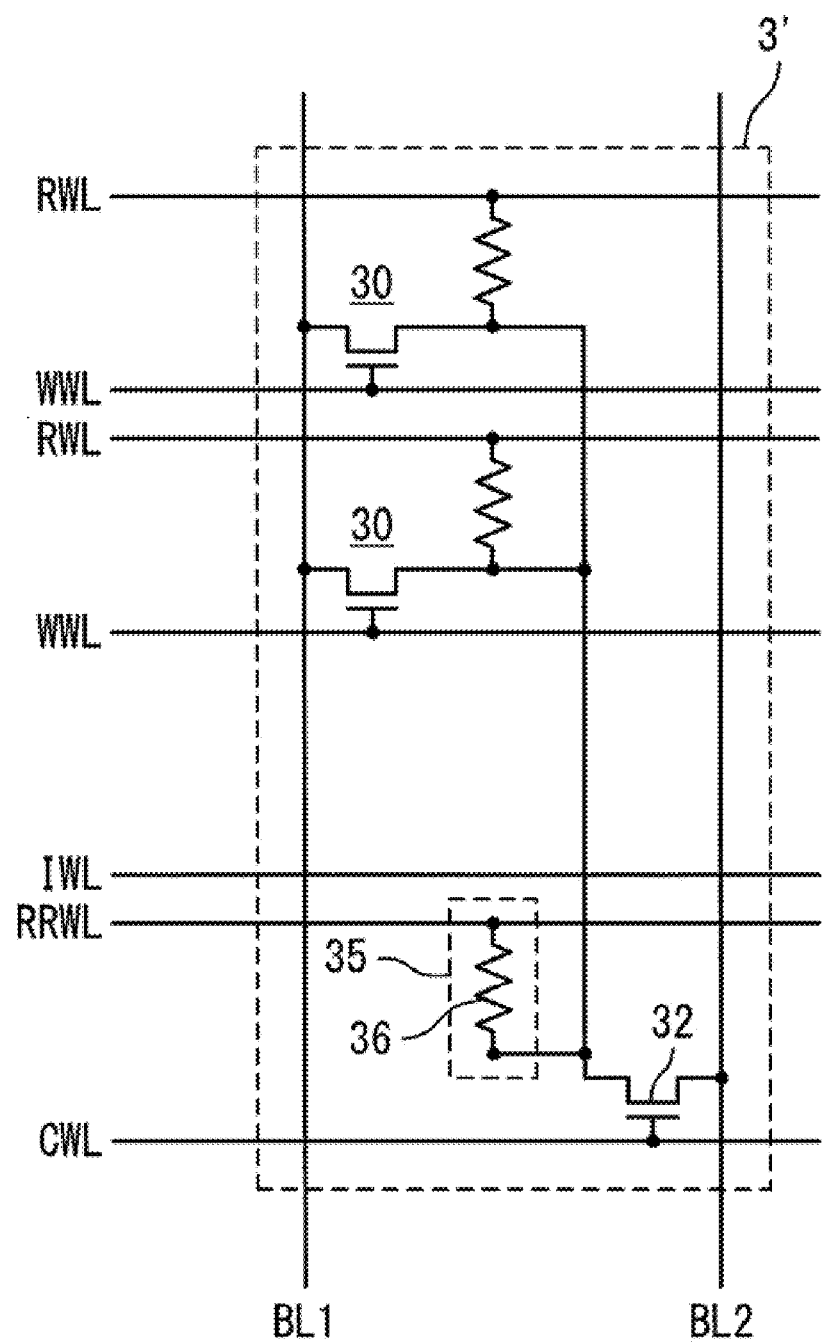
FIG. 35 is a circuit diagram showing a circuit configuration example of one memory block in another modification example of the seventh embodiment.

FIG. 35 shows a configuration of the memory block 3' in another modification example of the seventh embodiment. In the present modification example, as shown in FIG. 35, the reference cell 35 includes only one reference magnetoresistance element 36. A resistance value of this reference magnetoresistance element 36 is fixed to a predetermined value. In order to fix the memory data of the reference magnetoresistance element 36, an initialization word line IWL is formed in the vicinity of the reference magnetoresistance element 36. By supplying a predetermined current to the initialization word line IWL, the resistance value of the reference magnetoresistance element 36 is fixed to the predetermined value. Meanwhile, in the present modification example, the reference magnetoresistance element 36 is arranged away from the interconnection through which the write current IW flows. Therefore, the resistance value of the reference magnetoresistance element 36 is not changed by the write current IW at the time of the write operation. The same effects can be obtained even by this configuration.

8. System LSI

The MRAM 1 according to the present invention can be used as one memory macro installed in a system LSI.

Figure 36:
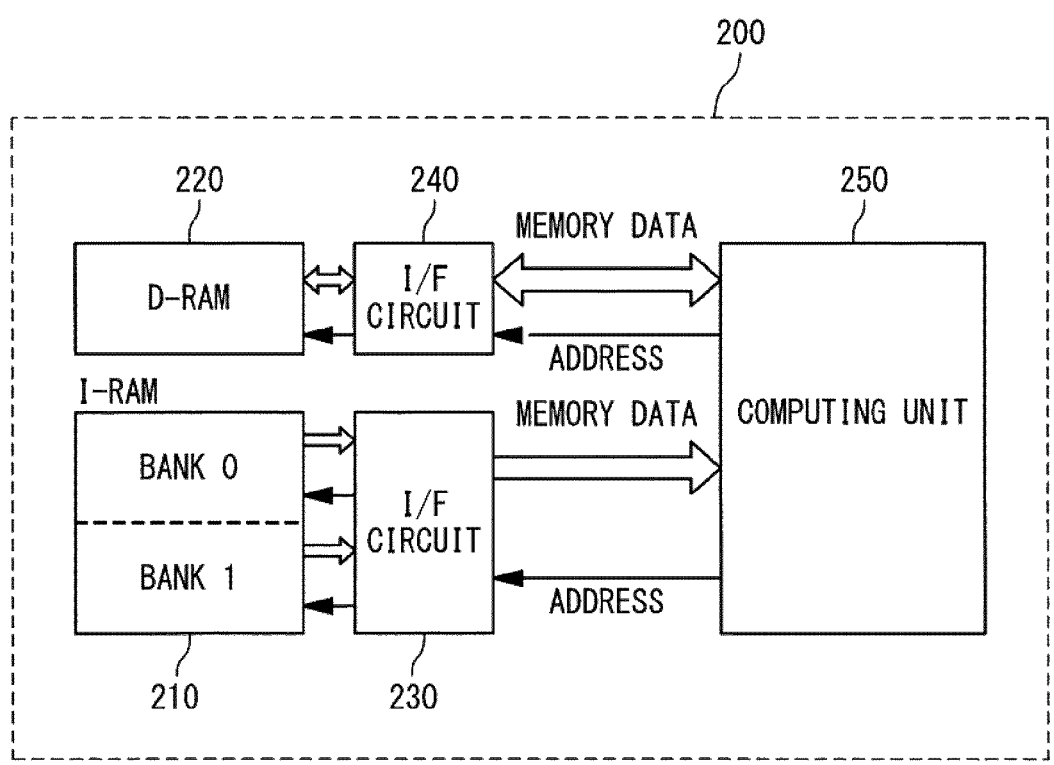
FIG. 36 is a block diagram showing a configuration example of a system LSI utilizing MRAM macros.

FIG. 36 shows a configuration example of a system LSI 200 that utilizes a macro of the MRAM 1. The system LSI 200 is a microcomputer for example, and has an instruction memory 210 (I-RAM), a data memory 220 (D-RAM), interface circuits 230 and 240 and a computing unit 250. The computing unit 250 is connected to the instruction memory 210 and the data memory 220 through the interface circuits 230 and 240, respectively.

The instruction memory 210 is a memory for storing program codes. The microcomputer is used for controlling an electronic device, and the program codes are rewritten only at times of initialization, bug fixing and function improvement. Conventionally, a flash memory macro is used for the program code memory. In the case of the flash memory macro, however, a long time is required for the data writing, because data erase is necessary before data write, charges are injected through an insulating film, and so forth. Since the program codes are not rewritten during the actual normal operation, a user has not been so inconvenienced. However, since a long time is required for a write test before shipment, the manufacturing costs are increased, which is a problem. On the other hand, the MRAM cell is capable of a high-speed write operation and is nonvolatile, which is very effective for reducing the test time. It is therefore preferable to apply the MRAM 1 of the present invention to the instruction memory 210 of the system LSI.

Figure 37:
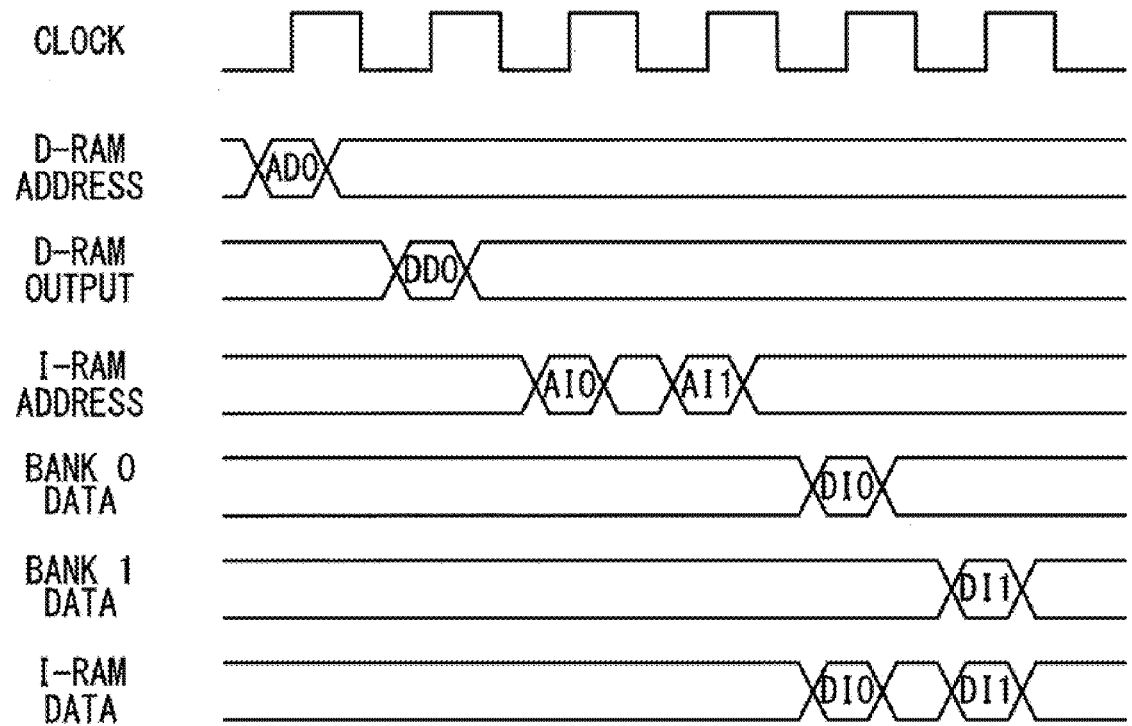
FIG. 37 is a timing chart showing one example of an operation of the system LSI shown in FIG. 36.

In the case of the MRAM 1 of the present invention, the reliability of the read data (program codes) is improved, while a long time may be necessary for the data reading. However, the program codes are used in order as long as there is no bifurcation in the program and thus sequentially of access addresses is high. Therefore, an effective data transmission rate can be improved by dividing the instruction memory 210 into two banks as shown in FIG. 36 and performing the memory interleave. FIG. 37 shows one example of the operation timing chart. Although the read-out of the first bit is slow, the banks are alternately read out thereafter, which can improve the transmission rate.

On the other hand, regarding the data memory 220 used for storing data, the sequentially of access addresses is not so high in many cases and the memory interleave is not so effective. It is therefore preferable to apply an existing MRAM macro to the data memory 220 of the system LSI.

Figure 38:
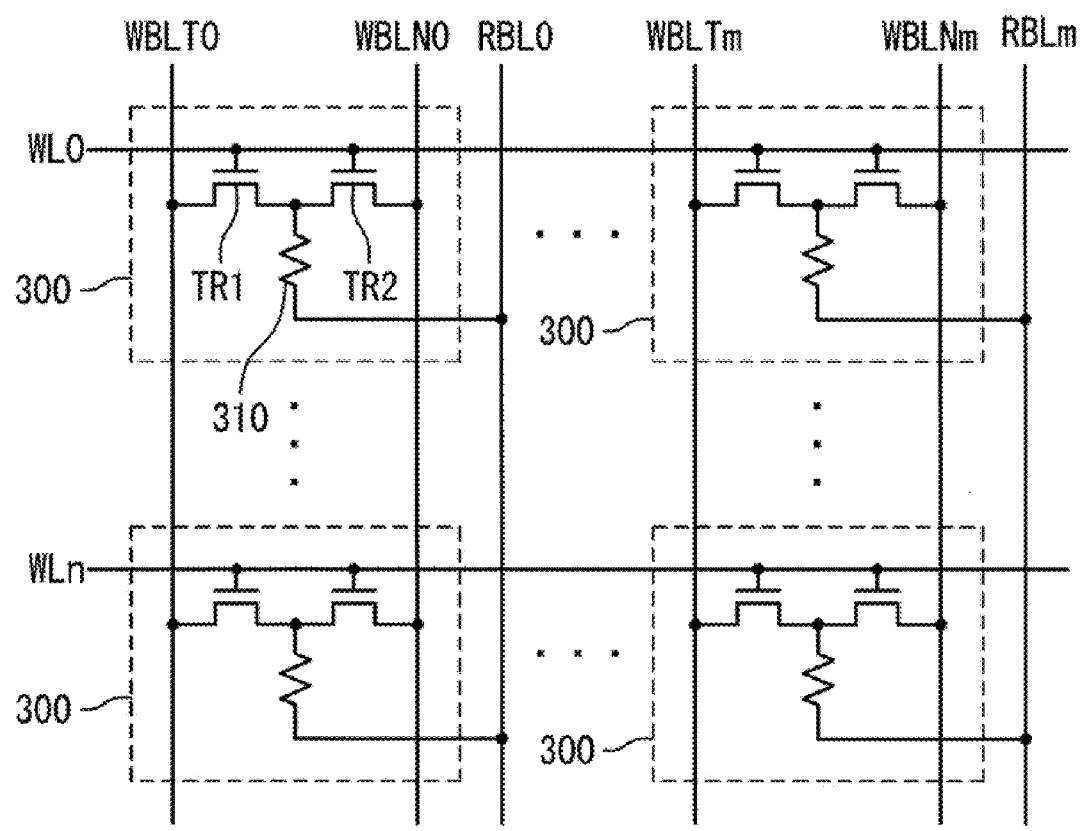
FIG. 38 is a circuit diagram schematically showing a cell array configuration of another MRAM.

FIG. 38 schematically shows one example of a cell array configuration of the existing MRAM macro. In FIG. 38, an MRAM cell 300 is a so-called 2T1MTJ-type cell. More specifically, one MRAM cell 300 consists of two transistors TR1, TR2 and a magnetoresistance element 310. Gates of the transistors TR1 and TR2 are connected to a word line WL. One of source/drain of the transistor TR1 is connected to a bit line WBLT, and one of source/drain of the transistor TR2 is connected to a bit line WBLN. One end of the magnetoresistance element 310 is connected to a bit line RBL.

In the case of the 2T1MTJ-type MRAM cell 300, a high-speed read operation is possible, since the parallel current is not caused. In many products, a capacity ratio of the D-RAM and the I-RAM is about 1:8. Therefore, to apply the 2T1MTJ cell having a large cell size to the D-RAM has little adverse effect but is preferable in terms of the high-speed read operation.

As described above, both of the MRAM 1 of the present invention and another MRAM can be concurrently installed in the system LSI 200. More specifically, the MRAM 1 of the present invention is applied to the instruction memory 210 and the existing MRAM is applied to the data memory 220. In this case, the magnetoresistance elements of both MRAMs can be formed simultaneously by the same manufacturing process. Manufacturing process overhead is not caused, which is preferable.

Figure 39:
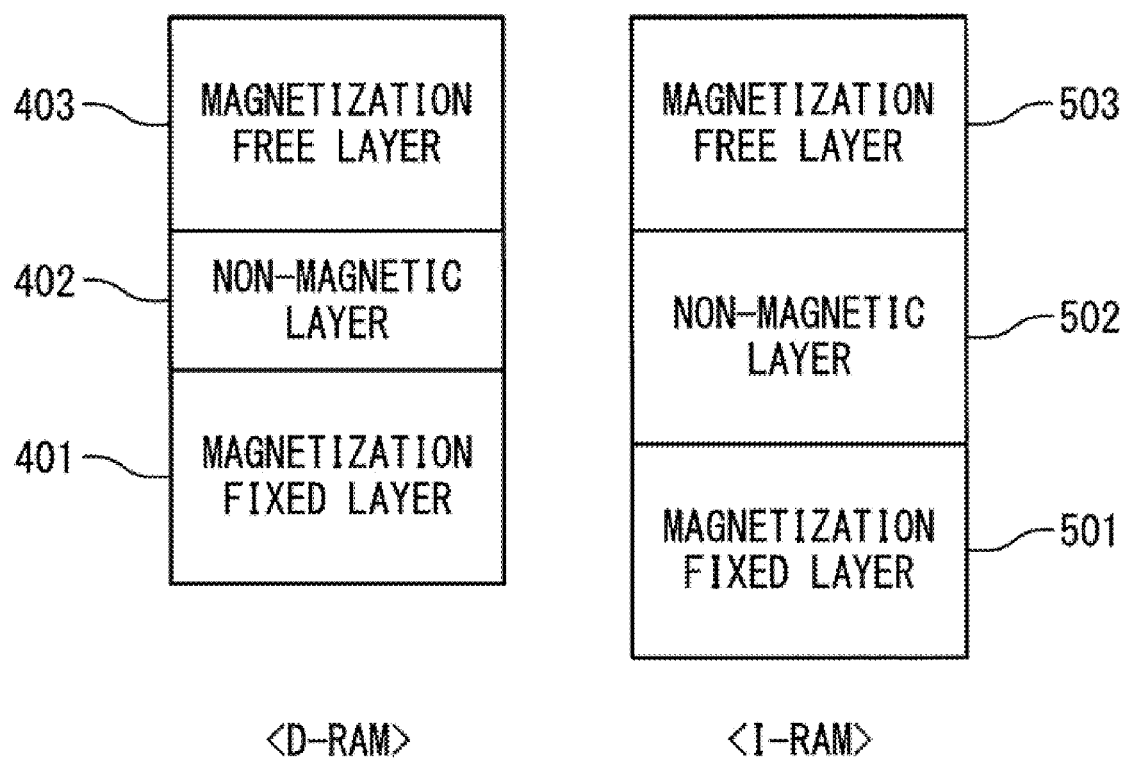
FIG. 39 is a conceptual diagram showing a structure of a magnetoresistance element of the MRAM used in the system LSI.

In order to further speed-up the data memory 220, a resistance value of the tunnel insulating film of the magnetoresistance element of the 2T1MTJ cell needs to be reduced. FIG. 39 schematically shows structures of the magnetoresistance elements of both of the instruction memory 210 and the data memory 220 in this case. The magnetoresistance element used in the data memory 220 consists of a magnetization fixed layer 401, a non-magnetic layer (tunnel insulating film) 402 and a magnetization free layer 403. On the other hand, the magnetoresistance element used in the instruction memory 210 consists of a magnetization fixed layer 501, a non-magnetic layer (tunnel insulating film) 502 and a magnetization free layer 503. In order to further speed-up the data memory 220, the tunnel insulating film 402 is formed to be thinner than the tunnel insulating film 502.

Embodiments of the present invention are described above with reference to the attached drawings. However, the present invention is not limited to the above-described embodiments and may be modified and changed by a person skilled in the art without departing from the scope and spirit of the invention.

The invention claimed is:

1. A magnetic random access memory comprising:
a memory cell array;
a first word line and a second word line each connected in common to a group of memory cells arranged in a first direction in said memory cell array;
a plurality of blocks arranged in a matrix form;
a common word line connected in common to a group of blocks arranged in said first direction among said plurality of blocks; and
a bit line pair connected in common to a group of blocks arranged in a second direction intersecting with said first direction among said plurality of blocks,
wherein said bit line pair includes a first bit line and a second bit line,
wherein each of said plurality of blocks comprises:
a plurality of memory cells in said memory cell array, each of the plurality of memory cells having a first transistor and a magnetoresistance element; and
a second transistor to which said plurality of memory cells are connected in parallel,
wherein a gate of said second transistor is connected to said common word line,
a gate of said first transistor is connected to said first word line,
one of a source and a drain of said first transistor is connected to said first bit line,
the other of the source and the drain of said first transistor is connected to one end of said magnetoresistance element and connected to said second bit line through said second transistor, and
the other end of said magnetoresistance element is connected to said second word line.

2. The magnetic random access memory according to claim 1, wherein said plurality of blocks include:
a plurality of memory blocks arranged in a matrix form; and
a row of reference blocks arranged in said first direction,
wherein said plurality of memory cells in each of said row of reference blocks are a plurality of reference cells whose data are fixed.

3. The magnetic random access memory according to claim 2, further comprising:
a selector connected to said common word line, said first word line and said second word line; and
a read circuit connected to said bit line pair,
wherein a memory block including a selected memory cell among said plurality of memory blocks is a selected memory block,
said second bit line connected to said selected memory block is a selected second bit line, and
a reference block connected to said selected second bit line among said row of reference blocks is a selected reference block,
wherein in a first read mode, said selector selects said common word line connected to said selected reference block and said common word line connected to said selected memory block, and
said read circuit applies a first read voltage to said selected second bit line and applies a second read voltage to said second bit line different from said selected second bit line,
wherein in a second read mode, said selector selects said common word line connected to said selected memory block, and
said read circuit applies a third read voltage to said selected second bit line and applies a fourth read voltage to said second bit line different from said selected second bit line.

4. The magnetic random access memory according to claim 3,
wherein at a time of data reading, a predetermined number of reference cells among said plurality of reference cells included in said selected reference block are used,
wherein in said first read mode, said selector applies a read word voltage different from said first read voltage by a predetermined voltage difference to said second word line connected to each of said predetermined number of reference cells and sets the other second word lines to a floating state, and a first bit line current flows through said selected second bit line,
wherein in said second read mode, said selector applies a read word voltage different from said third read voltage by a predetermined voltage difference to said second word line connected to said selected memory cell and sets the other second word lines to a floating state, and a second bit line current flows through said selected second bit line,
wherein said read circuit determines a data stored in said selected memory cell based on said first bit line current and said second bit line current.

5. The magnetic random access memory according to claim 4,
- wherein in said first read mode, said read circuit generates a reference voltage from said first bit line current,
- wherein in said second read mode, said read circuit generates a sense voltage from said second bit line current,
- wherein said reference voltage is between said sense voltage in a case where the data stored in said selected memory cell is 0 and said sense voltage in a case where the data stored in said selected memory cell is 1,
- wherein said read circuit compares said sense voltage and said reference voltage to determine the data stored in said selected memory cell.

6. The magnetic random access memory according to claim 5,
- wherein said predetermined number of reference cells include:
- a first reference cell in which the data 0 is stored; and
- a second reference cell in which the data 1 is stored,
- wherein said read circuit sets a current-voltage conversion coefficient when generating said reference voltage from said first bit line current smaller than a current-voltage conversion coefficient when generating said sense voltage from said second bit line current.

7. The magnetic random access memory according to claim 5,
- wherein said predetermined number of reference cells include:
- a first reference cell in which the data 0 is stored; and
- a second reference cell in which the data 1 is stored,
- wherein a resistance value of said magnetoresistance element in said selected reference block is higher than a resistance value of said magnetoresistance element in said selected memory block, when a same data is stored.

8. The magnetic random access memory according to claim 1,
- wherein said read circuit comprises:
- a first voltage generation circuit configured to generate a first voltage and to apply said first voltage as said first read voltage and said third read voltage to said selected second bit line; and
- a second voltage generation circuit configured to generate a second voltage and to apply said second voltage as said second read voltage and said fourth read voltage to said second bit line different from said selected second bit line,
- wherein said first voltage and said second voltage are substantially equal to each other.

9. The magnetic random access memory according to claim 1, further comprising:
- a selector connected to said common word line, said first word line and said second word line; and
- a write circuit connected to said bit line pair,
- wherein a memory block including a selected memory cell among said plurality of blocks is a selected block, and
- said first bit line and said second bit line connected to said selected block are a selected first bit line and a selected second bit line, respectively,
- wherein at a time of data writing, said selector selects said common word line connected to said selected block and selects said first word line connected to said selected memory cell, and
- said write circuit applies a first write voltage and a second write voltage different from each other to said selected first bit line and said selected second bit line, respectively.

10. The magnetic random access memory according to claim 9, wherein after the application of said first write voltage and said second write voltage, said write circuit equalizes voltages of said selected first bit line and said selected second bit line,
- wherein after the voltages of said selected first bit line and said selected second bit line are equalized, said selector cancels the selection of said common word line and said first word line.

11. The magnetic random access memory according to claim 9,
- wherein at the time of data writing, said write circuit applies a third write voltage to said first bit line different from said selected first bit line and to said second bit line different from said selected second bit line.

12. The magnetic random access memory according to claim 8, further comprising a write circuit connected to said bit line pair,
- wherein said first bit line connected to said selected memory block is a selected first bit line,
- wherein at a time of data writing, said selector selects said common word line connected to said selected memory block and selects said first word line connected to said selected memory cell,
- said write circuit applies a first write voltage and a second write voltage different from each other to said selected first bit line and said selected second bit line, respectively, and
- said second voltage generation circuit applies said second voltage to said first bit line different from said selected first bit line and to said second bit line different from said selected second bit line.

13. The magnetic random access memory according to claim 1, further comprising:
- a third bit line; and
- a third transistor,
- wherein a gate of said third transistor is connected to said first word line, one of a source and a drain of said third transistor is connected to said third bit line, and the other thereof is connected to said second word line.

14. The magnetic random access memory according to claim 13,
- wherein said third transistor is provided in common between two blocks adjacent to each other in said first direction among said plurality of blocks.

15. The magnetic random access memory according to claim 13,
- wherein said plurality of blocks include:
- a plurality of memory blocks arranged in a matrix form; and
- a row of reference blocks arranged in said first direction,
- wherein said plurality of memory cells in each of said row of reference blocks are a plurality of reference cells whose data are fixed.

16. The magnetic random access memory according to claim 15, further comprising:
- a selector connected to said common word line and said first word line; and
- a read circuit connected to said bit line pair and said third bit line,
- wherein a memory block including a selected memory cell among said plurality of memory blocks is a selected memory block,
- said bit line pair connected to said selected memory block is a selected bit line pair, and a reference block connected to said selected bit line pair among said row of reference blocks is a selected reference block, wherein at a time of data reading, a predetermined number of reference cells among said plurality of reference cells included in said selected reference block are used, wherein in a first read mode, said selector selects said common word line connected to said selected reference block, said common word line connected to said selected memory block and said first word line connected to each of said predetermined number of reference cells, said read circuit applies a first read voltage to said selected bit line pair, applies a second read voltage to said bit line pair different from said selected bit line pair, and applies a read bit voltage different from said first read voltage by a predetermined voltage difference to said third bit line, and a first bit line current flows through said selected bit line pair, wherein in a second read mode, said selector selects said common word line connected to said selected memory block and said first word line connected to said selected memory cell, said read circuit applies a third read voltage to said selected bit line pair, applies a fourth read voltage to said bit line pair different from said selected bit line pair, and applies a read bit voltage different from said third read voltage by a predetermined voltage difference to said third bit line, and a second bit line current flows through said selected bit line pair, wherein said read circuit determines a data stored in said selected memory cell based on said first bit line current and said second bit line current.

17. The magnetic random access memory according to claim 1, further comprising:
a third bit line;
a fourth bit line; and
a third transistor,
wherein a gate of said third transistor is connected to said first word line, one of a source and a drain of said third transistor is connected to said third bit line or said fourth bit line, and the other thereof is connected to said second word line.

18. A data read method for a magnetic random access memory,
wherein said magnetic random access memory comprises:
a memory cell array;
a word line connected in common to a group of memory cells arranged in a first direction in said memory cell array;
a plurality of blocks arranged in a matrix form;
a common word line connected in common to a group of blocks arranged in said first direction among said plurality of blocks; and
a bit line connected in common to a group of blocks arranged in a second direction intersecting with said first direction among said plurality of blocks,
wherein each of said plurality of blocks comprises:
a plurality of memory cells in said memory cell array, each of which has a magnetoresistance element; and
a transistor to which said plurality of memory cells are connected in parallel,
wherein a gate of said transistor is connected to said common word line, one end of said magnetoresistance element is connected to said bit line through said transistor, and the other end of said magnetoresistance element is connected to said word line, wherein said plurality of blocks include:
a plurality of memory blocks arranged in a matrix form; and
a row of reference blocks arranged in said first direction,
wherein data stored in said plurality of memory cells in each of said row of reference blocks are fixed,
wherein a memory block including a selected memory cell among said plurality of memory blocks is a selected memory block,
said bit line connected to said selected memory block is a selected bit line, and
a reference block connected to said selected bit line among said row of reference blocks is a selected reference block,
wherein said data read method comprises:
first reading;
second reading; and
data determining,
wherein said first reading comprises:
selecting said common word line connected to said selected reference block and said common word line connected to said selected memory block;
applying a first read voltage to said selected bit line; and
applying a read word voltage different from said first read voltage by a predetermined voltage difference to said word line connected to said selected reference block and setting the other word lines to a floating state,
wherein said second reading comprises:
selecting said common word line connected to said selected memory block;
applying a second read voltage to said selected bit line; and
applying a read word voltage different from said second read voltage by a predetermined voltage difference to said word line connected to said selected memory cell and setting the other word lines to a floating state,
wherein said data determining comprises determining a data stored in said selected memory cell based on a first bit line current flowing through said selected bit line in said first reading and a second bit line current flowing through said selected bit line in second reading.

19. A data write method for a magnetic random access memory,
wherein said magnetic random access memory comprises:
a memory cell array;
a word line connected in common to a group of memory cells arranged in a first direction in said memory cell array;
a plurality of blocks arranged in a matrix form;
a common word line connected in common to a group of blocks arranged in said first direction among said plurality of blocks; and
a bit line pair connected in common to a group of blocks arranged in a second direction intersecting with said first direction among said plurality of blocks,
wherein said bit line pair includes a first bit line and a second bit line,
wherein each of said plurality of blocks comprises:
a plurality of memory cells in said memory cell array, each of the plurality of memory cells having a first transistor and a magnetoresistance element; and
a second transistor to which said plurality of memory cells are connected in parallel,
wherein a gate of said second transistor is connected to said common word line,
a gate of said first transistor is connected to said word line, one of a source and a drain of said first transistor is connected to said first bit line and the other thereof is connected to said second bit line through said second transistor, wherein a memory block including a selected memory cell among said plurality of blocks is a selected block, and said first bit line and said second bit line connected to said selected block are a selected first bit line and a selected second bit line, respectively, wherein said data write method comprises:

selecting said common word line connected to said selected block and selecting said word line connected to said selected memory cell; and applying a first write voltage and a second write voltage different from each other to said selected first bit line and said selected second bit line, respectively.

20. The data write method for the magnetic random access memory according to claim 19, further comprising:

equalizing voltages of said selected first bit line and said selected second bit line, after said applying; and canceling the selection of said common word line and said word line, after said equalizing.

21. The magnetic random access memory according to claim 1, wherein each of said plurality of blocks further comprises at least one reference magnetoresistance element for generating a reference level at a time of data reading.

22. The magnetic random access memory according to claim 1, wherein each of said plurality of blocks further comprises:

a first reference magnetoresistance element; and a second reference magnetoresistance element, wherein said first reference magnetoresistance element and said second reference magnetoresistance element are connected in parallel between said second transistor and a reference word line, and complementary data are respectively stored in said first reference magnetoresistance element and said second reference magnetoresistance element.

23. The magnetic random access memory according to claim 22, wherein a write current flows when data writing is performed with respect to a selected memory cell among said plurality of memory cells, wherein a direction of said write current flowing through an interconnection located adjacent to said first reference magnetoresistance element is opposite to a a direction of said write current flowing through an interconnection located adjacent to said second reference magnetoresistance element.

24. The magnetic random access memory according to claim 22, further comprising:

a selector connected to said common word line, said first word line, said second word line and said reference word line; and a read circuit connected to said bit line pair, wherein a memory block including a selected memory cell among said plurality of memory blocks is a selected memory block, said first bit line connected to said selected memory block is a selected first bit line, and said second bit line connected to said selected memory block is a selected second bit line, wherein in a first read mode, said selector selects said common word line and said reference word line connected to said selected memory block, and said read circuit applies a first read voltage to said selected second bit line and applies a second read voltage to said second bit line different from said selected second bit line, wherein in a second read mode, said selector selects said first word line and said second word line connected to said selected memory cell, and said read circuit applies a third read voltage to said selected first bit line and applies a fourth read voltage to said first bit line different from said selected first bit line.

25. The magnetic random access memory according to claim 24, wherein in said first read mode, said selector applies a read word voltage different from said first read voltage by a predetermined voltage difference to said reference word line and sets said said second word line to a floating state, and a first bit line current flows through said selected second bit line, wherein in said second read mode, said selector applies a read word voltage different from said third read voltage by a predetermined voltage difference to said second word line connected to said selected memory cell and sets the other second word lines and said reference word line to a floating state, and a second bit line current flows through said selected first bit line, wherein said read circuit determines a data stored in said selected memory cell based on said first bit line current and said second bit line current.

26. The magnetic random access memory according to claim 22, further comprising:

a third bit line;

a third transistor connected between said third bit line and said second word line and whose gate is connected to said first word line; and a fourth transistor connected between said third bit line and said reference word line and whose gate is connected to said common word line.

27. A system LSI characterized by comprising the magnetic random access memory according to claim 1 and another magnetic random access memory different from said magnetic random access memory.

28. The system LSI according to claim 27, characterized in that said magnetic random access memory is an instruction memory for storing program codes, and said another magnetic random access memory is a data memory for storing data.

* * * * *